(12) United States Patent
Yong et al.

(10) Patent No.: US 12,707,629 B2
(45) Date of Patent: Aug. 11, 2026

(54) SEMICONDUCTOR DEVICE

(71) Applicant: Samsung Electronics Co., Ltd., Suwon-si (KR)

(72) Inventors: Jaecheon Yong, Suwon-si (KR); Daehong Ko, Seoul (KR)

(73) Assignees: Samsung Electronics Co., Ltd., Gyeonggi-do (KR); UIF (UNIVERSITY INDUSTRY FOUNDATION), YONSEI UNIVERSITY, Seoul (KR)

( * ) Notice: Subject to any disclaimer, the term of this patent is extended or adjusted under 35 U.S.C. 154(b) by 320 days.

(21) Appl. No.: 18/475,812

(22) Filed: Sep. 27, 2023

(65) Prior Publication Data

US 2024/0121941 A1 Apr. 11, 2024

(30) Foreign Application Priority Data

Oct. 6, 2022 (KR) ........................ 10-2022-0127934

(51) Int. Cl.
*H10B 12/00* (2023.01)

(52) U.S. Cl.
CPC ........... *H10B 12/31* (2023.02); *H10B 12/488* (2023.02)

(58) Field of Classification Search
CPC .... H10B 12/31; H10B 12/488; H10B 12/053; H10B 12/30; H10B 12/03; H10B 12/05; H10B 12/48; H10D 30/6735
See application file for complete search history.

(56) References Cited

U.S. PATENT DOCUMENTS 10,381,357 B2 8/2019 Karda et al.
10,535,659 B2 1/2020 Kim et al.
(Continued)

FOREIGN PATENT DOCUMENTS

KR 10-2015-0110966 A 10/2015
KR 10-2021-0102094 A 8/2021
(Continued)

OTHER PUBLICATIONS

U.S. Non-Final Office Action dated Mar. 23, 2026 issued in U.S. Appl. No. 18/472,904.
(Continued)

*Primary Examiner* — Ratisha Mehta
(74) *Attorney, Agent, or Firm* — Harness, Dickey & Pierce, P.L.C.

(57) ABSTRACT

A semiconductor device includes a substrate having first and second regions, semiconductor patterns spaced apart from each other in a first horizontal direction on the first region, wherein each of the semiconductor patterns has first side surfaces opposing each other in the first horizontal direction and second side surfaces opposing each other in a second horizontal direction, the first and second horizontal directions parallel to an upper surface of the substrate, the second horizontal direction perpendicular to the first horizontal direction, gate patterns surrounding an upper surface, a lower surface, and the first side surfaces of each of the semiconductor patterns, and a landing pattern spaced apart from the semiconductor patterns in the first horizontal direction on the second region and electrically connected to the gate patterns. The landing pattern includes a semiconductor material layer and a conductive material layer covering at least one surface of the semiconductor material layer.

20 Claims, 50 Drawing Sheets

(56) References Cited

U.S. PATENT DOCUMENTS

| | | | | |
|---|---|---|---|---|
| 10,861,854 | B2 | 12/2020 | Kim et al. | |
| 10,950,618 | B2 | 3/2021 | Tang et al. | |
| 11,094,699 | B1 | 8/2021 | Brewer et al. | |
| 11,257,822 | B2 | 2/2022 | Gomes et al. | |
| 11,295,786 | B2 | 4/2022 | Kang et al. | |
| 11,329,046 | B2 | 5/2022 | Choi | |
| 2020/0202900 | A1 | 6/2020 | Kang et al. | |
| 2020/0279601 | A1 | 9/2020 | Kim et al. | |
| 2021/0183861 | A1 | 6/2021 | Lee et al. | |
| 2021/0249415 | A1 | 8/2021 | Kang et al. | |
| 2022/0005809 | A1 | 1/2022 | Kim et al. | |
| 2022/0013524 | A1 | 1/2022 | Ryu et al. | |
| 2022/0044725 | A1 | 2/2022 | Park | |
| 2022/0122974 | A1 | 4/2022 | Ryu et al. | |
| 2022/0122976 | A1 | 4/2022 | Kim | |
| 2022/0130834 | A1 | 4/2022 | Lee et al. | |
| 2022/0367514 | A1* | 11/2022 | Kim | H10B 51/20 |
| 2023/0164981 | A1* | 5/2023 | Ryu | H10B 12/0335 257/213 |

FOREIGN PATENT DOCUMENTS

| | | | |
|---|---|---|---|
| KR | 10-2022-0059424 | A | 5/2022 |
| WO | WO-2022/093460 | A1 | 5/2022 |

OTHER PUBLICATIONS

Korean Office Action dated Mar. 18, 2026 issued in corresponding Korean Patent Application No. 10-2022-0127934.

* cited by examiner

SEMICONDUCTOR DEVICE

CROSS-REFERENCE TO RELATED APPLICATION

This application claims benefit of priority to Korean Patent Application No. 10-2022-0127934 filed on Oct. 6, 2022 in the Korean Intellectual Property Office, the disclosure of which is incorporated herein by reference in its entirety.

BACKGROUND

Example embodiments of the present inventive concepts relate to semiconductor devices.

According to the development of the electronics industry and user demand, electronic devices have been designed to have a more compact size and high-performance. Accordingly, semiconductor devices used in electronic devices have been required to have high integration density and high performance. Since integration density of a general two-dimensional or planar semiconductor device may be mainly determined by the region occupied by a unit memory cell, integration density may be greatly affected by the level of technique of forming a fine pattern. However, since ultra-expensive devices are required for reducing the pattern, integration density of 2D semiconductor devices has been increased but there may be limitations. Accordingly, three-dimensional semiconductor memory devices having three-dimensionally arranged memory cells have been suggested.

SUMMARY

Some example embodiments of the present inventive concepts provide a semiconductor device having improved productivity and reliability.

According to some example embodiments of the present inventive concepts, a semiconductor device may include a substrate having a first region and a second region, a plurality of semiconductor patterns spaced apart from each other in a first horizontal direction on the first region of the substrate, where each of the plurality of semiconductor patterns has first side surfaces opposing each other in the first horizontal direction and second side surfaces opposing each other in a second horizontal direction, the first horizontal direction parallel to an upper surface of the substrate, the second horizontal direction parallel to the upper surface of the substrate and perpendicular to the first horizontal direction, a plurality of gate patterns surrounding an upper surface, a lower surface, and the first side surfaces of each of the plurality of semiconductor patterns, and a landing pattern spaced apart from the plurality of semiconductor patterns in the first horizontal direction on the second region of the substrate and electrically connected to the plurality of gate patterns, wherein the landing pattern includes a semiconductor material layer and a conductive material layer covering at least one surface of the semiconductor material layer.

According to some example embodiments of the present inventive concepts, a semiconductor device may include a substrate having a first region and a second region, a stack structure including a plurality of horizontal structures stacked and spaced apart from each other in a vertical direction perpendicular to an upper surface of the substrate on the first region and extending in a staircase form in a first horizontal direction parallel to the upper surface of the substrate on the second region, and a plurality of interlayer insulating layers alternately stacked with the plurality of horizontal structures, a cell region insulating layer covering the stack structure on the substrate, and a landing contact penetrating through the cell region insulating layer and extending in the vertical direction on the second region, wherein each of the plurality of horizontal structures includes a plurality of structures spaced apart from each other in a first horizontal direction on the first region, a landing pattern disposed in parallel with the plurality of structures in the first horizontal direction on the second region, and conductive line patterns connecting the plurality of structures to the landing pattern, wherein each of the plurality of structures includes a semiconductor pattern having first side surfaces opposing each other in the first horizontal direction and second side surfaces opposing each other in a second horizontal direction perpendicular to the first horizontal direction and parallel to the upper surface of the substrate, and a gate pattern surrounding an upper surface, a lower surface, and the first side surfaces of the semiconductor pattern, and wherein the landing pattern includes a semiconductor material layer and a conductive material layer including a same material as a material of the gate pattern and covering at least one surface of the semiconductor material layer.

According to some example embodiments of the present inventive concepts, a semiconductor device may include a substrate having a first region and a second region, a plurality of semiconductor patterns spaced apart from each other in a first horizontal direction on the first region of the substrate, where each of the plurality of semiconductor patterns has first side surfaces opposing each other in the first horizontal direction and second side surfaces opposing each other in a second horizontal direction, the first horizontal direction parallel to an upper surface of the substrate, the second horizontal direction parallel to the upper surface of the substrate and perpendicular to the first horizontal direction, a plurality of gate patterns surrounding an upper surface, a lower surface, and the first side surfaces of each of the plurality of semiconductor patterns, a landing pattern spaced apart from the plurality of semiconductor patterns in the first horizontal direction on the second region of the substrate and electrically connected to the plurality of gate patterns, and a landing contact in contact with the landing pattern and extending in a vertical direction perpendicular to the upper surface of the substrate, wherein the landing pattern includes a semiconductor material layer and a conductive material layer in contact with the semiconductor material layer, and wherein the landing contact is in contact with the semiconductor material layer and the conductive material layer.

BRIEF DESCRIPTION OF THE DRAWINGS

The above and other aspects, features, and advantages of the present inventive concepts will be more clearly understood from the following detailed description, taken in combination with the accompanying drawings, in which.

DETAILED DESCRIPTION

Figure 1A:
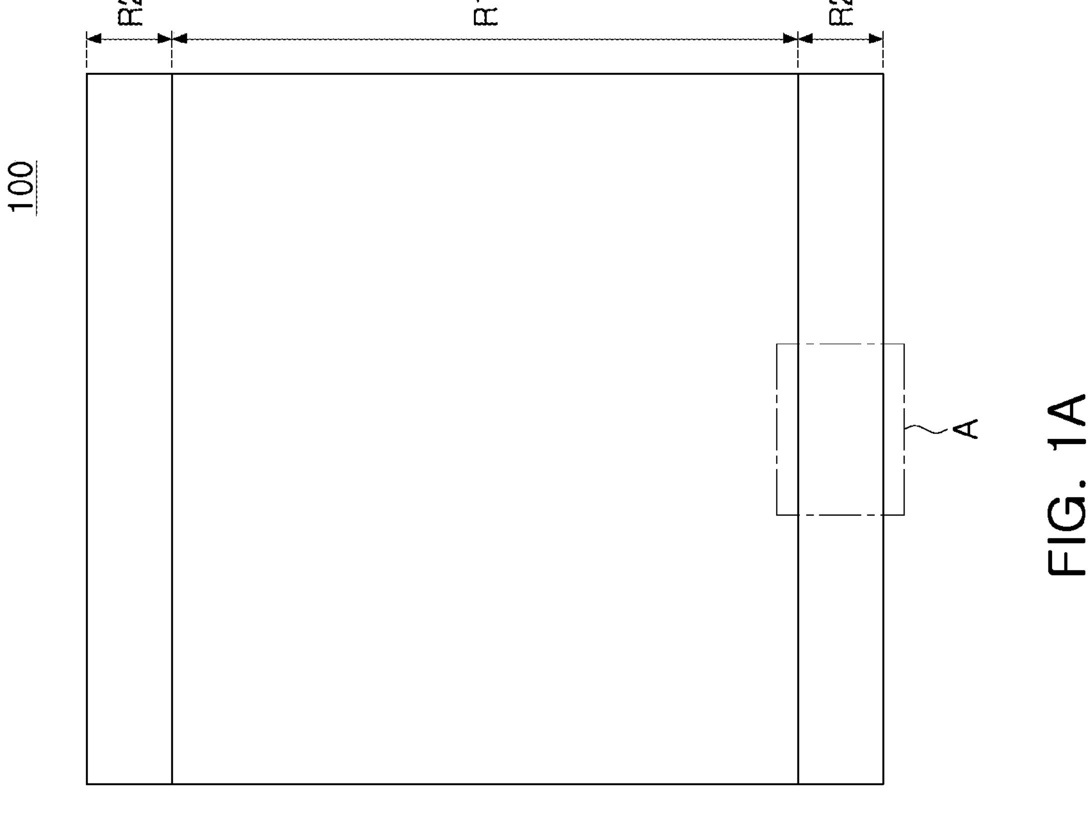
FIG. 1A is a plan diagram illustrating a semiconductor device according to some example embodiments of the present inventive concepts.

Hereinafter, some example embodiments of the present inventive concepts will be described as follows with reference to the accompanying drawings.

Hereinafter, the terms "above" or "on" may include not only those that are directly on in a contact manner, but also those that are above in a non-contact manner. The singular forms "a," "an," and "the" as used herein are intended to include the plural forms as well unless the context clearly indicates otherwise. It will be understood that the terms "comprise," "include," or "have" as used herein specify the presence of stated elements, but do not preclude the presence or addition of one or more other elements.

The use of the term "the" and similar demonstratives may correspond to both the singular and the plural. Operations constituting methods may be performed in any suitable order unless otherwise indicated herein or otherwise clearly contradicted by context, and are not necessarily limited to the stated order.

The use of all illustrations or illustrative terms in some example embodiments is simply to describe the technical ideas in detail, and the scope of the present inventive concepts is not limited by the illustrations or illustrative terms unless they are limited by claims.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed, or an effect such as a structure is described to be established "by" or "through" performing additional operations, it will be understood that the operation may be performed and/or the effect/structure may be established "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.). Similarly, a structure described herein to be between two other structures to separate the two other structures from each other may be understood to be configured to isolate the two other structures from direct contact with each other.

FIG. 1A is a plan diagram illustrating a semiconductor device according to some example embodiments.

Figure 1B:
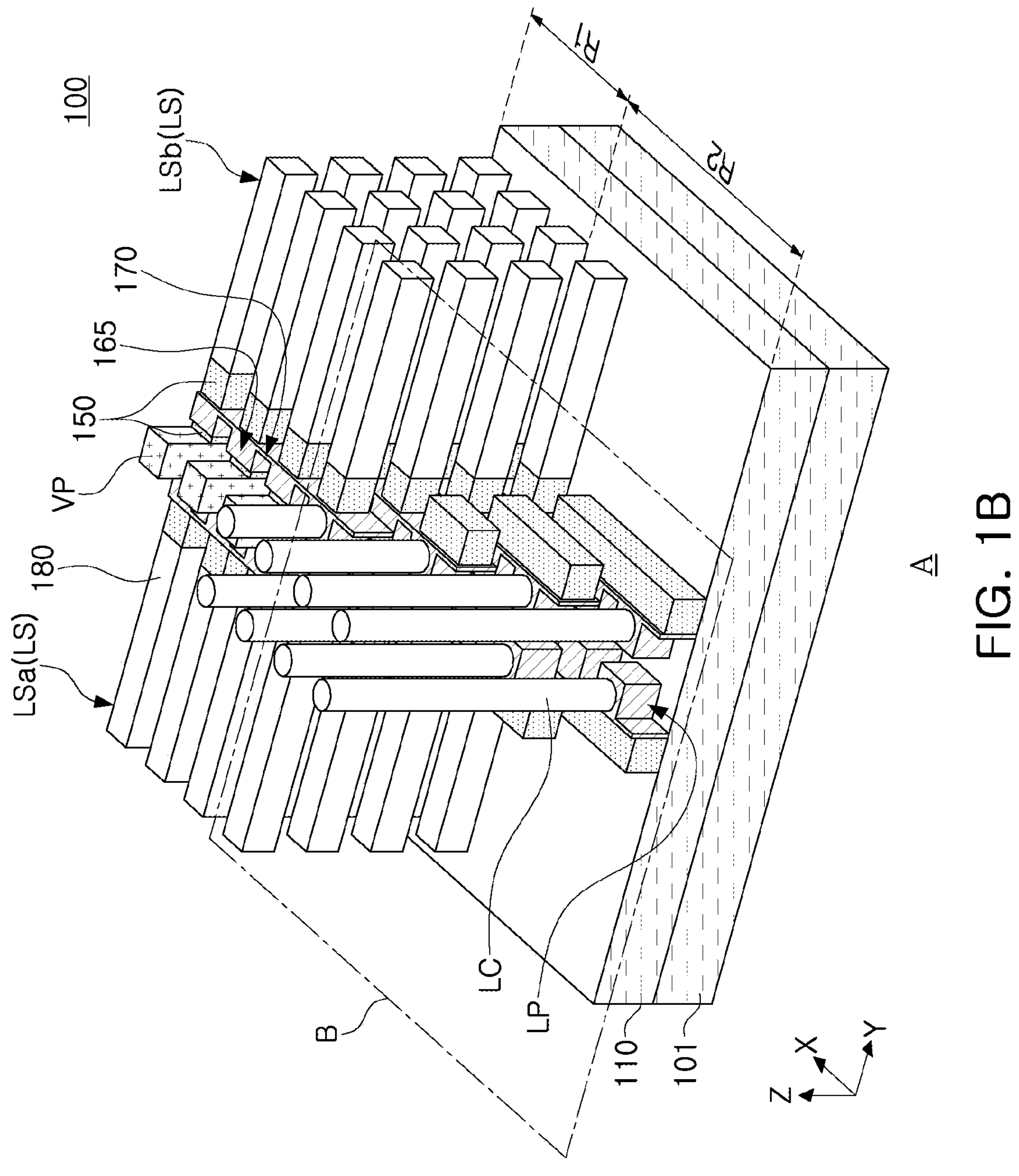
FIG. 1B is a perspective diagram illustrating a semiconductor device according to some example embodiments of the present inventive concepts.

FIG. 1B is a perspective diagram illustrating a semiconductor device according to some example embodiments, illustrating region "A" in FIG. 1A.

Figure 2A:
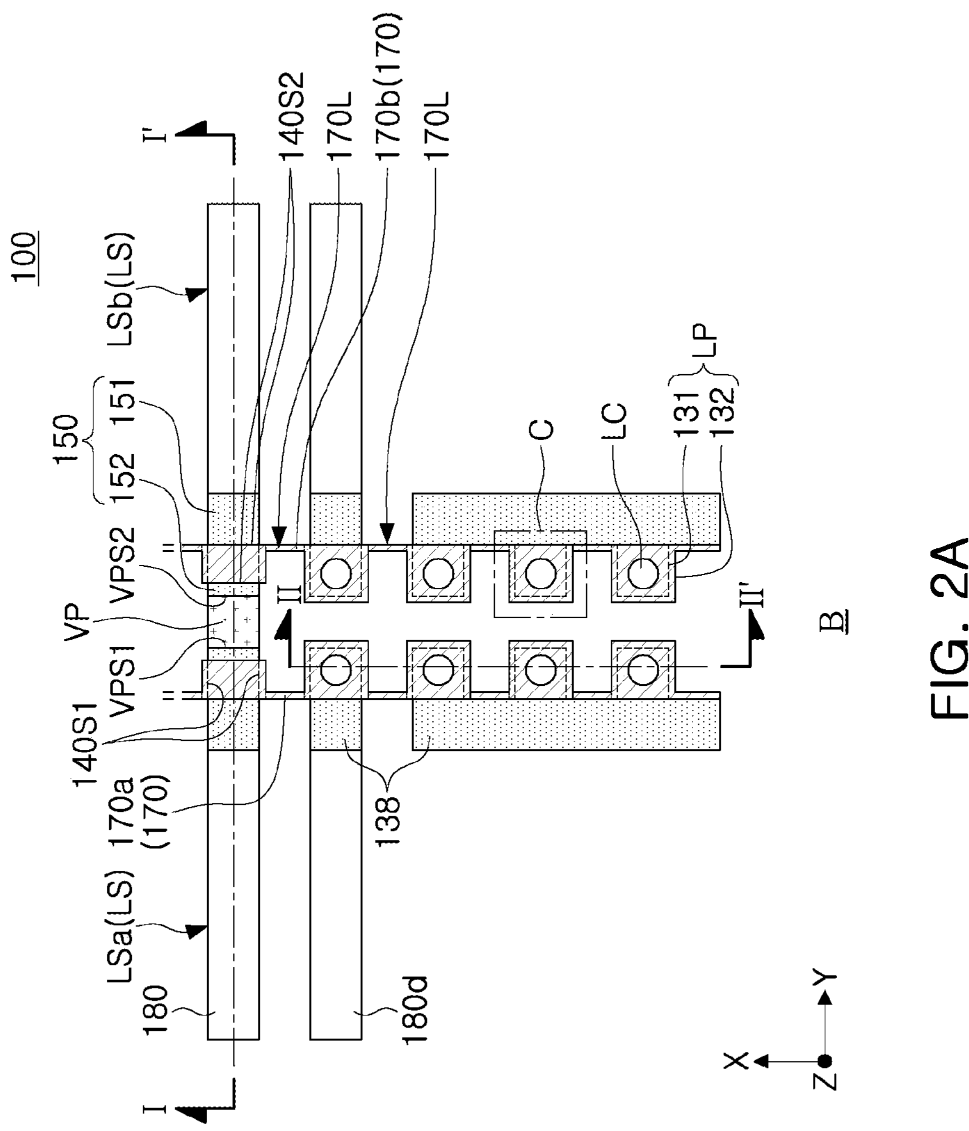
FIG. 2A is a plan diagram illustrating a semiconductor device according to some example embodiments of the present inventive concepts.

FIG. 2A is a plan diagram illustrating a semiconductor device according to some example embodiments, illustrating region "B" in FIG. 1B.

Figure 2B:
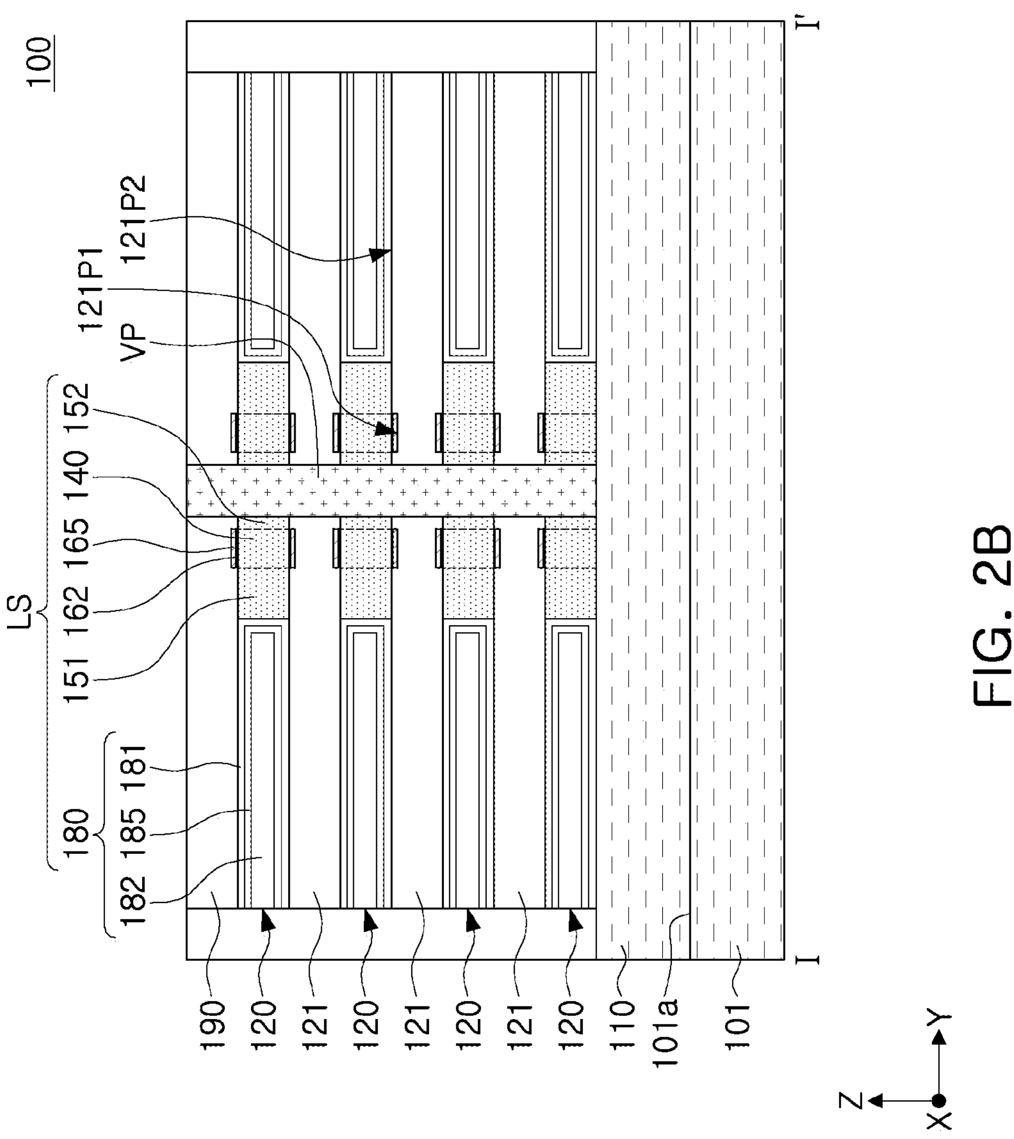
FIGS. 2B to 2C are cross-sectional diagrams illustrating a semiconductor device according to some example embodiments of the present inventive concepts.
Figure 2D:
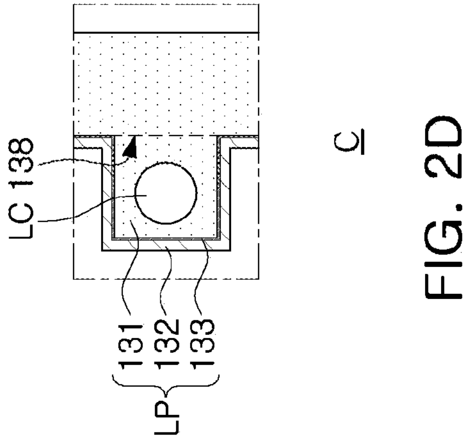
FIG. 2D is a plan diagram illustrating a semiconductor device according to some example embodiments of the present inventive concepts.
Figure 2C:
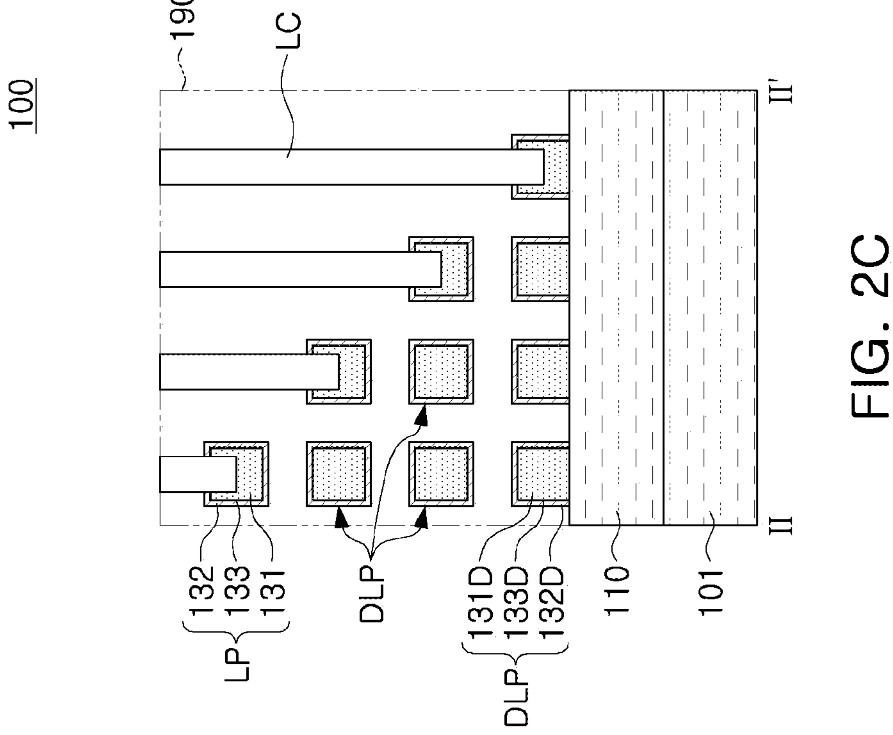

FIGS. 2B to 2C are cross-sectional diagrams illustrating a semiconductor device according to some example embodiments. FIG. 2B is a cross-sectional diagram illustrating a semiconductor device in FIG. 2A taken along line I-I', and FIG. 2C is a cross-sectional diagram illustrating a semiconductor device in FIG. 2A taken along line II-IF.

FIG. 2D is a plan diagram illustrating a semiconductor device according to some example embodiments, a plan diagram on a level on which a semiconductor material layer 131 is disposed in region "C" in FIG. 2A.

Referring to FIGS. 1A to 2D, a semiconductor device 100 in some example embodiments may include a substrate 101, a plurality of horizontal structures 120 and a plurality of interlayer insulating layers 121 alternately stacked on the substrate 101, and a plurality of vertical conductive patterns VP penetrating through the plurality of horizontal structures 120 and the plurality of interlayer insulating layers 121 and extending in the Z-direction on the substrate 101. The Z-direction may refer to a direction perpendicular to the upper surface 101*a* of the substrate 101. Each of the plurality of horizontal structures 120 may include a plurality of structures LS including a semiconductor pattern 140, source/drain regions 150, a gate pattern 165, and a data storage structure 180, and a plurality of conductive line patterns 170 connecting the plurality of structures LS to each other.

The semiconductor device 100 in some example embodiments may include a plurality of bit lines including a plurality of vertical conductive patterns VP, a plurality of word lines including a plurality of conductive line patterns 170, and a plurality of cell arrays having memory cell transistors including a plurality of structures LS and data storage elements. The cell array of the semiconductor device may be a memory cell array of a dynamic random access memory (DRAM) device. In some example embodiments, the memory cell transistor may include a semiconductor pattern 140, source/drain regions 150 disposed on both sides (e.g., opposite sides) of the semiconductor pattern 140, and a gate pattern 165 surrounding at least a portion of the semiconductor pattern 140, and the data storage element may include a data storage structure 180. As will be described later, the data storage element may include a capacitor including a lower electrode, an upper electrode, and a dielectric layer, but some example embodiments thereof are not limited thereto.

Referring to FIGS. 1A and 1B, the substrate 101 may include a first region R1 and a second region R2. The first region R1 may be a cell region in which the memory cell transistor and the data storage elements are disposed, and the second region R2 may be a region for forming contacts for applying power to each of the plurality of word lines. The second region R2 may be disposed on at least one end of the first region R1. In some example embodiments, the second region R2 may be disposed on both ends of the first region R1 in the X-direction, but in some example embodiments, the second region R2 may be disposed on both ends (e.g., opposite ends) in the X-direction and on both ends (e.g., opposite ends) in the Y-direction, perpendicular to the X-direction so as to surround the entirety of surfaces of the first region R1. It will be understood that the X-direction, which may be referred to herein as a first horizontal direction, may extend parallel to the upper surface 101*a* of the substrate 101, and the Y-direction, which may be referred to herein as a second horizontal direction, may extend parallel to the upper surface 101*a* of the substrate 101 and perpendicular to the first horizontal direction (e.g., perpendicular to the X-direction).

The substrate 101 may include a semiconductor material, such as a group IV semiconductor, a group III-V compound semiconductor, or a group II-VI compound semiconductor. For example, the group IV semiconductor may include silicon, germanium, or silicon-germanium. The substrate 101 may further include impurities. The substrate 101 may be implemented as a silicon substrate, a silicon on insulator (SOI) substrate, a germanium substrate, a germanium on insulator (GOI) substrate, a silicon-germanium substrate, or a substrate including an epitaxial layer.

In some example embodiments, the semiconductor device 100 may further include a lower structure 110 disposed on the substrate 101. A plurality of horizontal structures 120 and a plurality of interlayer insulating layers 121 may be stacked (e.g., alternately stacked) on the lower structure 110. The lower structure 110 may include a device region on the substrate 101 and an insulating region covering the device region. The device region may include a conductive material such as a semiconductor material including impurities or a metal material. A plurality of vertical conductive patterns VP may be in contact with the device region. The insulating region may include insulating layers including at least one of an insulating material, for example, silicon oxide, silicon nitride, silicon oxynitride, or silicon oxycarbide. However, in some example embodiments, the lower structure 110 may not be provided (e.g., may be absent).

The plurality of horizontal structures 120 and the plurality of interlayer insulating layers 121 may form a stack structure on the substrate 101. The plurality of horizontal structures 120 may be stacked and spaced apart from each other in the Z-direction on the first region R1, and may extend in a staircase shape in the X-direction on the second region R2. Accordingly, the semiconductor device 100 may include a portion in which the upper surfaces of the plurality of horizontal structures 120 are exposed on the second region R2. The plurality of horizontal structures 120 may be disposed between the plurality of interlayer insulating layers 121 and may be spaced apart from each other in the Z-direction by the plurality of interlayer insulating layers 121. The plurality of interlayer insulating layers 121 may include, for example, at least one of silicon oxide, silicon nitride, silicon oxynitride, or silicon oxycarbide.

Referring to FIGS. 2A and 2B, each of the plurality of interlayer insulating layers 121 may include a first portion 121P1 overlapping the gate pattern 165 of at least one structure of at least one horizontal structure in the Z-direction and a second portion 121P2 overlapping another portion of the at least one structure of at least one horizontal structure in the Z-direction. The thickness of the first portion 121P1 may be smaller than the thickness of the second portion 121P2. The difference between the thickness of the first portion 121P1 and the thickness of the second portion 121P2 may be due to the gate pattern 165.

Each of the plurality of horizontal structures 120 may include a plurality of structures LS spaced apart from each other, a plurality of conductive line patterns 170 connecting the plurality of structures LS to each other, and insulating patterns (not illustrated) covering side surfaces of the plurality of structures LS and the plurality of conductive line patterns 170.

The plurality of structures LS may include first structures LSa spaced apart from each other in the X-direction on the first side VPS1 of the plurality of vertical conductive patterns VP, and second structures LSb spaced apart from each other in the X-direction on the second side VPS2 of the plurality of vertical conductive patterns VP. The second side VPS2 may be a surface opposite to the first side VPS1. The plurality of conductive line patterns 170 may include first conductive line patterns 170*a* connecting the first structures LSa to each other and second conductive line patterns 170*b* connecting the second structures LSb to each other.

Each of the first structures LSa and the second structures LSb may include a semiconductor pattern 140, source/drain regions 150, a gate pattern 165, and a data storage structure 180, respectively. Each of the first structures LSa and the second structures LSb may further include a dielectric pattern 162 disposed between the gate pattern 165 and the semiconductor pattern 140. As shown in FIG. 2B, in some example embodiments, one or more of the interlayer insulating layers 121 may include a first portion 121P1 vertically overlapping (e.g., overlapping in the Z-direction) the gate pattern 165 of at least one structure LS of the first structure LSa or the second structure LSb of at least one horizontal structure 120 and a second portion 121P2 vertically overlapping the source/drain regions 150 and the data storage structure 180 of the at least one structure LS of the first structure LSa or the second structure LSb of the at least one horizontal structure 120.

The semiconductor pattern 140 may be disposed on the first region R1 of the substrate 101. The semiconductor pattern 140 may include a semiconductor material such as silicon, germanium, or silicon-germanium. The semiconductor pattern 140 may form a channel region of the memory cell transistor. The semiconductor pattern 140 may have first side surfaces 14051 opposing each other in the X-direction and second side surfaces 140S2 opposing each other in the Y-direction.

The source/drain regions 150 may be disposed on the same or substantially the same level (e.g., the same or substantially the same distance in the Z-direction from a reference location, such as the upper surface 101*a* of the substrate 101) as a level of the semiconductor pattern 140 on the first region R1 of the substrate 101. The source/drain regions 150 may be disposed on the second side surfaces 140S2 of the semiconductor pattern 140. The source/drain regions 150 may include the same semiconductor material as that of the semiconductor pattern 140 and may have the same or substantially the same thickness and/or the same or substantially the same width as those of the semiconductor pattern 140. The source/drain regions 150 may be formed by doping the semiconductor material with impurities. The source/drain regions 150 may have N-type or P-type conductivity.

In some example embodiments, the source/drain regions 150 may include a first source/drain region 151 disposed on one side of the second side surfaces 140S2 of the semiconductor pattern 140 and a second source/drain region 152 disposed on an opposite side of the second side surfaces 140S2 of the semiconductor pattern 140 opposing the one side. One of the first source/drain region 151 or the second source/drain region 152 may correspond to the source region, and the other may correspond to the drain region.

The first source/drain region 151 may be disposed between the semiconductor pattern 140 and the data storage structure 180, and the second source/drain region 152 may be disposed between the semiconductor pattern 140 and the vertical conductive pattern VP. The first source/drain region 151 may connect the semiconductor pattern 140 to the data storage structure 180, and the second source/drain region 152 may connect the semiconductor pattern 140 to the vertical conductive pattern VP. The first source/drain region 151 may have a shape different from that of the second source/drain region 152. This may be because the shapes of the first source/drain region 151 and the second source/drain region 152 may be determined by different processes. For example, the length of the first source/drain region 151 in the Y-direction may be greater than the length of the second source/drain region 152 in the Y-direction.

The gate pattern 165 may surround an upper surface, a lower surface, and the first side surfaces 140S1 of the semiconductor pattern 140 on the first region R1 of the substrate 101. That is, the gate pattern 165 may surround the semiconductor pattern 140 along a central axis in the Y-direction of the semiconductor pattern 140. For example, in a semiconductor device 100 that includes a plurality of semiconductor patterns 140, the semiconductor device 100 may include a plurality of gate patterns 165 surrounding upper surfaces, lower surfaces, and the first side surfaces 140S1 of each of the plurality of semiconductor patterns 140, such that each separate gate pattern 165 surrounds an upper surface, a lower surface, and the first side surfaces of a separate semiconductor pattern 140 of the plurality of semiconductor patterns 140.

A semiconductor device 100 having improved electrical properties may be provided by the structure of the gate pattern 165 surrounding the four surfaces (upper surface, lower surface, and first side surfaces 140S1) of the semiconductor pattern 140. A semiconductor device 100 having improved electrical properties and integration density may be provided based on the semiconductor device 100 including a plurality of semiconductor patterns 140 spaced apart from each other horizontally (e.g., in the X-direction) and vertically (e.g., in the Z-direction) and gate patterns 165 surrounding each of the four surfaces of each of the plurality of semiconductor patterns 140. A semiconductor device 100 having improved electrical properties and integration density may be provided based on the semiconductor device 100 including at least one conductive line pattern 170 horizontally connecting at least some of the gate patterns 165 to each other (e.g., electrically connecting gate patterns 165 that overlap each other in the X-direction) a where the gate patterns 165 at a given position in the Z-direction are electrically connected horizontally (e.g., in the X-direction by other). A semiconductor device 100 having improved electrical properties and integration density may be provided based on the semiconductor device 100 including a plurality of structures LS that each include the semiconductor patterns 140, the first and second source/drain regions 151 and 152, the gate patterns 165, and the data storage structure 180, where the plurality of structures LS are spaced apart from each other (e.g., in the X-direction and the Z-direction). A semiconductor device 100 having improved electrical properties and integration density may be provided based on the semiconductor device 100 including horizontal structures 120, spaced apart in the Z-direction by one or more interlayer insulating layers 121, which include first and second structures LSa and LSb spaced apart from each other and on opposite sides of a vertical conductive pattern 130, where each of the first and second structures LSa and LSb includes a semiconductor pattern 140, the first and second source/drain regions 151 and 152, a gate pattern 165 surrounding an upper surface, a lower surface, and the first side surfaces 140S1 of the semiconductor pattern 140, and a data storage structure 180 on a side surface of the first source/drain region 151. A semiconductor device 100 having improved electrical properties and integration density may be provided based on the semiconductor device 100 including a landing pattern LP spaced apart from the plurality of semiconductor patterns 140 in the X-direction on the second region R2 of the substrate 101 and electrically connected to the plurality of gate patterns 165, where the landing pattern LP includes a semiconductor material layer 131 and a conductive material layer 132 covering at least one surface of the semiconductor material layer 131. Improved integration density of a semiconductor device 100 may result in improved compactness, miniaturization, etc. of the semiconductor device 100. Additionally, by including such a semiconductor device 100 having improved electrical properties and integration density in a manufactured electronic device, an electronic device having improved electrical properties and integration density may be provided. In some example embodiments, the gate pattern 165 may have a uniform or substantially uniform thickness and may surround the semiconductor pattern 140.

The gate pattern 165 may include a conductive material, and the conductive material may include at least one of a doped semiconductor material (e.g., doped silicon or doped germanium), a conductive metal nitride (e.g., titanium nitride, tantalum nitride, or tungsten nitride), metals (e.g., tungsten, titanium, tantalum, cobalt, aluminum, or ruthenium), or a metal-semiconductor compound (e.g., tungsten silicide, cobalt silicide, or titanium silicide).

The dielectric pattern 162 may be disposed between the gate pattern 165 and the semiconductor pattern 140 to have a conformal thickness. The dielectric pattern 162 may include silicon oxide, silicon nitride, or a high-k material. The high-k material may refer to a dielectric material having a dielectric constant higher than silicon oxide ($SiO_2$) The high-k material may be, for example, one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$), where $0 \leq x \leq 7$ and $0 \leq y \leq 7$.

The data storage structure 180 may extend in the Y-direction from one side of the semiconductor pattern 140. The data storage structure 180 may be disposed to extend parallel to the semiconductor pattern 140 in the Y-direction on the side of the first source/drain region 151. The data storage structure 180 may be electrically connected to the semiconductor pattern 140 and the first source/drain region 151. In some example embodiments, the data storage structure 180 may include a first electrode 181, a dielectric layer 185 on the first electrode 181, and a second electrode 182 on the dielectric layer 185. The data storage structure may have a cylindrical shape, but some example embodiments thereof are not limited thereto and the data storage structure may have a pillar shape in some example embodiments. The first and second electrodes 181 and 182 may include at least one of a doped semiconductor material, a conductive metal nitride, a metal, or a metal-semiconductor compound, and the dielectric layer 185 may include a high-k material, for example, at least one of zirconium oxide ($ZrO_2$), aluminum oxide ($Al_2O_3$), or hafnium oxide ($Hf_2O_3$).

As the first structures LSa are spaced apart from each other in the X-direction in the horizontal structure 120, the plurality of semiconductor patterns 140 in the first structures LSa may be spaced apart from each other in the X-direction, and the plurality of gate patterns 165 in the first structures LSa may surround the plurality of semiconductor patterns 140, respectively (e.g., each of the gate patterns 165 may surround a separate semiconductor pattern 140). The second structures LSb may be described the same or similarly to the above example.

The plurality of conductive line patterns 170 may connect the gate patterns 165 of the plurality of structures LS to each other. The plurality of conductive line patterns 170 may electrically connect the gate patterns 165 of the plurality of structures LS disposed spaced apart in the X-direction within the horizontal structure 120 to each other.

Each of the plurality of conductive line patterns 170 may extend in the X-direction between the plurality of adjacent gate patterns 165 (e.g., between adjacent gate patterns 165 of the plurality of gate patterns 165), including adjacent gate patterns 165 that are at a same level in the Z-direction and thus at least partially overlap each other in the X-direction, such that each conductive line pattern 170 may connect at least adjacent gate patterns 165, in the X-direction, of a plurality of gate patterns 165 that are at a same level in the Z-direction and thus at least partially overlap each other in the X-direction.

Each of the plurality of conductive line patterns 170 may be integrally connected to each of the plurality of gate patterns 165 to which the conductive line pattern 170 is connected. For example, each conductive line pattern 170 that connects adjacent gate patterns 165 in the X-direction may be integrally connected to each of said adjacent gate patterns 165, such that the conductive line pattern 170 and the plurality of gate patterns 165 connected thereto are separate portions of a single, unitary piece of material. For example, each of the plurality of conductive line patterns 170 may be integrally connected to adjacent (e.g., adjacent in the X-direction) gate patterns 165 of the plurality of gate patterns 165, such as in example embodiments where each of the plurality of conductive line patterns 170 extends in the X-direction between the adjacent gate patterns 165. In example embodiments where a plurality of conductive line patterns 170 connect, and are integrally connected to, separate sets of adjacent gate patterns 165 of a plurality of gate patterns 165 in the X-direction, where the plurality of gate patterns 165 are at least partially overlapped with each other in the X-direction, such that the conductive line patterns 170 and the gate patterns 165 alternate in the X-direction, the entire plurality of conductive line patterns 170 and the plurality of gate patterns 165 may be separate portions of a single, unitary piece of material extending in the X-direction. This may be because the plurality of conductive line patterns 170 and the plurality of gate patterns 165 may be formed through the same deposition process.

The plurality of conductive line patterns 170 may include a conductive material, and the conductive material may include at least one of a doped semiconductor material (e.g., doped silicon or doped germanium), a conductive metal nitride (e.g. titanium nitride, tantalum nitride, or tungsten nitride), a metal (e.g. tungsten, titanium, tantalum, cobalt, aluminum, or ruthenium), or a metal-semiconductor compound (e.g., tungsten silicide, cobalt silicide, or titanium silicide). The plurality of conductive line patterns 170 may include the same material (e.g., may include a material that is a same material) as a material of the plurality of gate patterns 165.

A plurality of semiconductor patterns 140 spaced apart from each other in the X-direction within one horizontal structure 120 may be electrically connected to each other by a plurality of conductive line patterns 170. Accordingly, the plurality of semiconductor patterns 140 may have a horizontal word line (lateral WL) structure. In this case, the semiconductor patterns 140 disposed in different horizontal structures 120 may be spaced apart from each other in the Z-direction by interlayer insulating layers 121.

The plurality of vertical conductive patterns VP may vertically extend in the Z-direction on the substrate 101. Each of the plurality of vertical conductive patterns VP may have a line shape, a bar shape, or a columnal shape. For example, the plurality of vertical conductive patterns VP may have a rectangular pillar shape, but some example embodiments thereof are not limited thereto and the shape may be varied in some example embodiments.

Referring to FIGS. 2A and 2B, with respect to the central axis of the plurality of vertical conductive patterns VP in the X-direction, the first structures LSa and the first conductive line patterns 170*a* may be symmetrical to the second structures LSb and the second conductive line patterns 170*b*. In this case, each of the plurality of vertical conductive patterns VP may simultaneously apply power to the first and second structures LSa and LSb on the first and second sides VPS1 and VPS2, and each of the conductive patterns VP may simultaneously apply power to the plurality of structures LS disposed on the plurality of horizontal structures 120.

However, in some example embodiments, the symmetric shape may be varied depending on process conditions of a patterning process for forming the semiconductor pattern 140.

Although not illustrated, the semiconductor device 100 may further include an upper interconnection line disposed on the plurality of vertical conductive patterns VP and connected to the plurality of vertical conductive patterns VP. The plurality of vertical conductive patterns VP may include at least one of a doped semiconductor material, a conductive metal nitride, a metal, or a metal-semiconductor compound.

The semiconductor device 100 according to some example embodiments may further include a cell region insulating layer 190 covering the stack structure, a landing pattern LP disposed on the second region R2 of the substrate 101, and a landing contact LC penetrating through the cell region insulating layer 190 on the second region R2 and in contact with the landing pattern LP. Each of the horizontal structures 120 may include a landing pattern LP disposed parallel to the semiconductor patterns 140 spaced apart from each other in the X-direction.

The landing patterns LP may be spaced apart from each other in the X-direction from the semiconductor patterns 140 in each of the horizontal structures 120. The landing pattern LP may be connected to the gate patterns 165 by the conductive line pattern 170.

The landing pattern LP may include a semiconductor material layer 131 and a conductive material layer 132 covering at least one surface of the semiconductor material layer 131.

The semiconductor material layer 131 may be a semiconductor layer spaced apart from the plurality of semiconductor patterns 140 in the X-direction. That is, the semiconductor material layer 131 may be disposed parallel to the plurality of semiconductor patterns 140 in the X-direction. The semiconductor material layer 131 may have substantially the same thickness as that of each of the plurality of semiconductor patterns 140, and the thickness may range from about 1 nm to about 50 nm.

The semiconductor material layer 131 may include the same material (e.g., may include a material that is a same material) as that of the plurality of semiconductor patterns 140. The material may include, for example, silicon, germanium, or silicon-germanium. This may be because the semiconductor material layer 131 is formed in a patterning process for forming the plurality of semiconductor patterns 140.

In some example embodiments, the length of the semiconductor material layer 131 in the X-direction may be the same or substantially the same as the length of the semiconductor pattern 140 in the X-direction. The length of the semiconductor material layer 131 in the X-direction may be, for example, in the range of about 10 nm to about 1000 nm, especially, in the range of about 200 nm to about 500 nm. In some example embodiments, the length of the semiconductor material layer 131 in the Y-direction may be greater than the length of the semiconductor pattern 140 in the Y-direction. For example, the length of the semiconductor material layer 131 in the Y-direction may be substantially equal to the sum of the length of the semiconductor pattern 140 in the Y-direction and the length of the second source/drain region 152 in the Y-direction. For example, the length of the semiconductor material layer 131 in the Y-direction may be in the range of about 10 nm to about 1000 nm, especially, in the range of about 200 nm to about 500 nm. Since the landing pattern LP includes the semiconductor material layer 131 having a planar area within the numerical range as above, a process margin for forming the landing contact LC may be secured. When the planar area is larger than the range above, integration density may be relatively reduced, and when the planar area is smaller than the above range, productivity of the process of forming the landing contact LC may be relatively deteriorated. That is, by forming a semiconductor material layer 131 having a relatively wide plane area through a patterning process and forming a conductive material layer 132 conformally covering the semiconductor material layer 131, a semiconductor device having improved productivity may be provided. Also, as the conductive material layer 132 is deposited on the semiconductor material layers 131 spaced apart from each other in the Z-direction, leakage current in the Z-direction may be prevented.

The conductive material layer 132 may cover an upper surface, a lower surface, and side surfaces opposing each other in the X-direction of the semiconductor material layer 131. That is, the conductive material layer 132 may surround the semiconductor material layer 131 along a central axis in the Y-direction of the semiconductor material layer 131. In some example embodiments, the conductive material layer 132 may further include a portion covering one of the side surfaces opposing each other in the Y-direction of the semiconductor material layer 131. The landing contact LC may be in contact with the conductive material layer 132.

The plurality of conductive line patterns 170 may further include a landing line pattern 170L extending in the X-direction between the gate pattern 165 and the landing pattern LP. The landing line pattern 170L may be in contact with the conductive material layer 132 of the landing pattern LP. The landing pattern LP may be electrically connected to the plurality of gate patterns 165 through the landing line pattern 170L.

In some example embodiments, an upper surface of the landing line pattern 170L may be coplanar with an upper surface of the conductive material layer 132. A lower surface of the landing line pattern 170L may be coplanar with a lower surface of the conductive material layer 132. A length of the landing line pattern 170L in the Z-direction may be the same or substantially the same as a length of the conductive material layer 132 in the Z-direction. A thickness of the conductive material layer 132 may be the same or substantially the same as a thickness of each of the gate patterns 165 and/or a thickness of each of the conductive line patterns 170. For example, the thickness of the conductive material layer 132 may range from about 1 nm to about 100 nm. The conductive material layer 132 may be integrally connected to the landing line pattern 170L, such that the conductive material layer 132 and the landing line pattern 170L are separate portions of a single, unitary piece of material.

The conductive material layer 132 may include the same material as those of the gate patterns 165 and/or the conductive line patterns 170.

In some example embodiments, referring to FIGS. 2C and 2D, the landing pattern LP may further include a dielectric layer 133 between the semiconductor material layer 131 and the conductive material layer 132. The dielectric layer 133 may include the same material as that of the dielectric pattern 162. This is because, in the process of forming the dielectric pattern 162 and the gate pattern 165 conformally covering the semiconductor pattern 140 on the first region R1, the dielectric layer 133 and the conductive material layer 132 conformally covering the semiconductor material layer 131 on the second region R2 may be formed.

The landing contact LC may extend in the Z-direction through the cell region insulating layer 190 on the second region R2. The landing contact LC may be in contact with the landing pattern LP of each of the horizontal structures 120. Power may be applied to the landing contact LC, and the gate patterns 165 spaced apart from each other in the X-direction within one horizontal structure 120 may be electrically connected through the landing contact LC, the landing pattern LP, and the conductive line patterns 170, such that the horizontal word line structure may be formed.

The landing contact LC may be in contact with the conductive material layer 132. Referring to FIG. 2C, the landing contact LC may penetrate through the conductive material layer 132 on the semiconductor material layer 131 and may extend into the semiconductor material layer 131 to a predetermined depth. However, in some example embodiments, the landing contact LC may be disposed to be in contact with the conductive material layer 132 and to be spaced apart from the semiconductor material layer 131.

In some example embodiments, the semiconductor device 100 may further include a dummy semiconductor line pattern 138 and a dummy data storage structure 180*d* disposed on the second region R2.

The dummy semiconductor line pattern 138 may extend in the X-direction on one side of the landing pattern LP. The dummy semiconductor line pattern 138 may be integrally connected to the semiconductor material layer 131, such that the dummy semiconductor line pattern 138 and the semiconductor material layer 131 are separate portions of a single, unitary piece of material. The semiconductor material layer 131 may have a shape of a protrusion protruding from the dummy semiconductor line pattern 138 in one direction. The dummy semiconductor line patterns 138 may be disposed parallel to the first source/drain regions 151 in the X-direction. In some example embodiments, in a region adjacent to the first region R1, the dummy semiconductor line pattern 138 may be in the form of an intermittent line pattern extending in the X-direction with one cut-off portion, or may be a single uniform line pattern in some example embodiments.

The dummy data storage structure 180*d* may extend in the Y-direction on one side of the landing pattern LP or one side of the dummy semiconductor line pattern 138 on the second region R2 and may have a structure the same as or similar to the data storage structure 180. The dummy data storage structure 180*d* may be a dummy structure formed during a process of manufacturing a semiconductor device without working as a data storage element. However, in some example embodiments, the dummy data storage structure 180*d* may not be provided.

Referring to FIG. 2C, the semiconductor device 100 may further include a dummy landing pattern DLP. The dummy landing pattern DLP may be spaced apart from the landing pattern LP in the Z-direction below the landing pattern LP. That is, the dummy landing pattern DLP may overlap the landing pattern LP in the Z-direction. The dummy landing pattern DLP may be a dummy structure formed together in a process of forming the landing pattern LP in the stack structure forming the stepped structure on the second region R2. The dummy landing pattern DLP may be spaced apart from the landing contact LC. That is, the landing contact LC may be in contact with the landing pattern LP and may be spaced apart from the dummy landing pattern DLP disposed therebelow.

The dummy landing pattern DLP may be configured the same as or similar to the landing pattern LP. For example, the dummy landing pattern DLP may include a first layer 131D the same as the semiconductor material layer 131 and a second layer 132D having the same material as that of the conductive material layer 132. The dummy landing pattern DLP may include a third layer 133D the same as the dielectric layer 133.

In the description below, various modifications of a semiconductor device according to some example embodiments will be described with reference to FIGS. 3 to 7.

Figure 3:
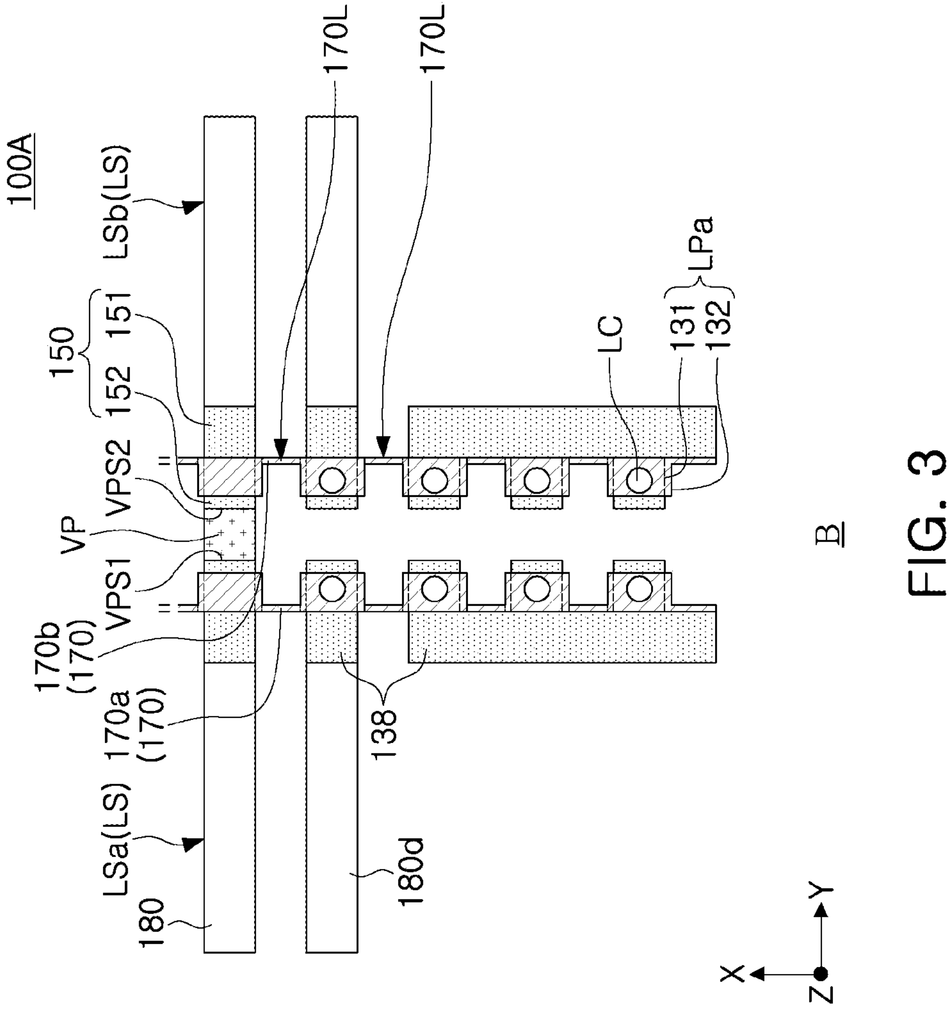
FIGS. 3, 4A, 4B, 5, 6, and 7 are plan diagrams illustrating a semiconductor device according to some example embodiments of the present inventive concepts.

FIG. 3 is a plan diagram illustrating a semiconductor device according to some example embodiments, illustrating a region corresponding to FIG. 2A.

Figure 12A:
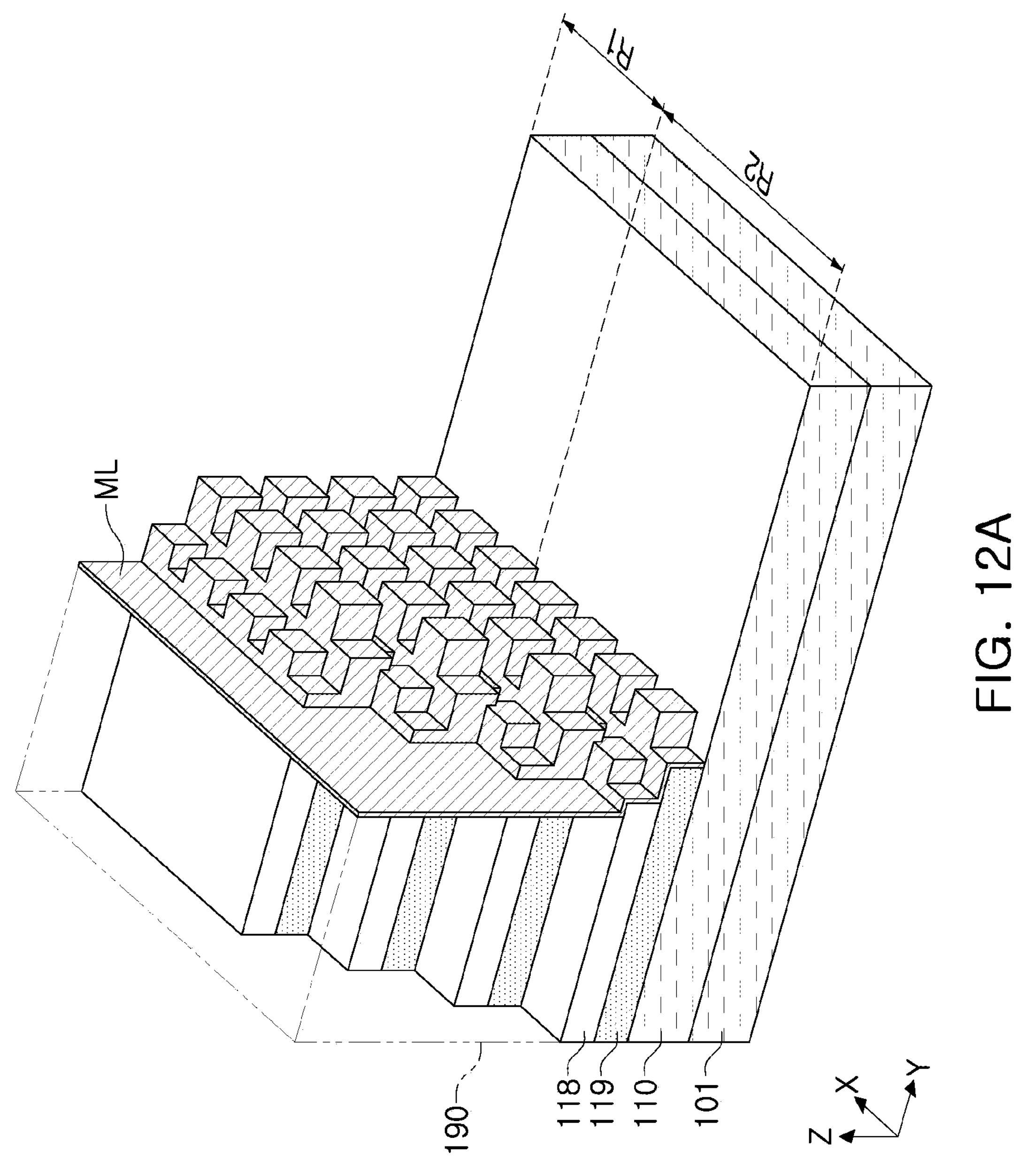
Figure 12B:
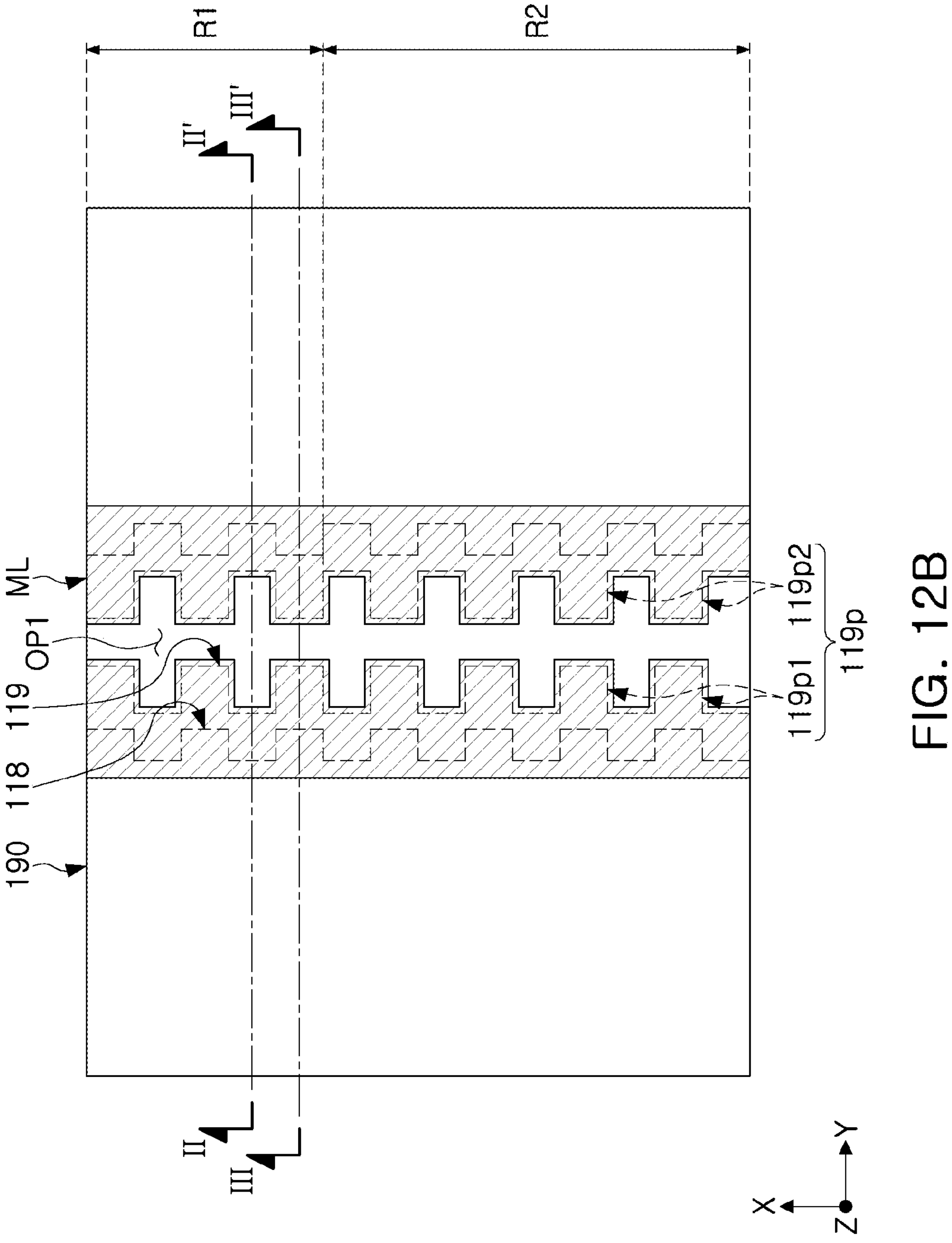
Figure 12C:
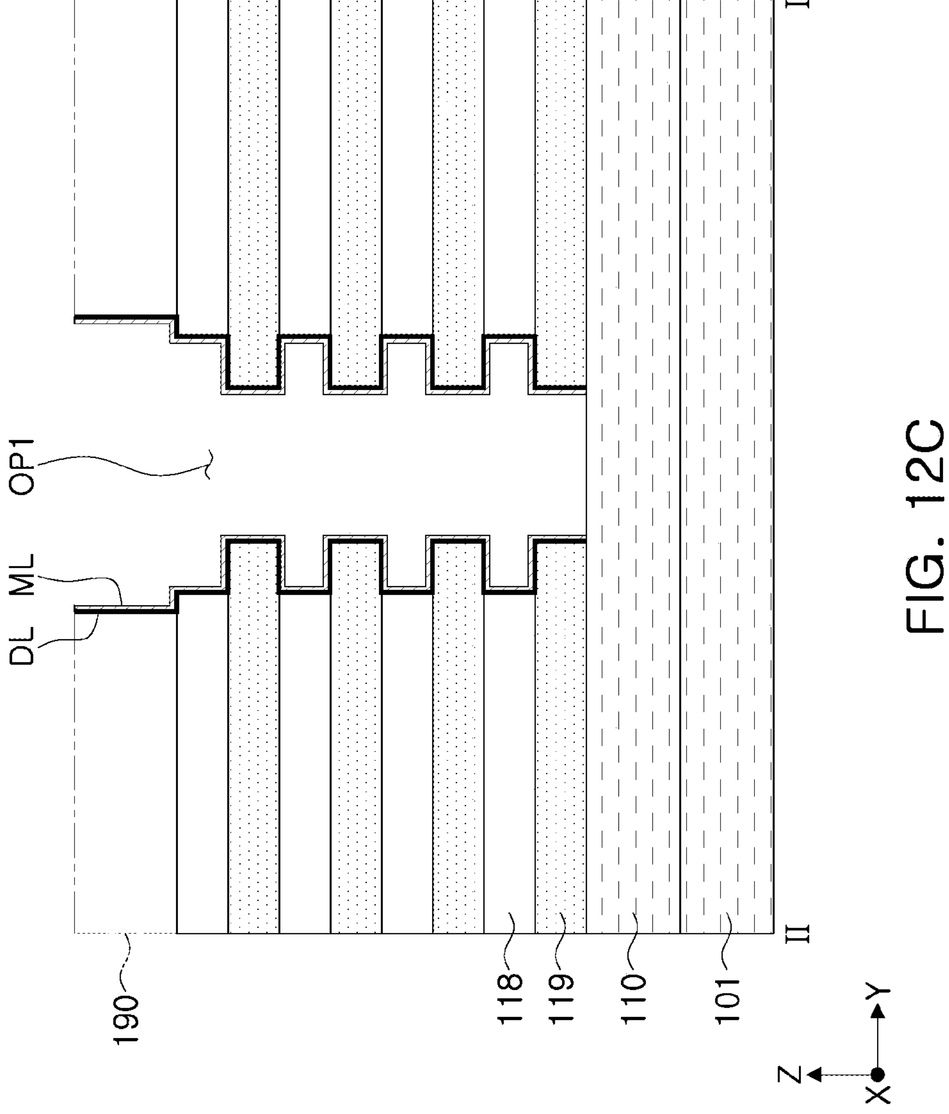
Figure 12D:
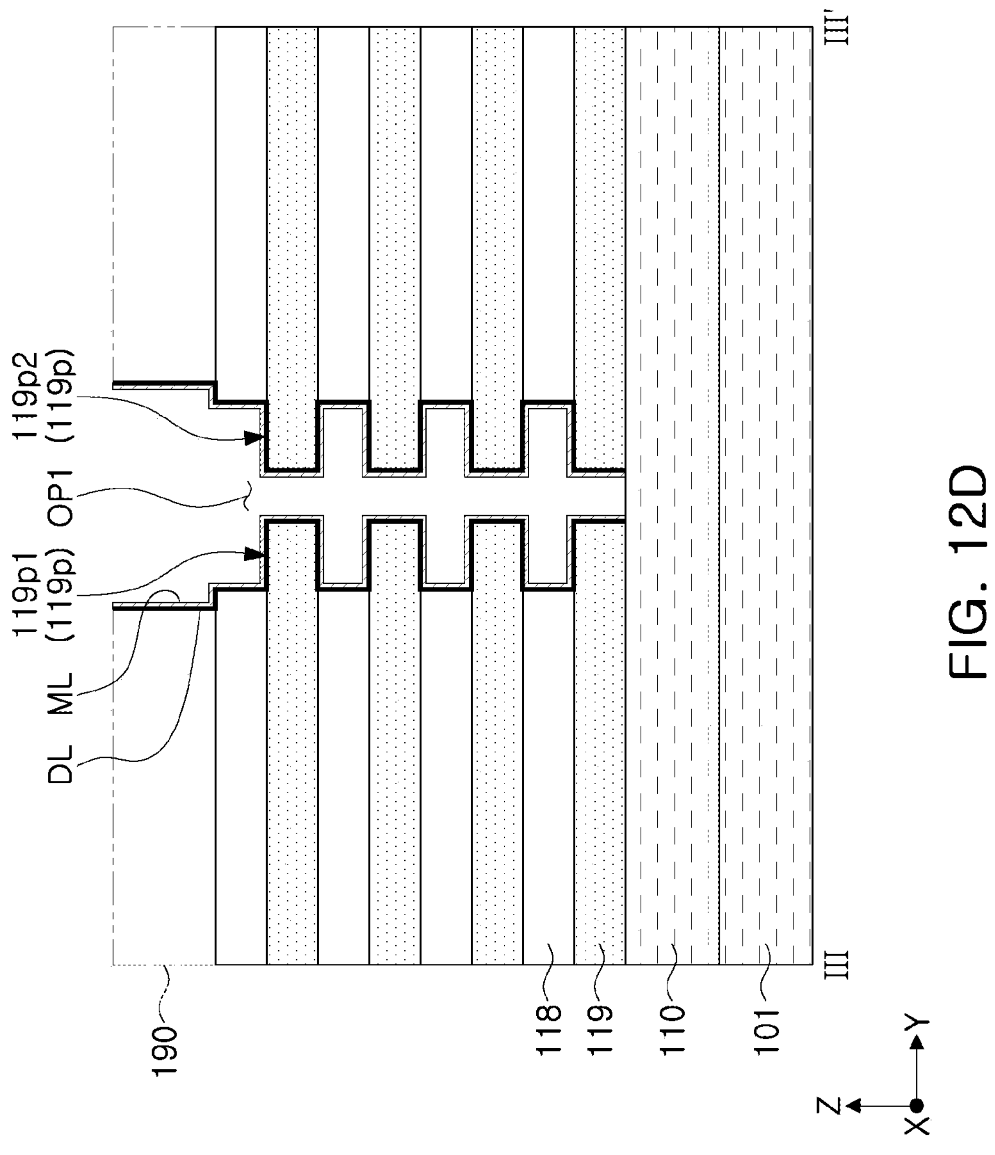

Referring to FIG. 3, in the semiconductor device 100A, the landing pattern LPa may include a semiconductor material layer 131 and a conductive material layer 132 covering at least a portion of an upper surface, a lower surface, and side surfaces opposing each other in the X-direction of the semiconductor material layer 131. The conductive material layer 132 may expose a portion of the semiconductor material layer 131. The exposed portion of the semiconductor material layer 131 may have a shape the same as or similar to that of the second source/drain region 152 on the first region R1. This is because, in the process of patterning a portion of the metal material layer (ML, see FIG. 12A) to form the second source/drain region 152, the metal material layer ML on the second region R2 may also be removed. However, even in this case, the landing contact LC may be in contact with the conductive material layer 132 of the landing pattern LPa.

Figure 4A:
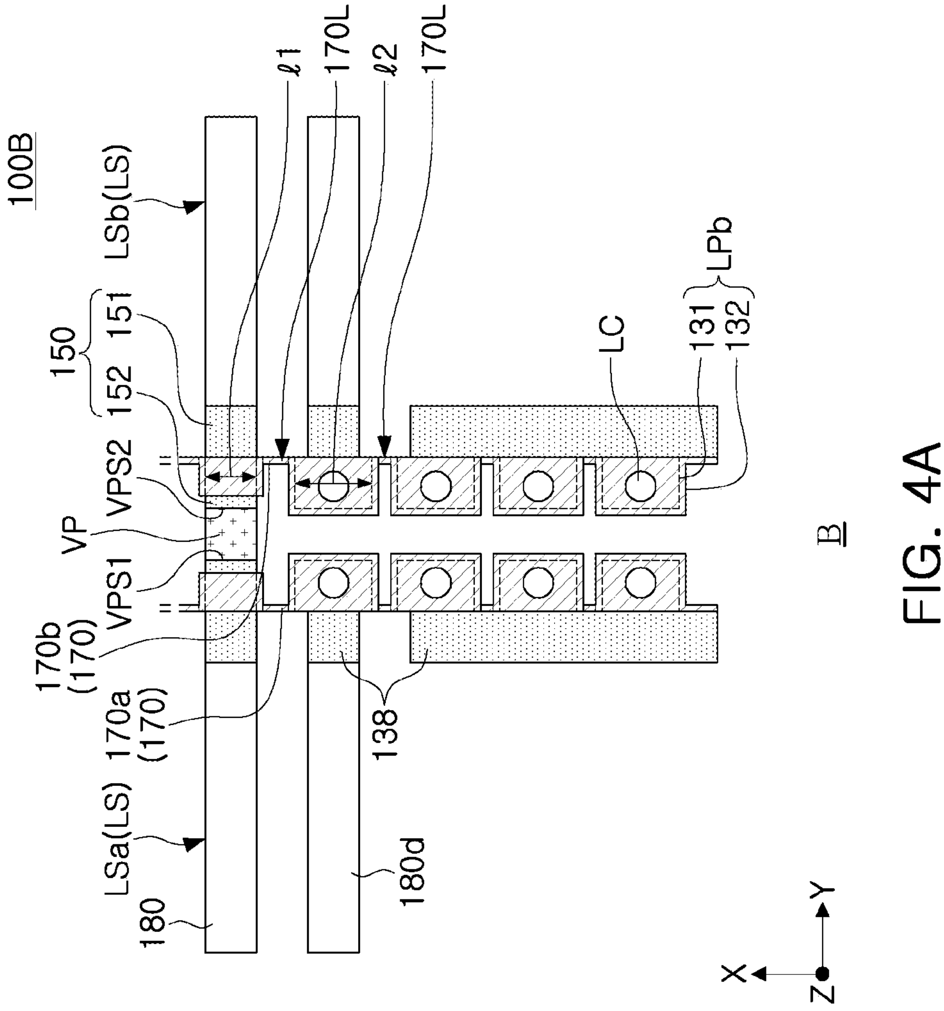
Figure 4B:
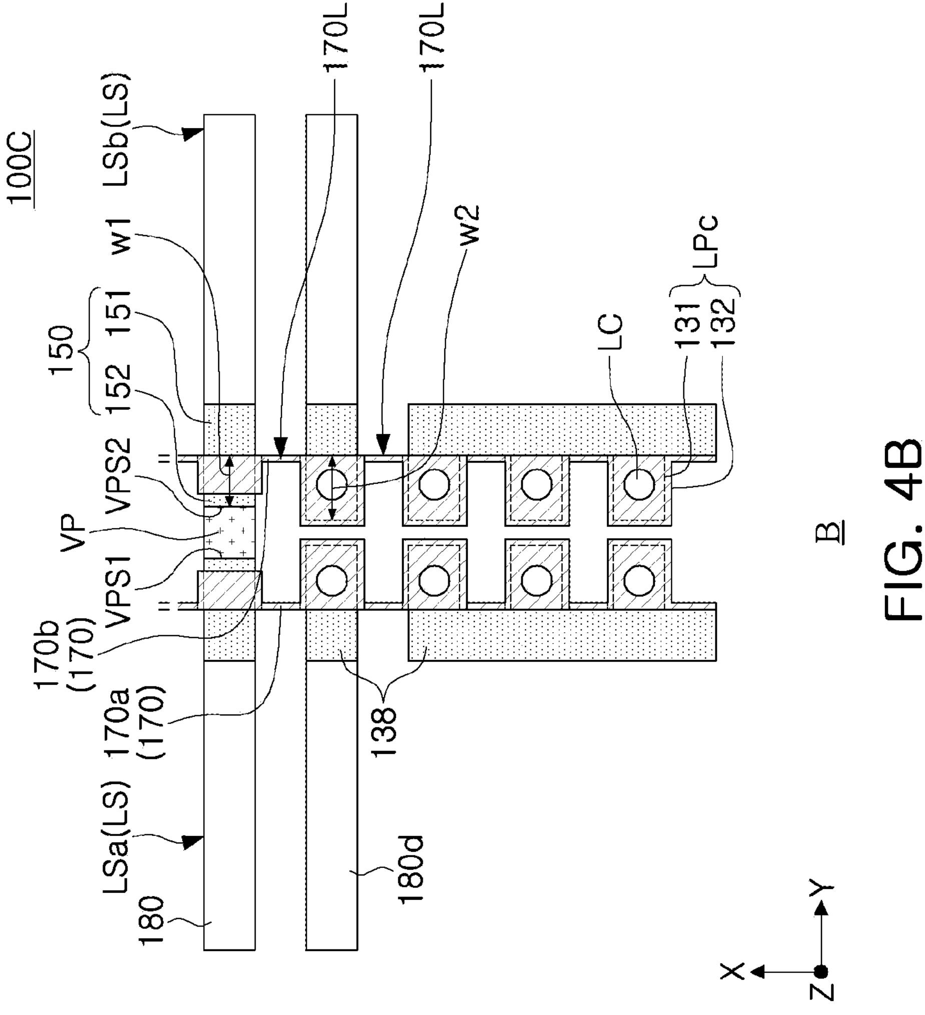

FIGS. 4A and 4B are plan diagrams illustrating a semiconductor device according to some example embodiments, illustrating a region corresponding to FIG. 2A.

Referring to FIG. 4A, in the semiconductor device 100B, the landing pattern LPb may have a shape different from that of the landing pattern LP in FIG. 2A. For example, the first length 11 of the semiconductor pattern 140 in the X-direction may be smaller than the second length 12 of the semiconductor material layer 131 in the X-direction. This may be because, the length of the semiconductor material layer 131 in the X-direction may be formed relatively large in the patterning process for forming the semiconductor pattern 140 to secure a relatively large plane area of the landing pattern LPb. Accordingly, a semiconductor device having improved productivity, such as securing an electrical connection between the landing contact LC and the landing pattern LPb, may be provided.

Referring to FIG. 4B, in the semiconductor device 100C, the landing pattern LPc may have a shape different from that of the landing pattern LP in FIG. 2A. For example, the first width w1, which is the sum of the length of the semiconductor pattern 140 in the Y-direction and the length of the second source/drain region 152 in the Y-direction, may be smaller than the second width w2, which is the length of the semiconductor material layer 131 in the Y-direction. This may be to improve contact failure with the landing contact LC by securing a relatively large plane area of the landing pattern LPc, similarly to the example described with reference to FIG. 4A.

Figure 5:
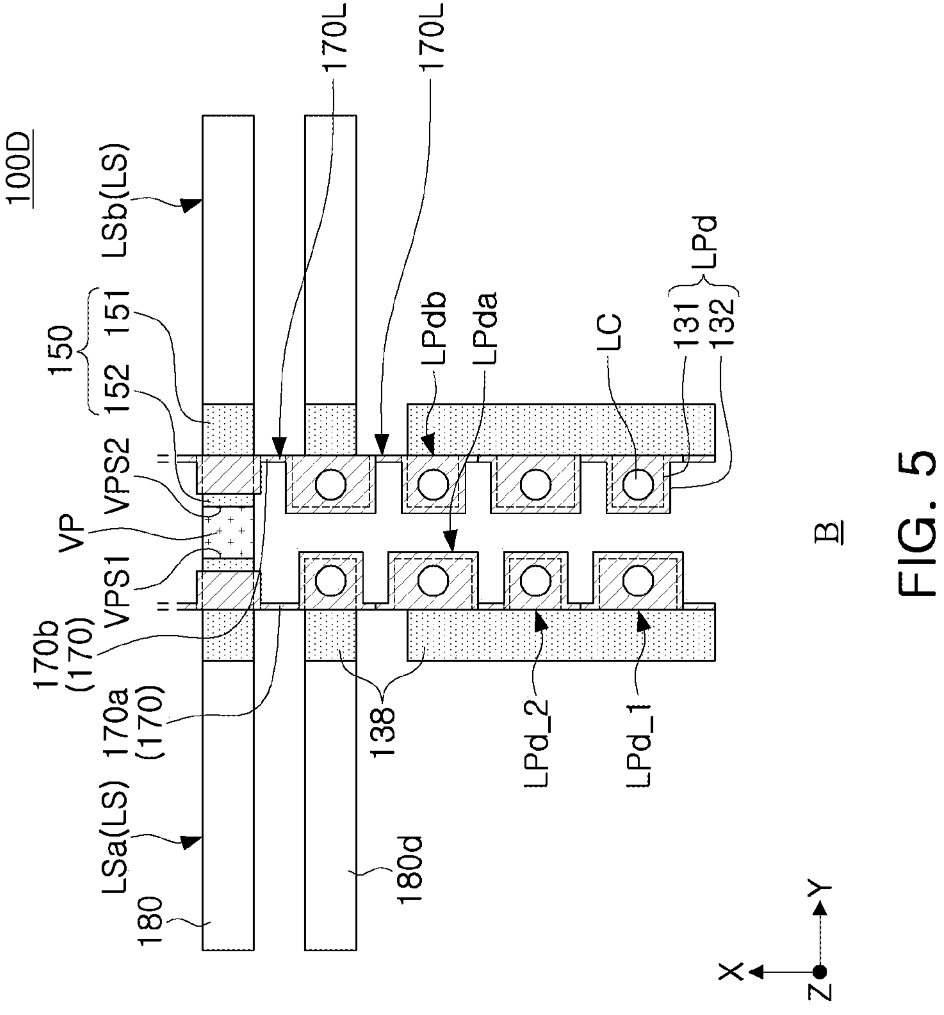

FIG. 5 is a plan diagram illustrating a semiconductor device according to some example embodiments, illustrating a region corresponding to FIG. 2A.

Referring to FIG. 5, in the semiconductor device 100D, the landing pattern LPd may have a shape different from that of the landing pattern LP in FIG. 2A.

The plurality of horizontal structures 120 (see FIG. 2B) may include a first horizontal structure and a second horizontal structure on the first horizontal structure, and the landing pattern LPd may include a first landing pattern LPd_1 of the first horizontal structure and a second landing pattern LPd_2 of the second horizontal structure. The shapes of the first and second landing patterns LPd_1 and LPd_2 may be different. That is, the plurality of landing patterns LPd formed in the plurality of layers, including the first and second landing patterns LPd_1 and LPd_2, may have different shapes. The different shapes may indicate that the length in the X-direction or the length in the Y-direction may be different as described with reference to FIGS. 4A and 4B. However, the different shapes may indicate that shapes on the plane may be different as described with reference to FIG. 6. As the landing patterns LPd of different levels have different shapes, a semiconductor device having improved electrical properties, such as adjusting a contact area with the landing contact LC, may be provided.

In some example embodiments, the landing pattern LPd may include a landing pattern LPda connected to the first structures LSa within one horizontal structure 120 and a landing pattern LPdb connected to the second structures LSb. The landing pattern LPda connected to the first structures LSa and the landing pattern LPdb connected to the second structures LSb may have different shapes. The different shapes may indicate as described above. As the landing patterns LPd of the same level have different shapes, a semiconductor device having improved electrical properties such as improved integration density may be provided.

In some example embodiments, only the first and second landing patterns LPd_1 and LPd_2 may have different shapes, or only the landing pattern LPda connected to the first structures LSa and the landing pattern LPdb connected to the second structures LSb may have different shapes.

Figure 6:
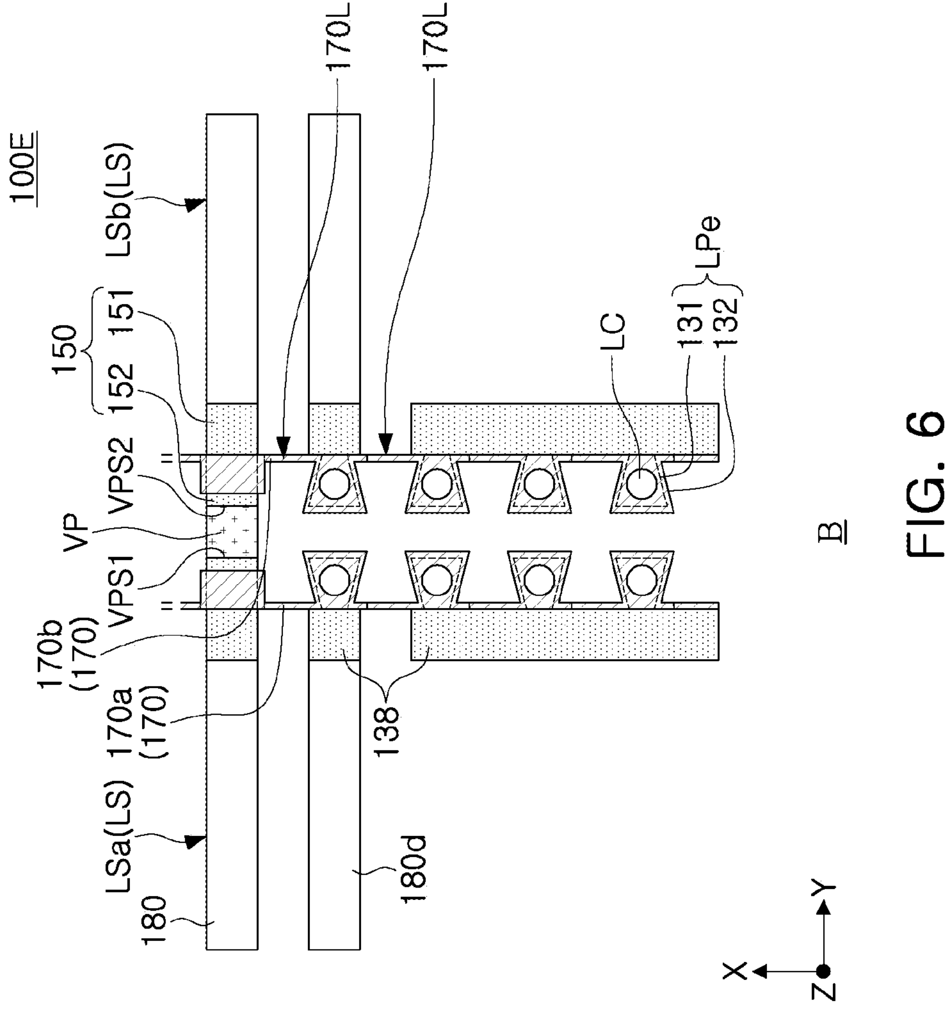

FIG. 6 is a plan diagram illustrating a semiconductor device according to some example embodiments, illustrating a region corresponding to FIG. 2A.

Referring to FIG. 6, in the semiconductor device 100E, the landing pattern LPe may have a shape different from that of the landing pattern LP in FIG. 2A. For example, the landing pattern LPe may have a trapezoidal shape on a plane. The trapezoid shape may be a shape in which a length in the X-direction may increase in a direction away from the dummy semiconductor line pattern 138. However, the shape of the landing pattern LPe is not limited thereto and may be varied such as a square shape, a rectangular shape, a circular shape, and the like.

Figure 7:
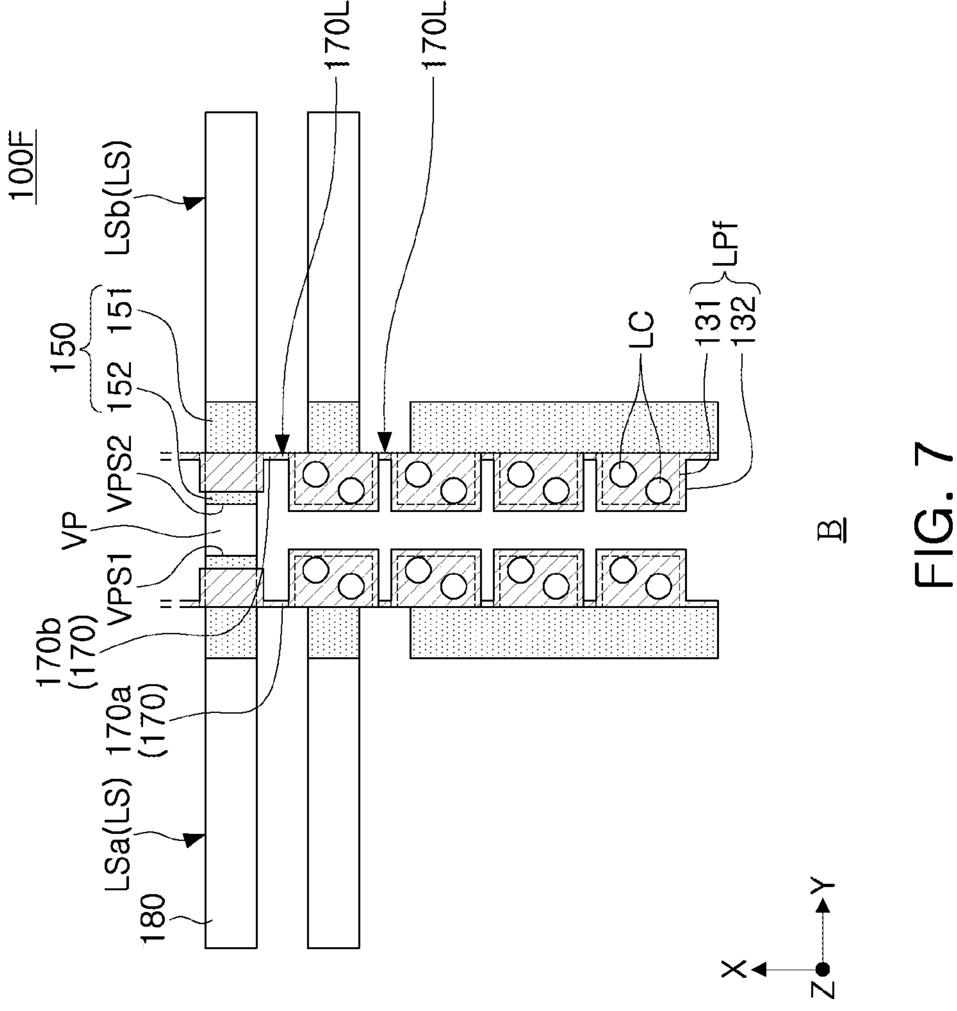

FIG. 7 is a plan diagram illustrating a semiconductor device according to some example embodiments, illustrating a region corresponding to FIG. 2A.

Referring to FIG. 7, the semiconductor device 100F may include a landing pattern LPf in contact with at least two or more landing contacts LC. The conductive material layer 132 of one landing pattern LPf may be in contact with two or more landing contacts LC. Accordingly, a semiconductor device having improved electrical properties may be provided.

In some example embodiments, the entirety of the plurality of landing patterns LPf may be formed to be in contact with two or more landing contacts LC, but in some example embodiments, only a portion of the plurality of landing patterns LPf may be in contact with two or more landing contacts LC, and the other portion of the plurality of landing patterns LPf may be in contact with a landing contact LC.

FIGS. 8, 9A, 9B, 9C, 9D, 10A, 10B, 10C, 10D, 11A, 11B, 11C, 11D, 12A, 12B, 12C, 12D, 13, 14A, 14B, 14C, 14D, 15A, 15B, 15C, 15D, 16A, 16B, 16C, 16D, 17A, 17B, 17C, 17D, 18A, 18B, 18C, 18D, and 19 are perspective diagrams, plan diagrams, and cross-sectional diagrams illustrating a method of manufacturing a semiconductor device according to some example embodiments. FIGS. 8, 9A, 10A, 11A, 12A, 13, 14A, 15A, 16A, 17A, 18A, and 19 are perspective diagrams illustrating a method of manufacturing a semiconductor device according to some example embodiments. FIGS. 9B, 10B, 11B, 12B, 14B, 15B, 16B, 17B, and 18B are plan diagrams corresponding to FIGS. 9A, 10A, 11A, 12A, 14A, 15A, 16A, 17A, and 18A, respectively. FIGS. 9C, 10C, 11C, 12C, 14C, 15C, 16C, 17C, and 18C are cross-sectional diagrams taken along line II-IF in FIGS. 9B, 10B, 11B, 12B, 14B, 15B, 16B, 17B, and 18B, respectively. FIGS. 9D, 10D, 11D, 12D, 14D, and FIGS. 15D, 16D, 17D, and 18D are cross-sectional diagrams taken along line III-III' in FIGS. 9B, 10B, 11B, 12B, 14B, 15B, 16B, 17B, and 18B, respectively.

Figure 8:
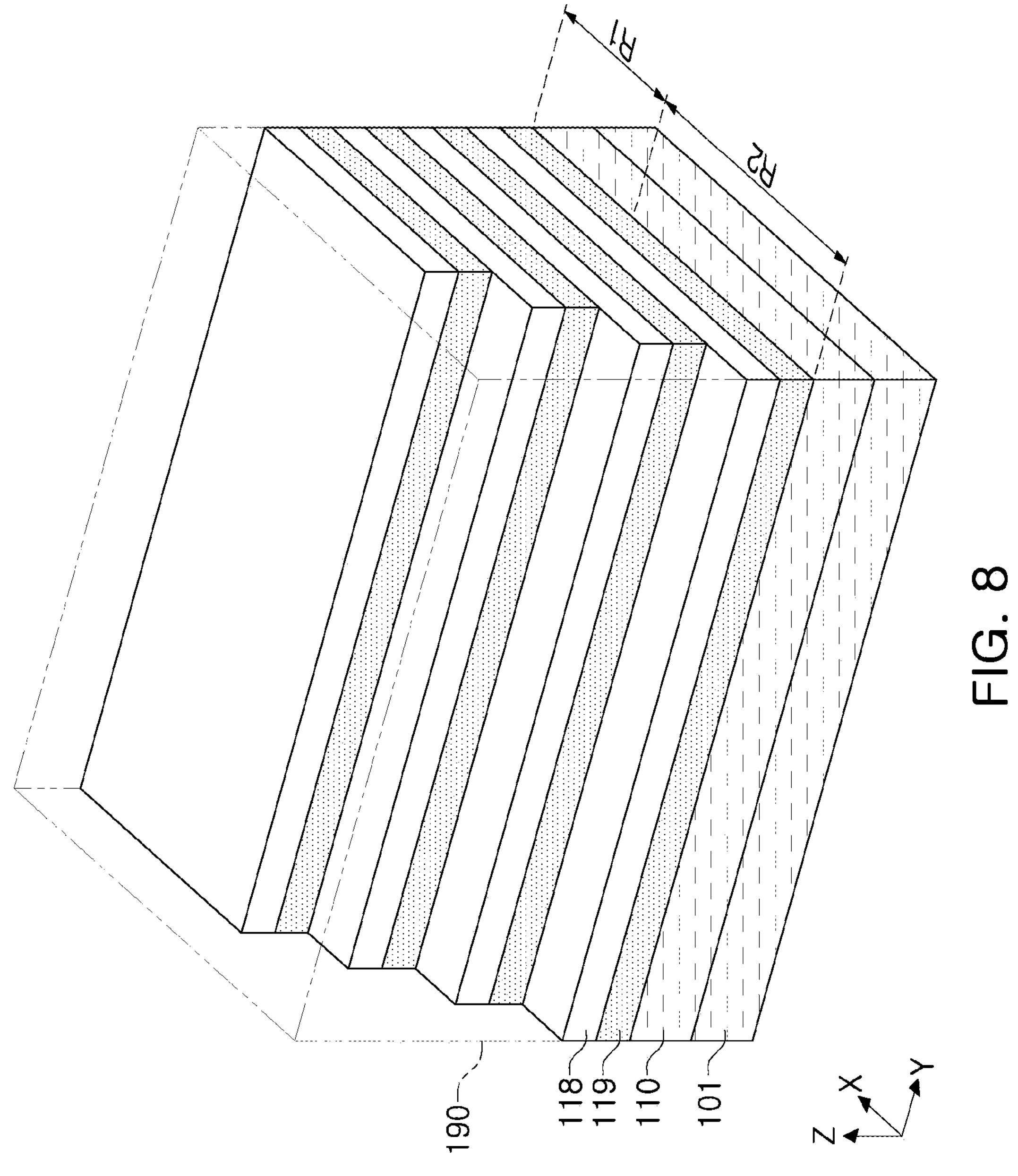
FIGS. 8, 9A, 9B, 9C, 9D, 10A, 10B, 10C, 10D, 11A, 11B, 11C, 11D, 12A, 12B, 12C, 12D, 13, 14A, 14B, 14C, 14D, 15A, 15B, 15C, 15D, 16A, 16B, 16C, 16D, 17A, 17B, 17C, 17D, 18A, 18B, 18C, 18D, and 19 are perspective diagrams, plan diagrams, and cross-sectional diagrams illustrating a method of manufacturing a semiconductor device according to some example embodiments of the present inventive concepts.
Figure 9A:
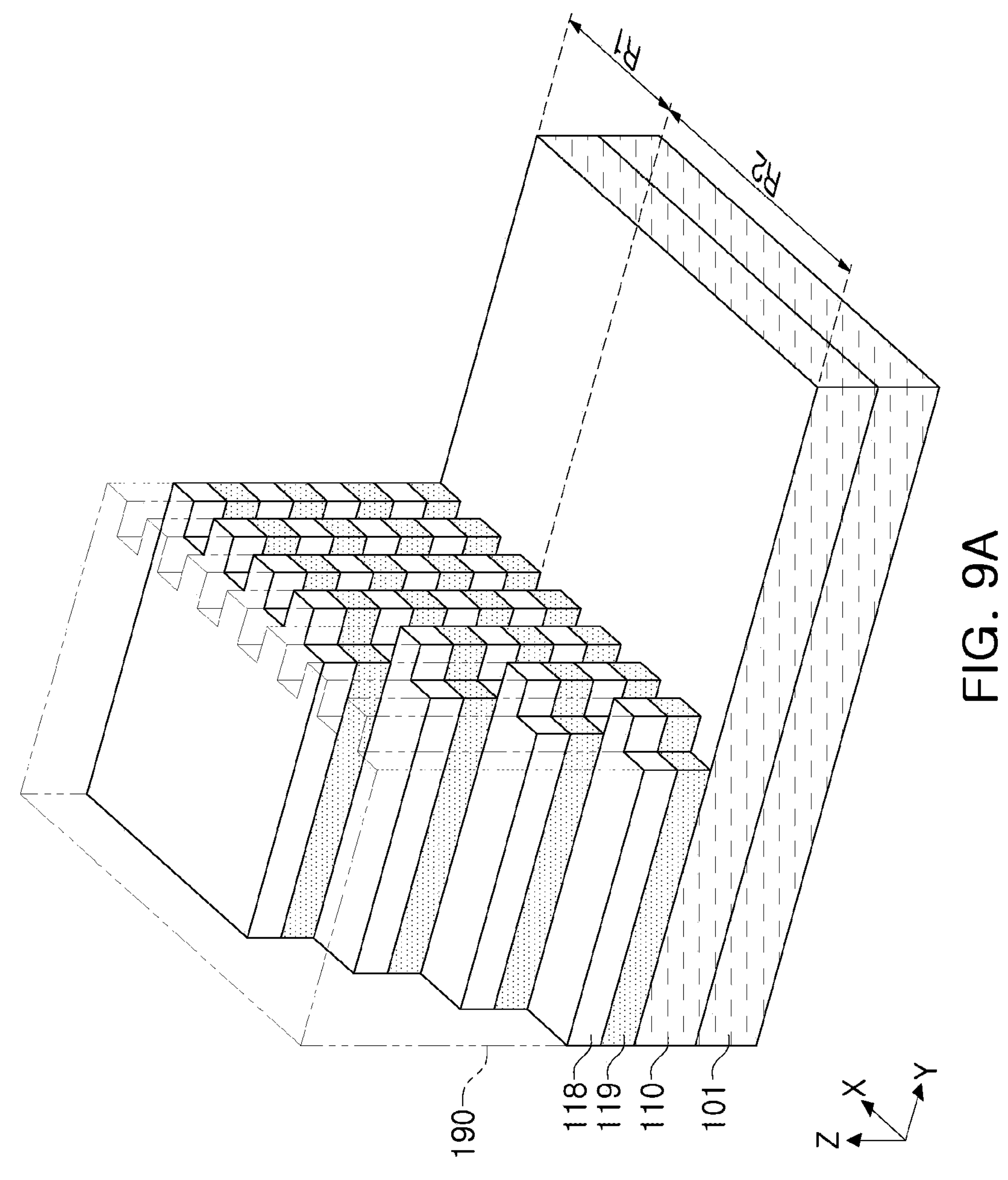
Figure 9B:
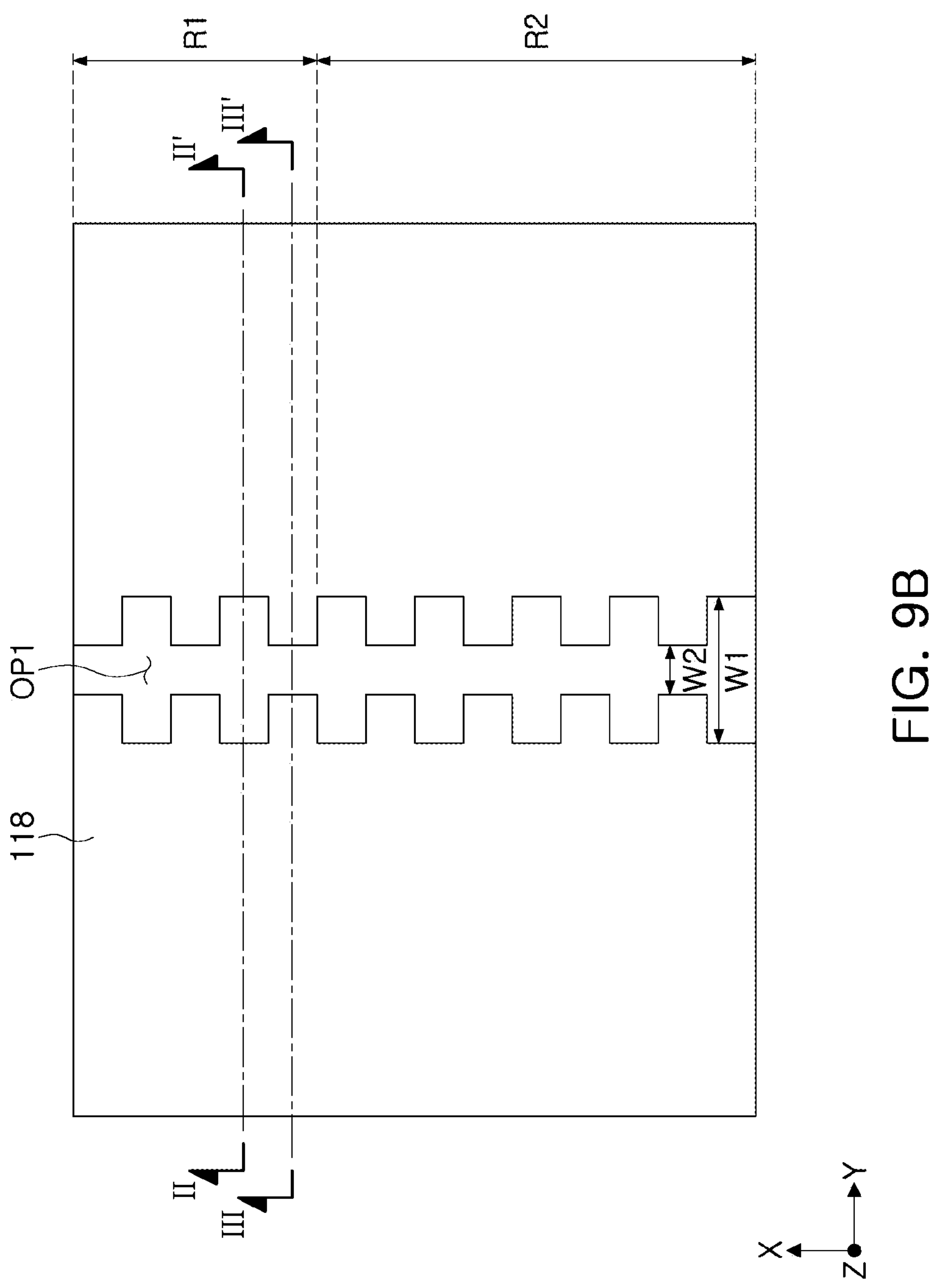
Figure 9C:
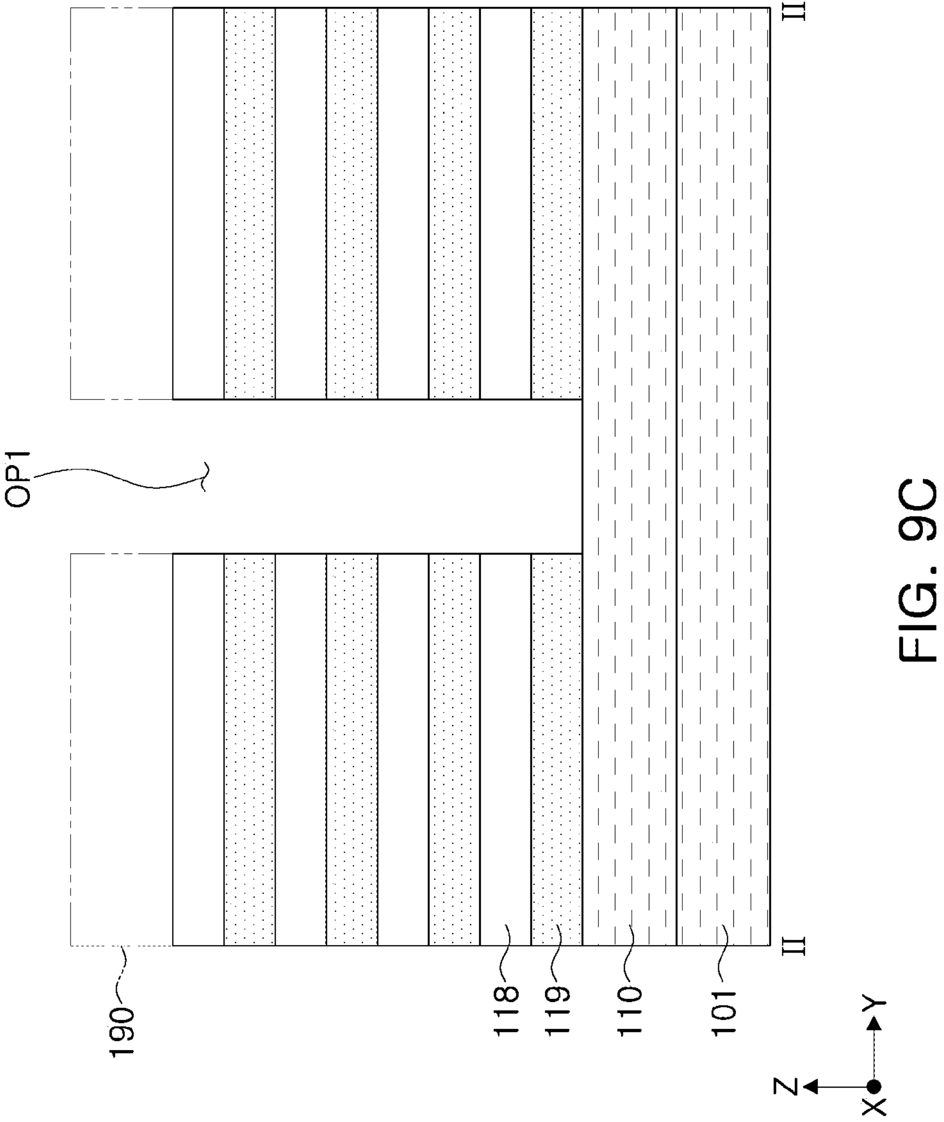
Figure 9D:
Figure 10A:
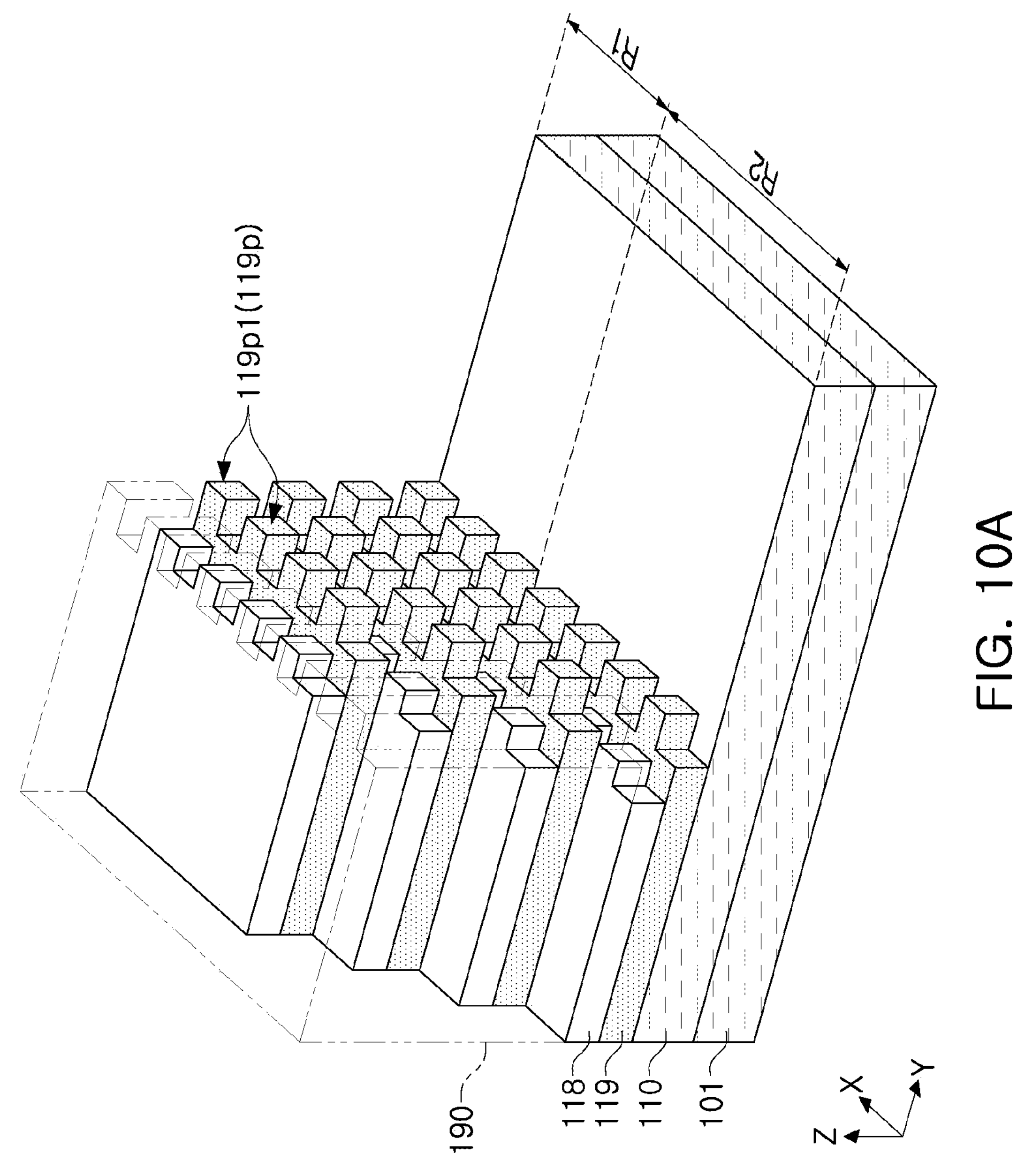
Figure 10B:
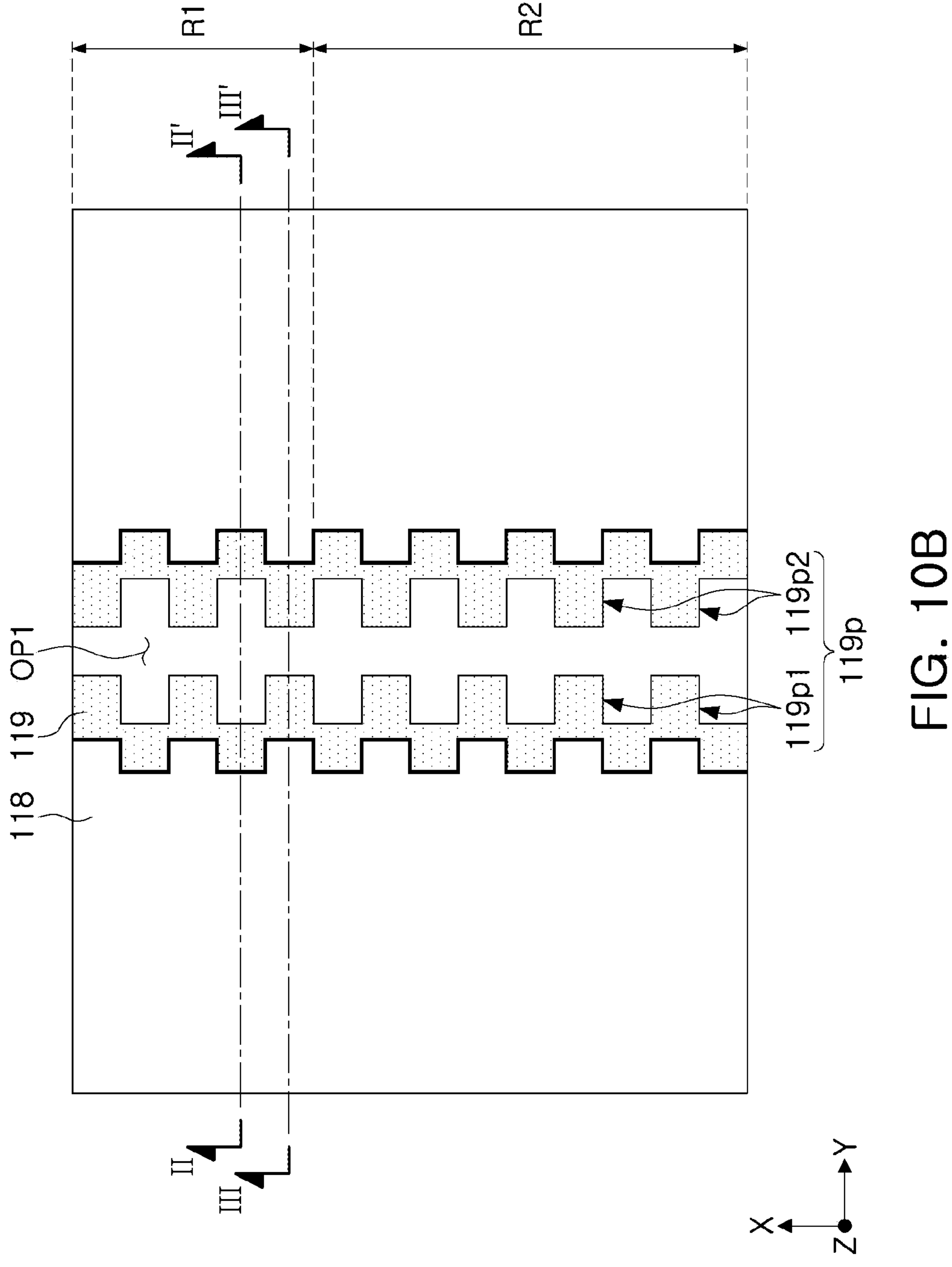
Figure 10C:
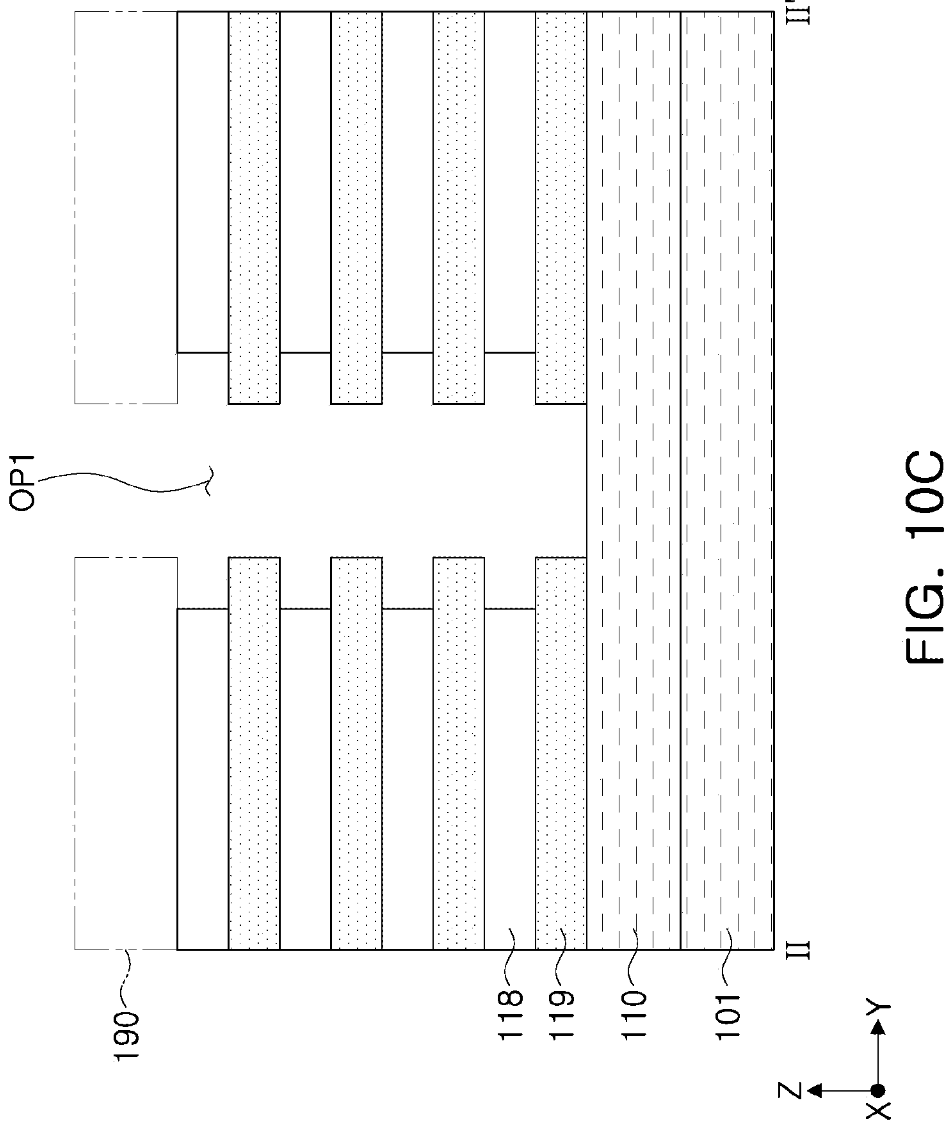
Figure 10D:
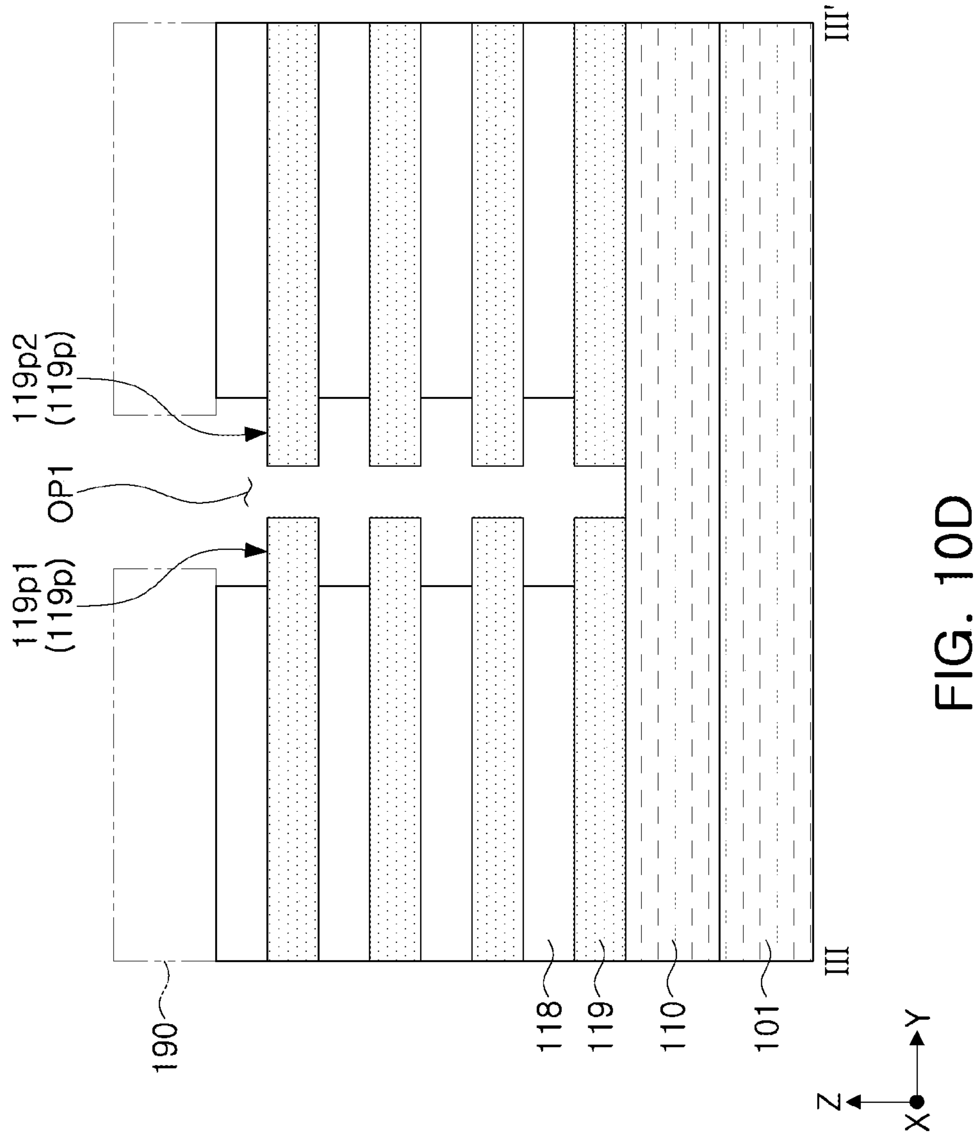
Figure 11A:
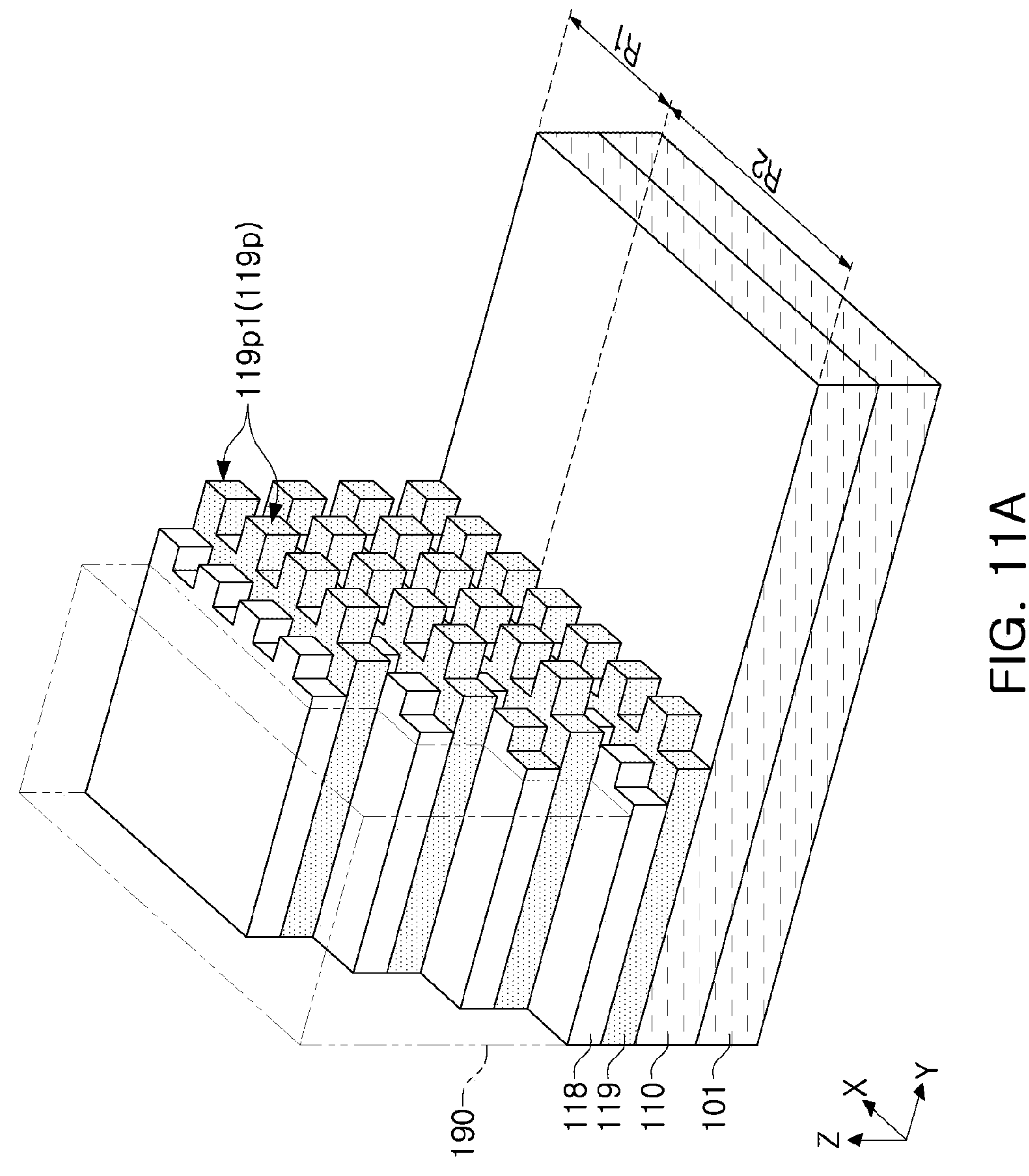
Figure 11B:
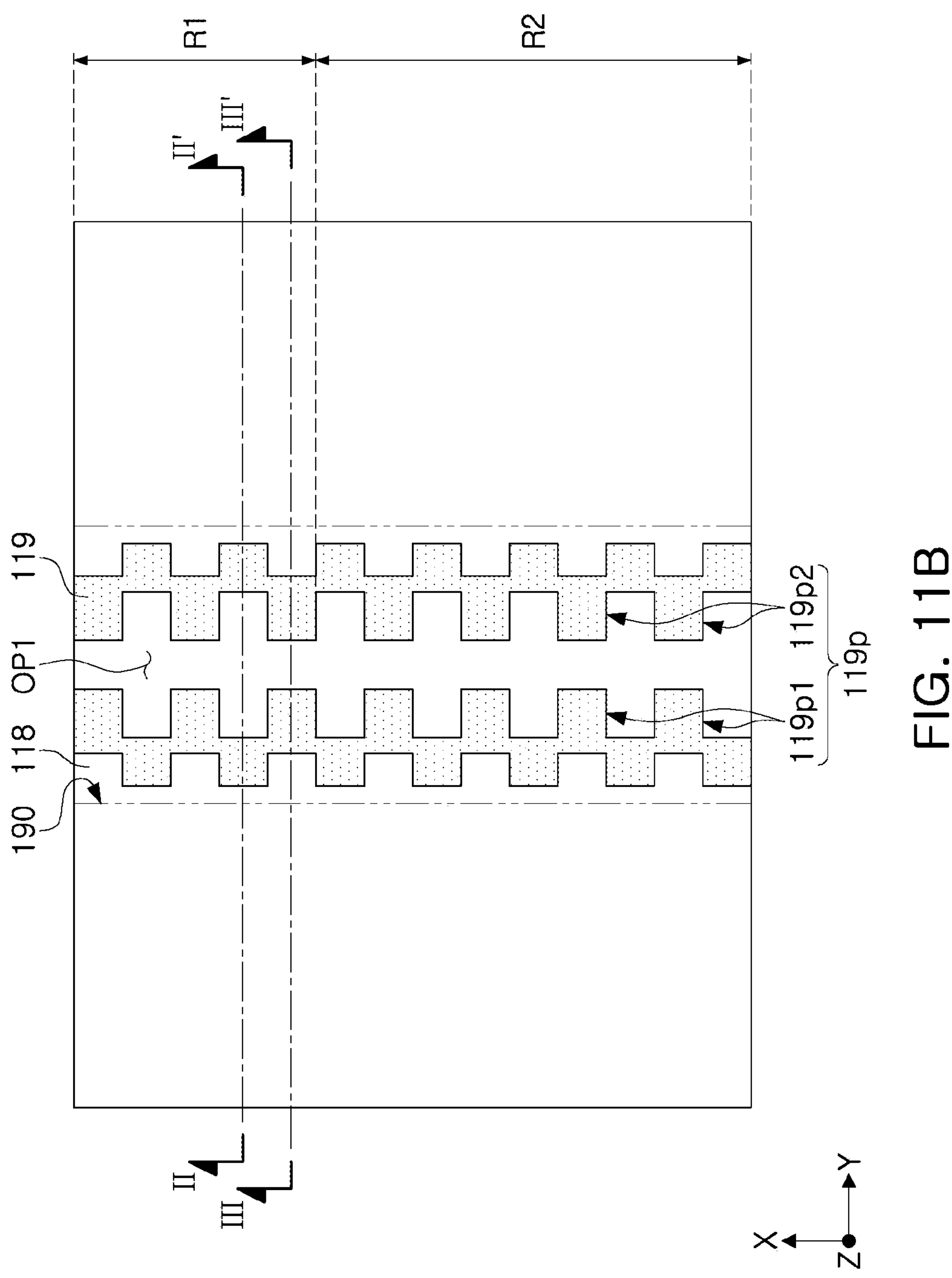
Figure 11C:
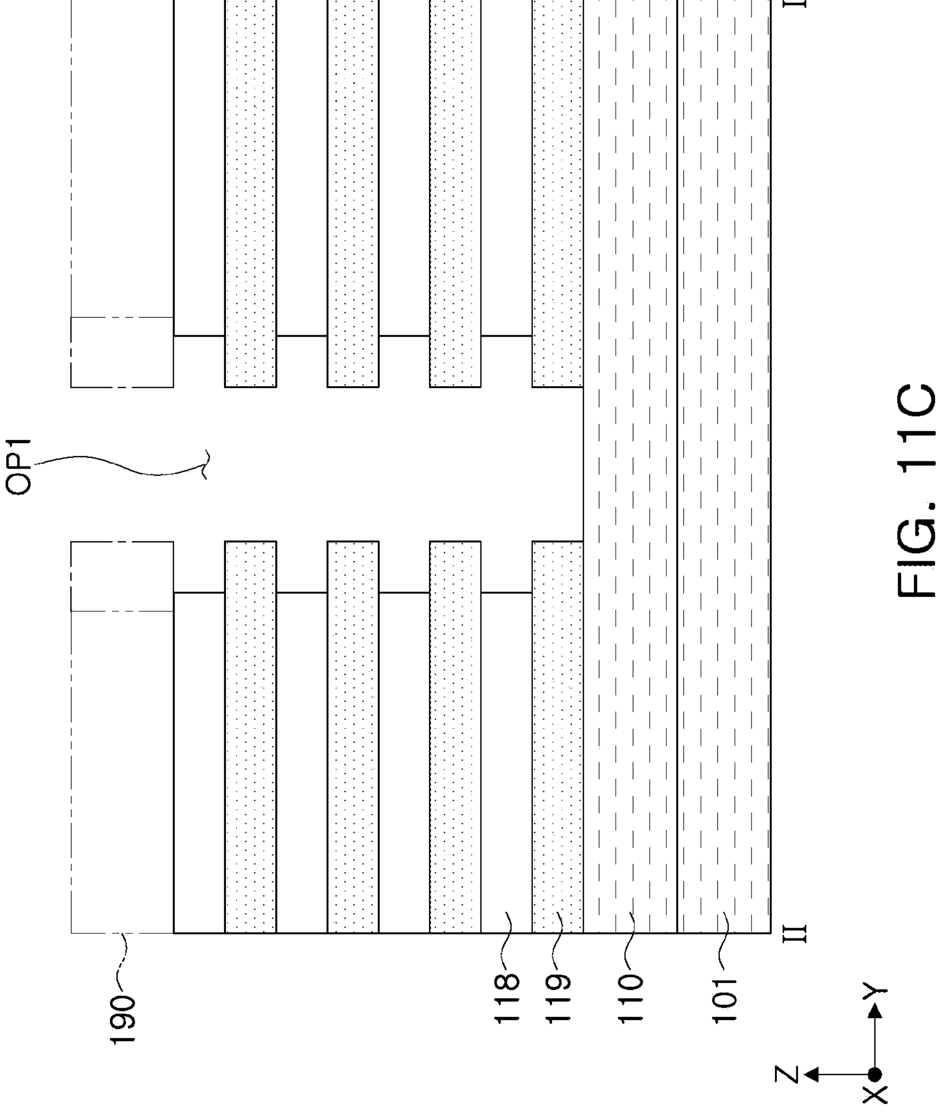
Figure 11D:
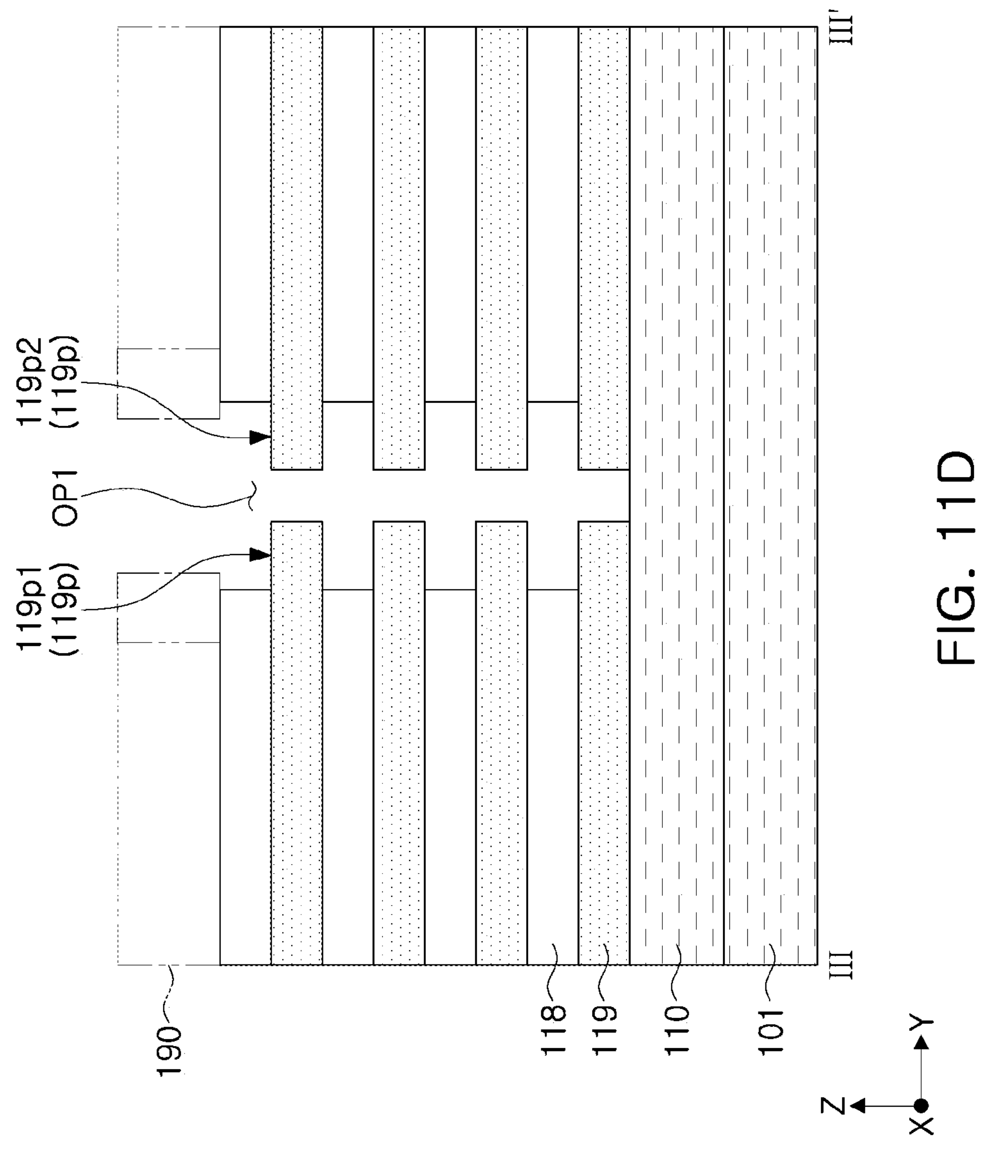

Referring to FIG. 8, a lower structure 110 may be formed on a substrate 101, sacrificial layers 118 and semiconductor layers 119 may be alternately stacked in the Z-direction, and a trim process may be performed, thereby forming a stack structure.

The sacrificial layers 118 may be formed of a material different from that of the semiconductor layers 119. For example, the semiconductor layers 119 may be formed of silicon, and the sacrificial layers 118 may be formed of silicon-germanium, silicon oxide, silicon nitride, silicon carbide, or silicon oxynitride. The sacrificial layers 118 may be formed to have a greater thickness in the Z-direction than those of the semiconductor layers 119, but some example embodiments thereof are not limited thereto. The sacrificial layers 118 may be replaced with interlayer insulating layers 121 (see FIG. 2B) through a subsequent process. A portion of the semiconductor layers 119 may remain as a source/drain region 150 (see FIG. 2B) and a semiconductor pattern 140 (see FIG. 2B) through a subsequent process, and another portion may be a plurality of horizontal structures 120 (see FIG. 2B) filled with data storage structures 180.

The trim process may include removing a portion of the sacrificial layers 118 and semiconductor layers 119 such that a portion of the upper surface of each of the sacrificial layers 118 may be exposed by repeatedly performing exposure and etching processes using a mask pattern. Accordingly, the stack structure having a staircase structure may be formed. In the stack structure, the sacrificial layers 118 and the semiconductor layers 119 may be alternately stacked on the first region R1 of the substrate 101 without being removed, and a portion of the sacrificial layers 118 and semiconductor layers 119 may be removed on the second region R2 of the substrate 101 to have the stepped structure.

The stack structure may have four sacrificial layers 118 and four semiconductor layers 119 alternately stacked therein, but the number of the sacrificial layers 118 and the semiconductor layers 119 is not limited thereto and may be varied.

A cell region insulating layer 190 covering the stack structure may be formed on the substrate 101 and a planarization process may be performed.

Referring to FIGS. 9A, 9B, 9C, and 9D, the first opening OP1 may be formed using a mask pattern.

Through an exposure and etching process using a mask pattern, a first opening OP1 penetrating through the stack structure and exposing the lower structure 110 may be formed. The first opening OP1 may have a trench shape extending in one direction (e.g., the X-direction) to alternately have a portion having a first width W1 and a portion having a second width W2 different from the first width W1 on the first and second regions R1 and R2. The first width W1 may be greater than the second width W2.

The lengths in the Y-direction of the semiconductor pattern 140 (see FIG. 2A) and the second source/drain region 152 (see FIG. 2A) formed through a subsequent process may be determined by the difference between the first width W1 and the second width W2. A length in the Y-direction of the semiconductor material layer 131 formed through a subsequent process may be determined by a difference between the first width W1 and the second width W2.

In some example embodiments, the first opening OP1 may be formed in the same pattern in the first region R1 and the second region R2, but by configuring the shape on the second region R2 to be different, the landing pattern LP (see FIG. 2A) formed through a subsequent process may be modified to various shapes in FIGS. 4A to 6.

Referring to FIGS. 10A, 10B, 10C, and 10D, protrusions 119*p* of each of the semiconductor layers 119 may be formed by performing an etching process for selectively removing the sacrificial layers 118.

By selectively removing the sacrificial layers 118 exposed through the first opening OP1 with respect to the semiconductor layers 119, protrusions 119*p* having at least four exposed surfaces may be formed.

In some example embodiments, the protrusions 119*p* on the first region R1 may be formed as a semiconductor pattern 140 (see FIG. 2A) and a second source/drain region 152 (see FIG. 2A) through a subsequent process. The protrusions 119*p* on the second region R2 may be formed as the semiconductor material layer 131 through a subsequent process.

In each of the semiconductor layers 119, the protrusions 119*p* may include first protrusions 119*p*1 spaced apart from each other in the X-direction, and second protrusions 119*p*2 spaced apart from the first protrusion 119*p*1 and spaced apart from each other in the X-direction.

The etching process may be, for example, a wet etching process for removing only silicon-germanium from silicon. By the etching process, a portion of the upper surfaces of the semiconductor layers 119 may be exposed together with the protrusions 119*p*. The length in the Y-direction of the first source/drain region 151 (see FIG. 2A) formed through a subsequent process may be determined by the depth of the sacrificial layers 118 removed in the etching process.

Referring to FIGS. 11A, 11B, 11C, and 11D, a portion of the cell region insulating layer 190 may be removed.

A portion of the cell region insulating layer 190 may be removed using a mask pattern having a shape the same as or similar to the first opening OP1. Accordingly, a portion of the protrusions 119*p* and/or the uppermost sacrificial layer 118 may be exposed. In this process, as a portion of the cell region insulating layer 190 is removed, it may be easier to form and remove a metal material layer formed through a subsequent process. However, in some example embodiments, this process may not be performed.

Referring to FIGS. 12A, 12B, 12C, and 12D, a dielectric material layer DL and a metal material layer ML may be formed.

A dielectric material layer DL and a metal material layer ML conformally covering the sacrificial layers 118 and the semiconductor layers 119 exposed through the first opening OP1 may be formed by performing a deposition process and an etching process. Through the deposition process, the dielectric material layer DL and the metal material layer ML may be formed to have uniform or substantially uniform thicknesses. The dielectric material layer DL and the metal material layer ML may cover exposed surfaces of the protrusions 119*p*. In some example embodiments, the dielectric material layer DL may be formed to have a thickness smaller than that of the metal material layer ML, but some example embodiments thereof are not limited thereto. The etching process may be of removing the dielectric material layer DL portion and the metal material layer ML portion disposed on the cell region insulating layer 190 and the lower structure 110. The dielectric material layer DL may include silicon oxide, silicon nitride, or a high-k material. The high-k material may refer to a dielectric material having a higher dielectric constant than that of silicon oxide ($SiO_2$) The high-k material may be, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$), where $0 \leq x \leq 7$ and $0 \leq y \leq 7$. The metal material layer ML may include a conductive material, and the conductive material may include at least one of a doped semiconductor material (e.g. doped silicon or doped germanium), a conductive metal nitride (e.g. titanium nitride, tantalum nitride, or tungsten nitride), a metal (e.g. tungsten, titanium, tantalum, cobalt, aluminum, or ruthenium), or a metal-semiconductor compound (e.g., tungsten silicide, cobalt silicide, or titanium silicide).

Figure 13:
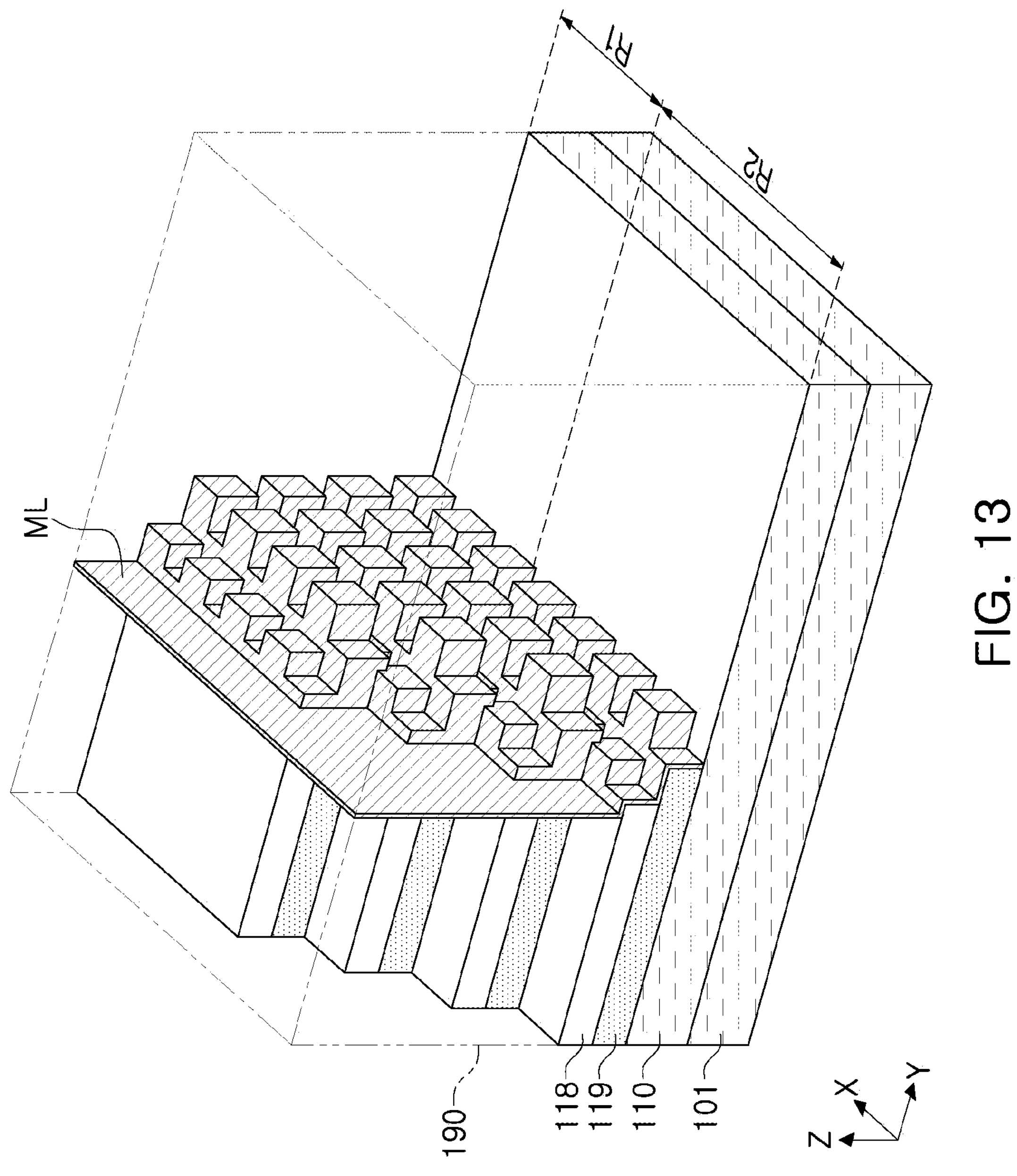
Figure 14A:
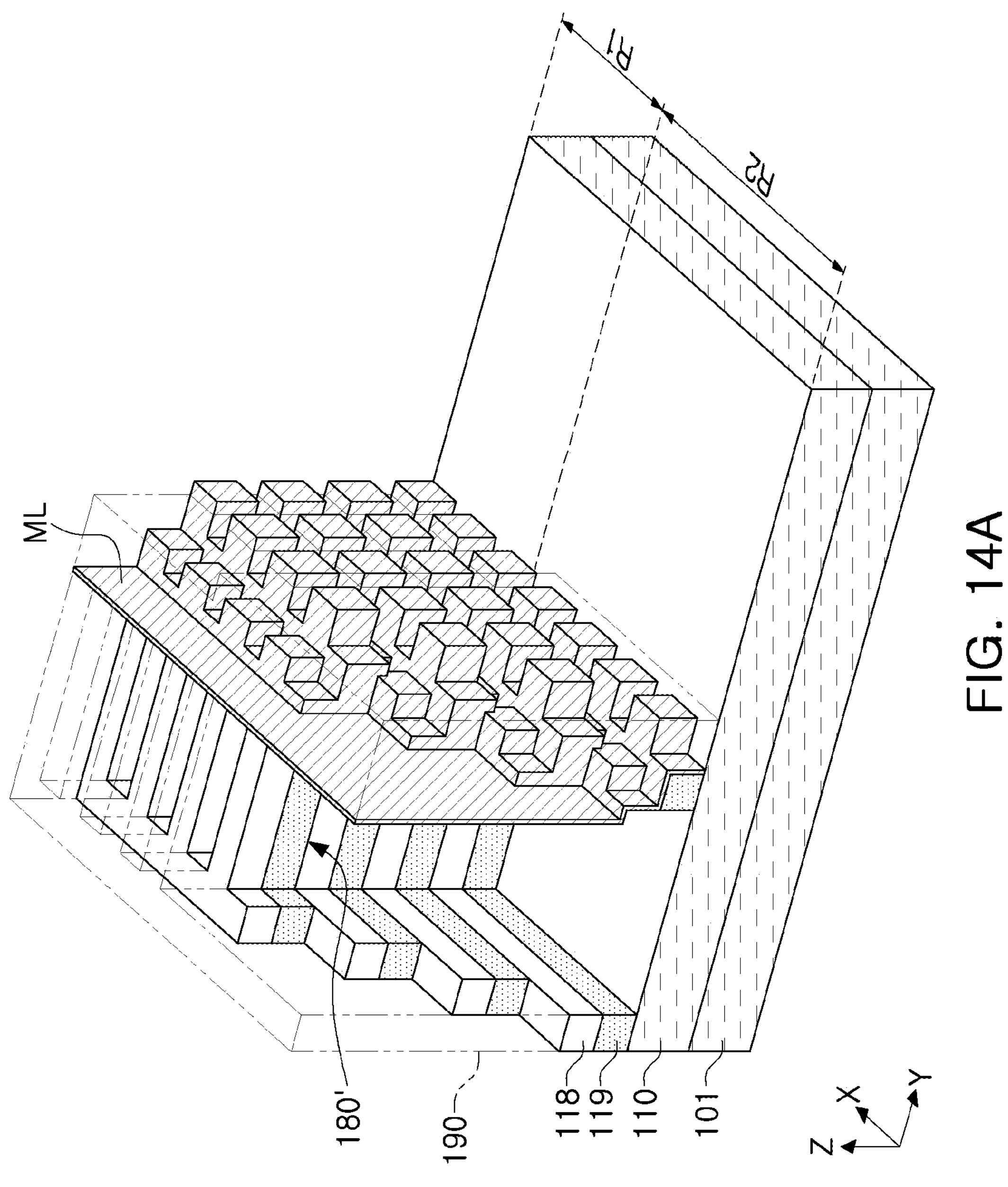
Figure 14B:
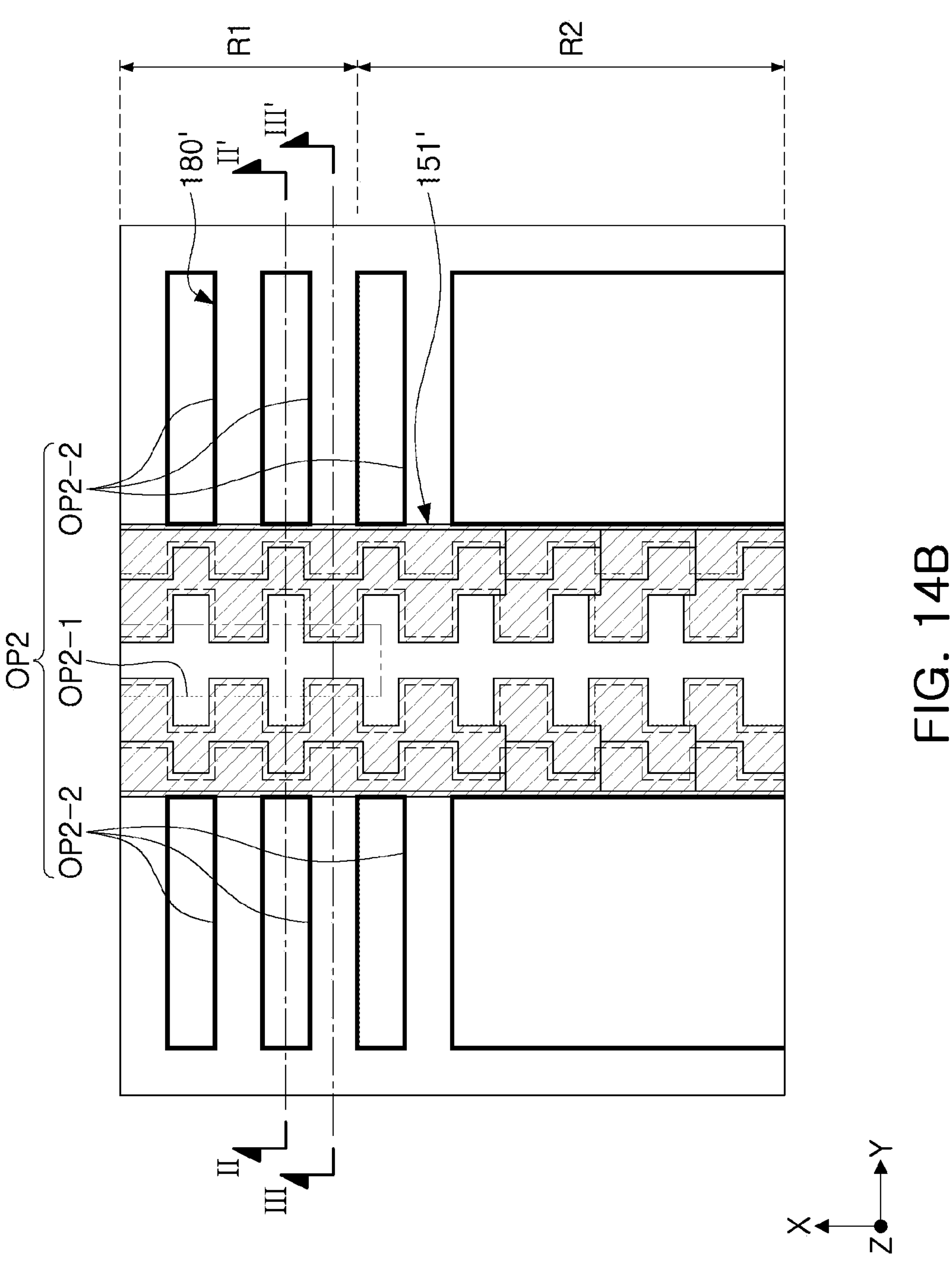
Figure 14C:
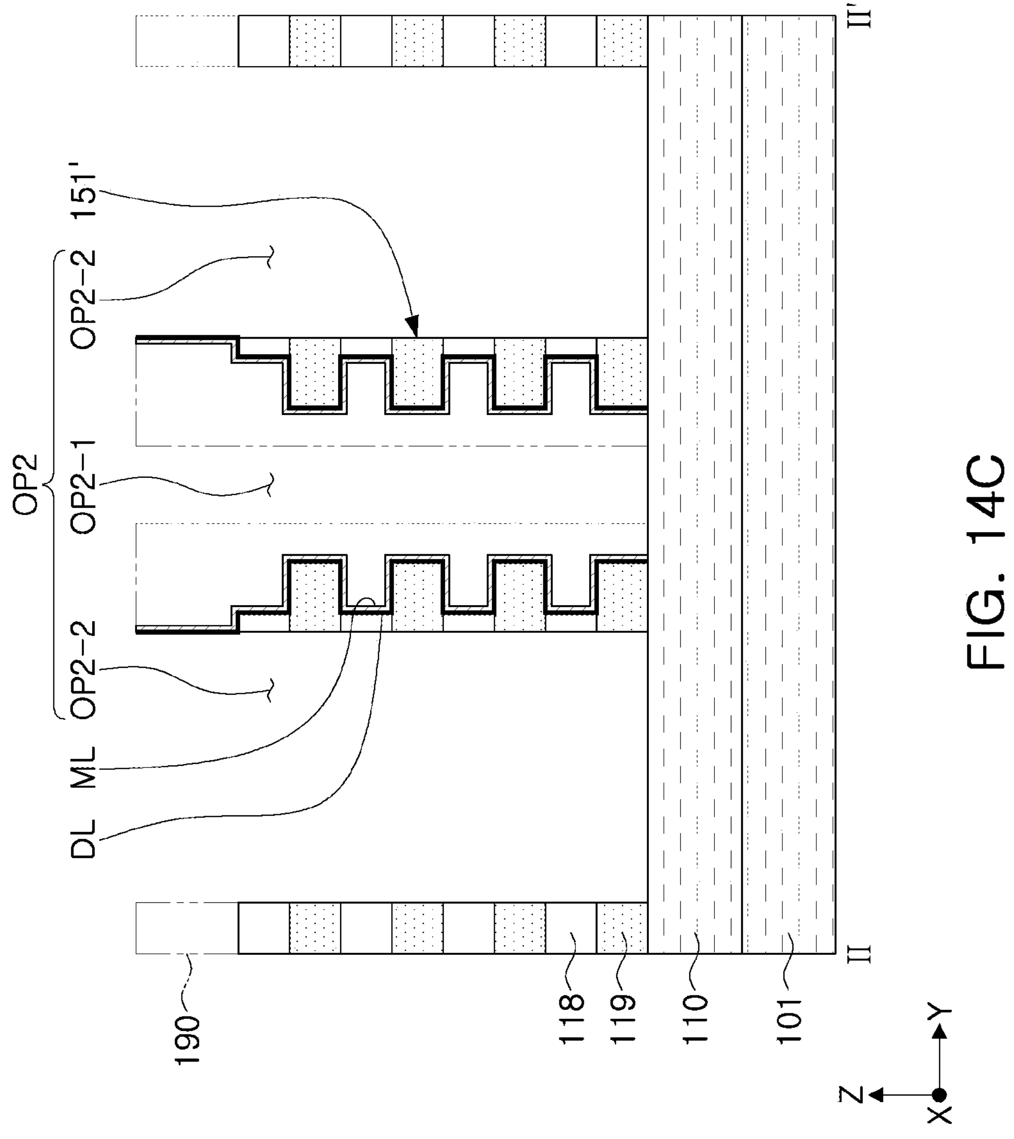
Figure 14D:
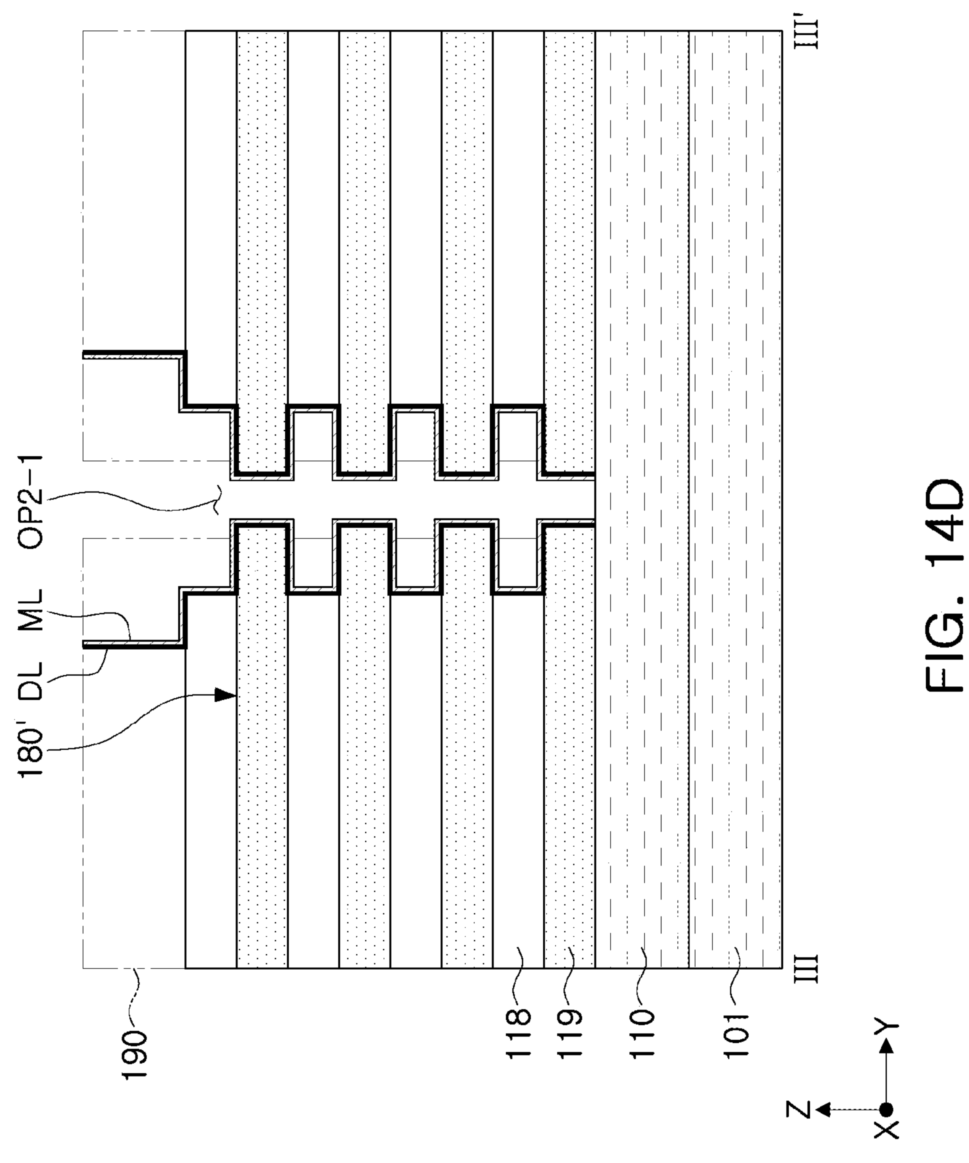
Figure 15A:
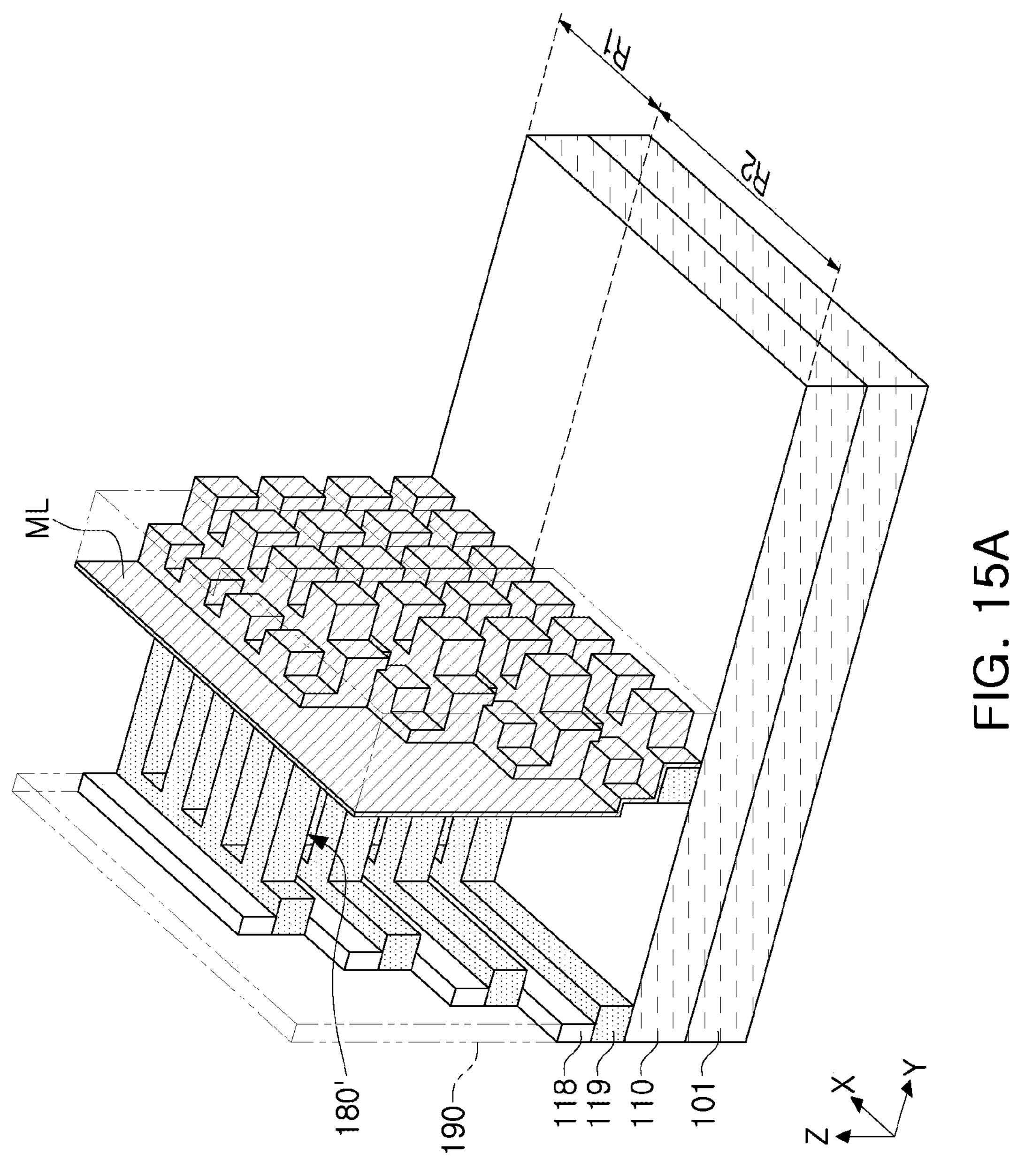
Figure 15B:
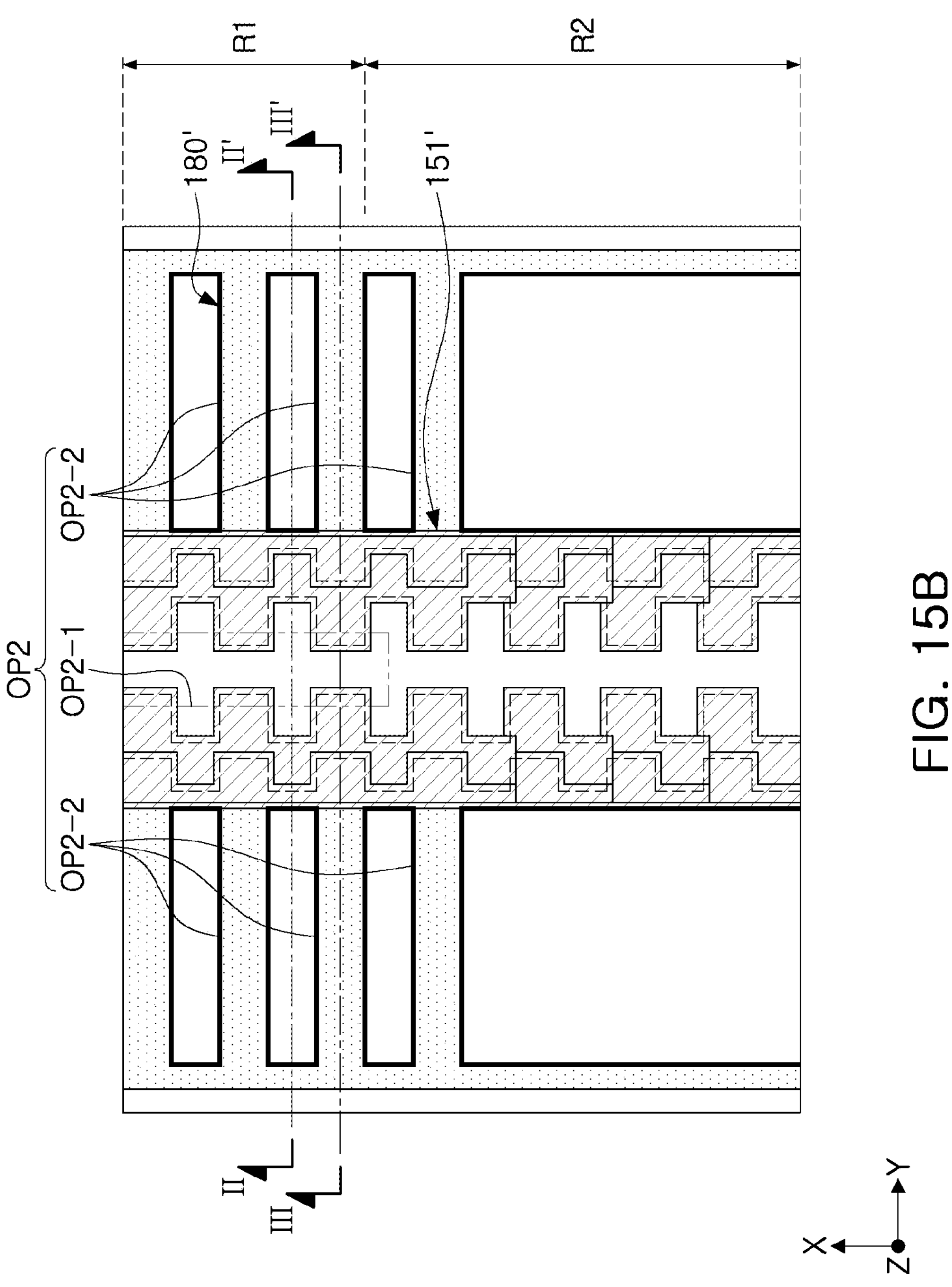
Figure 15C:
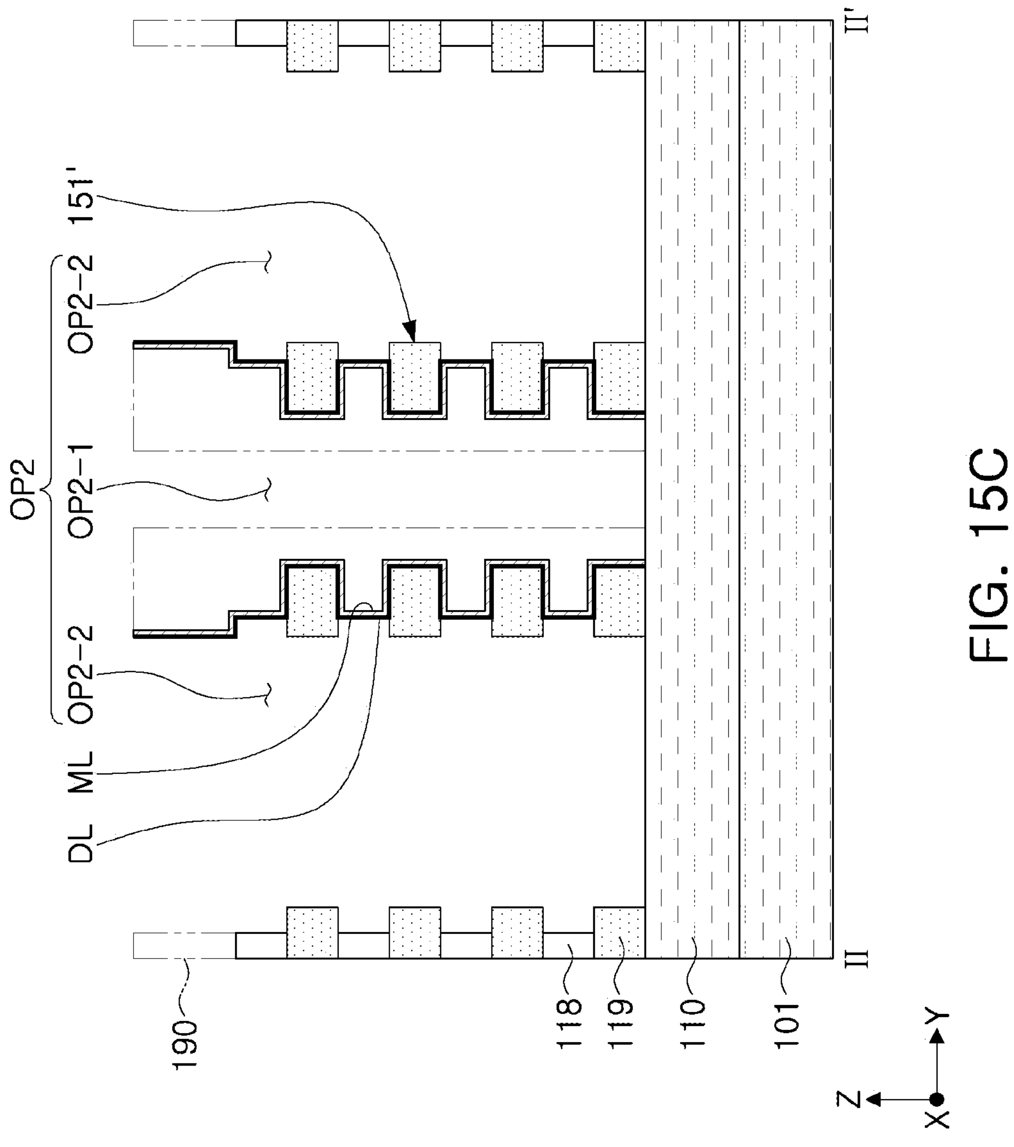
Figure 15D:
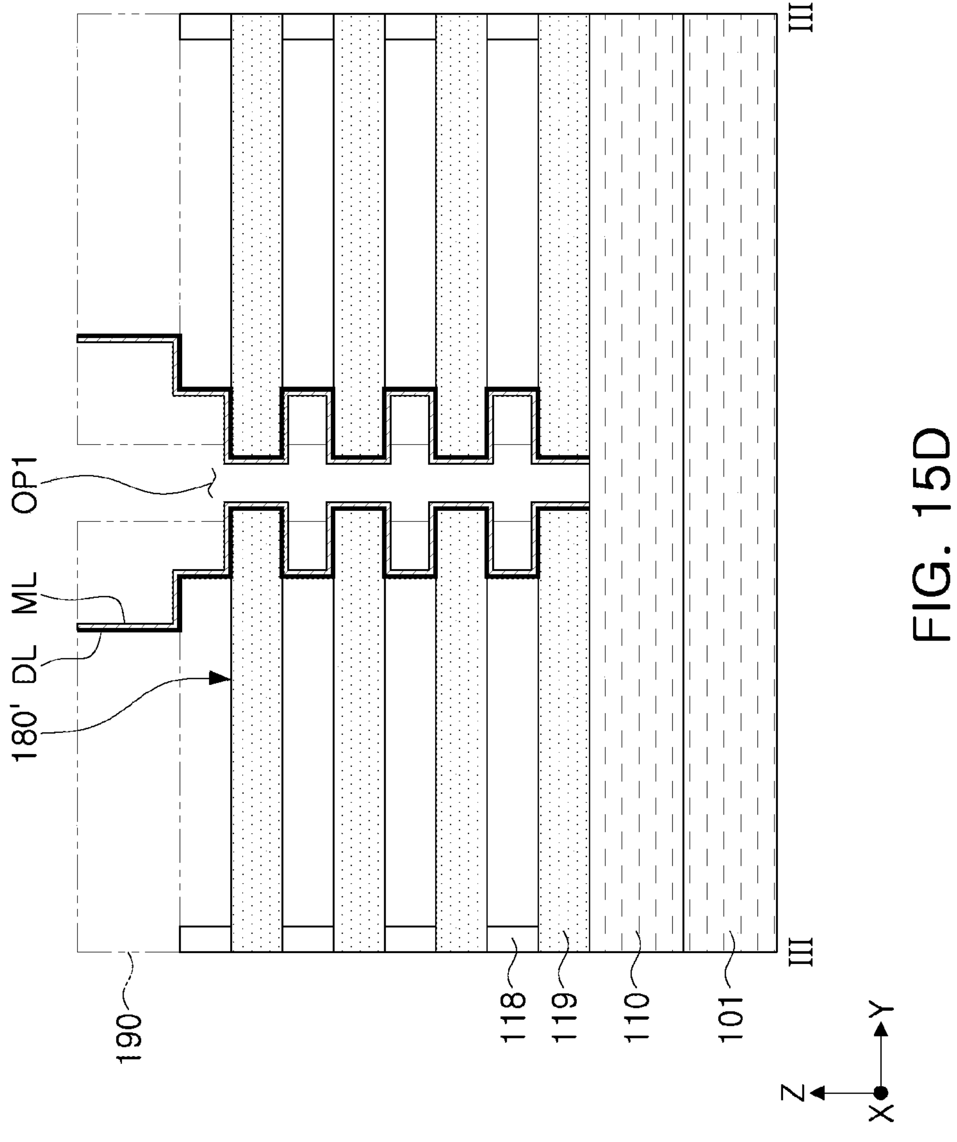
Figure 16A:
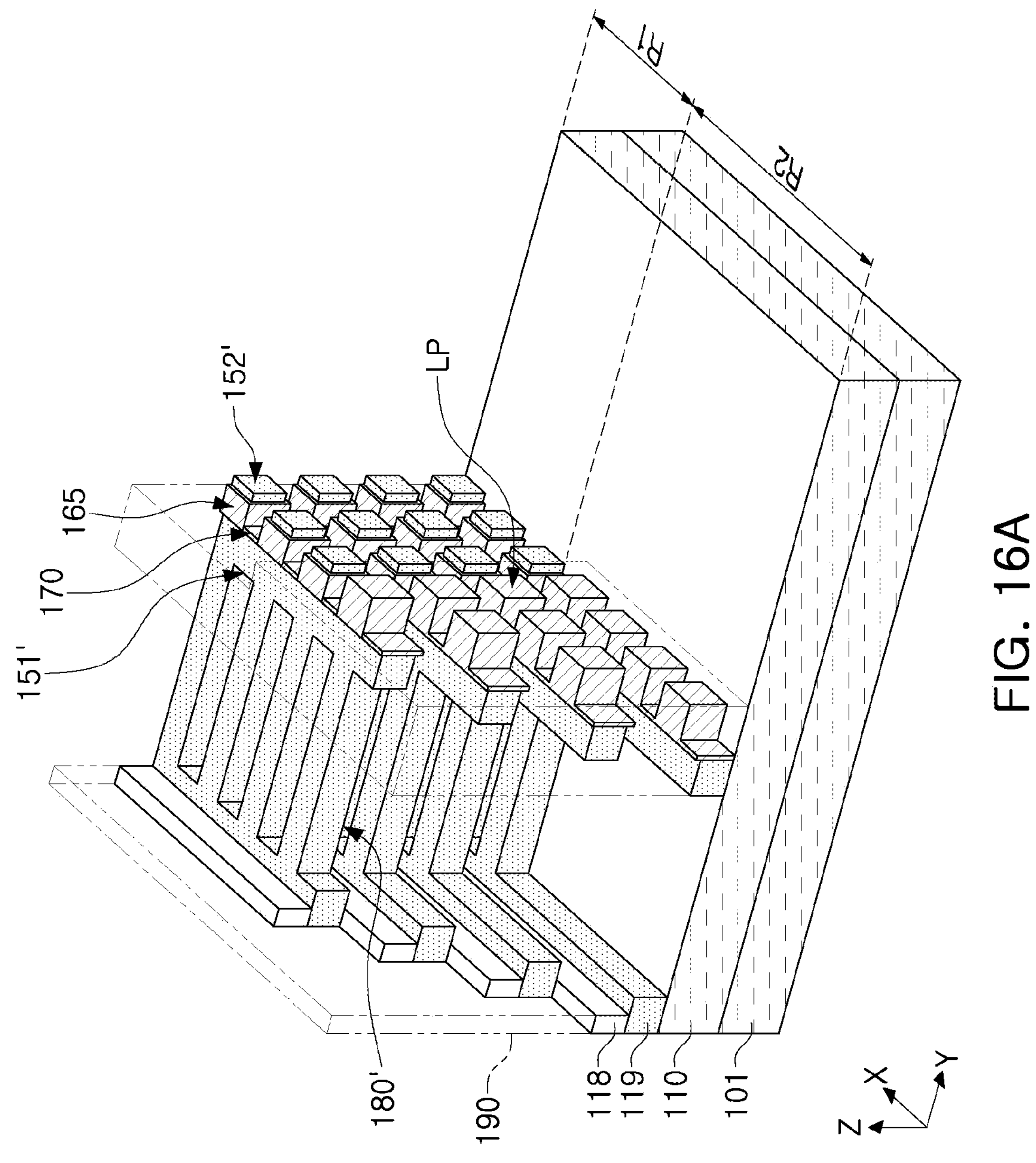
Figure 16B:
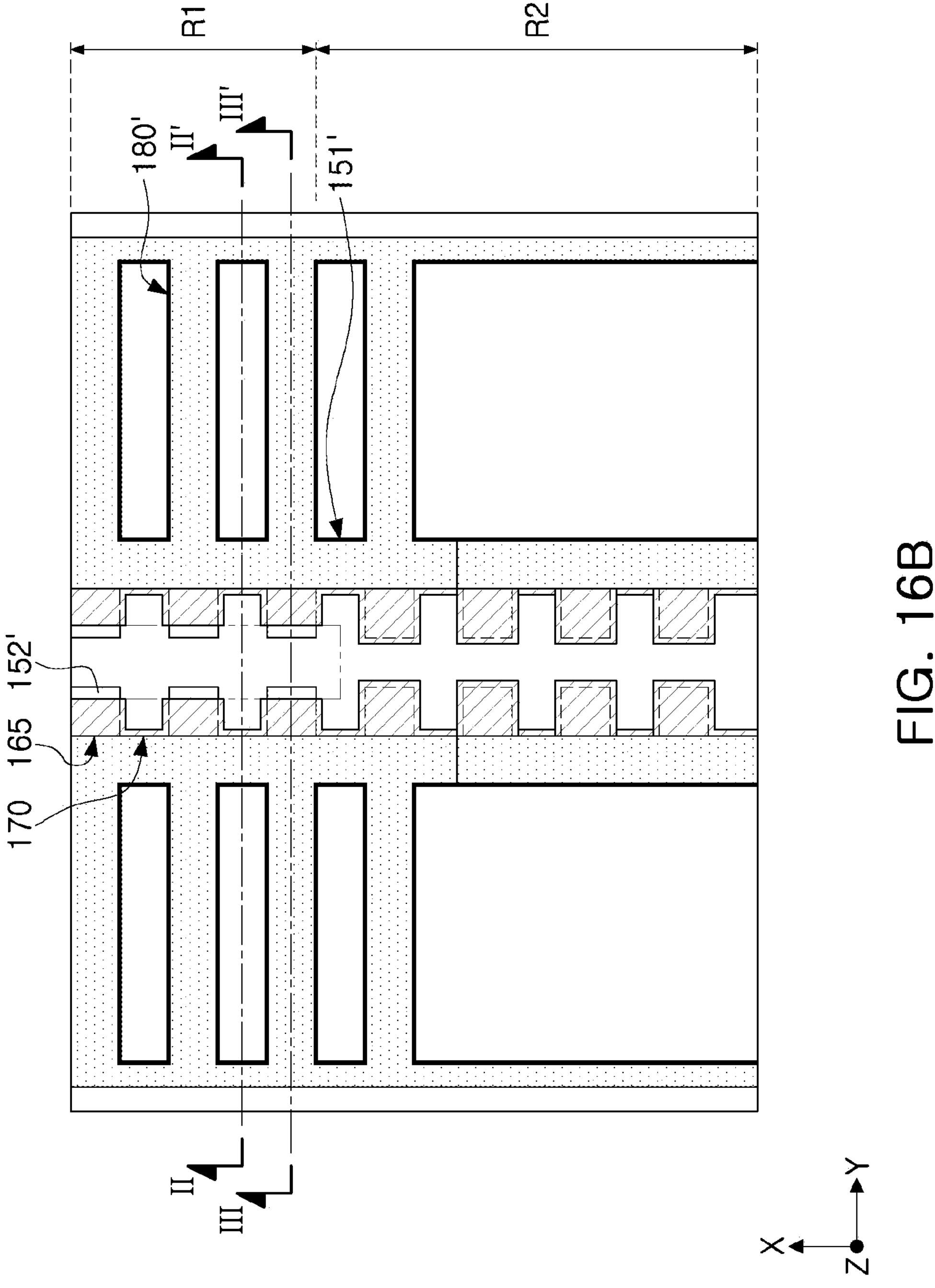
Figure 16C:
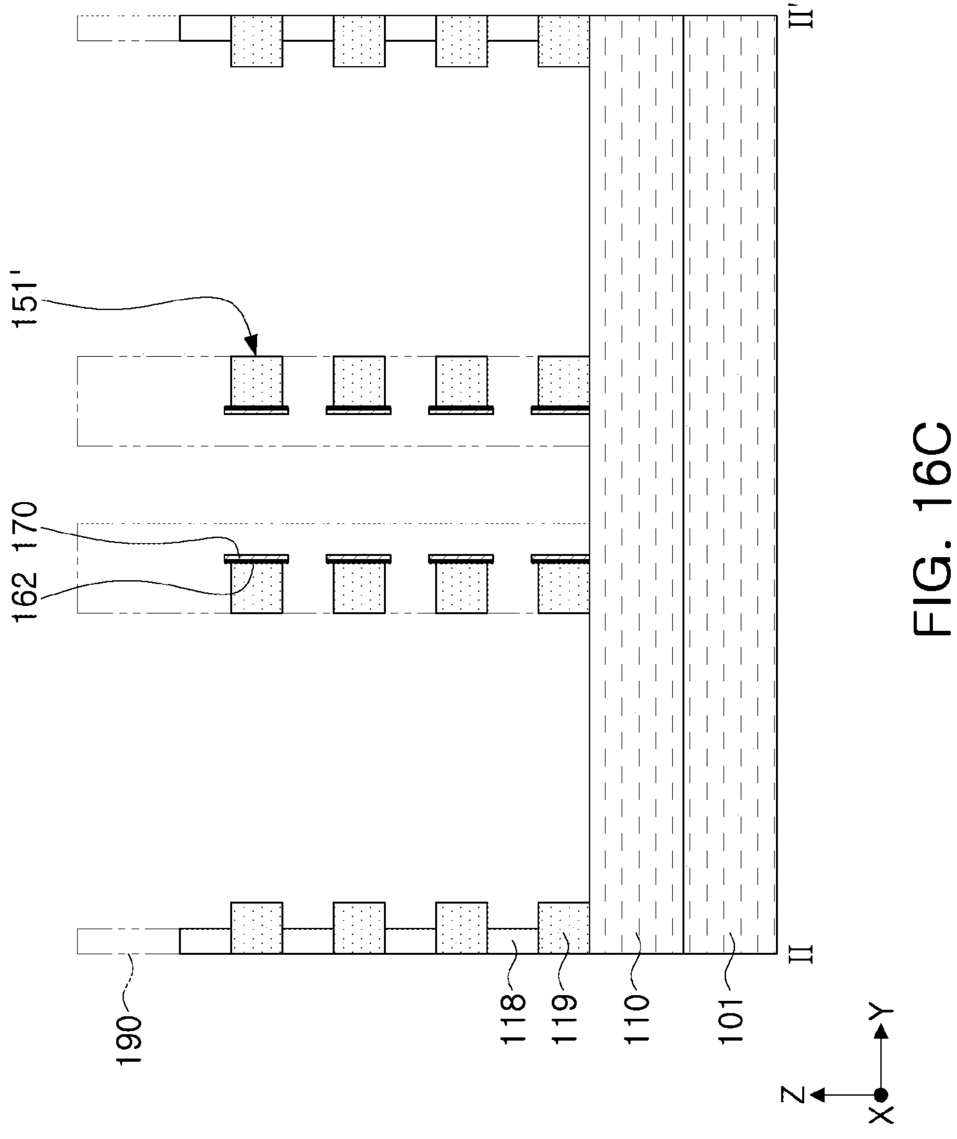
Figure 16D:
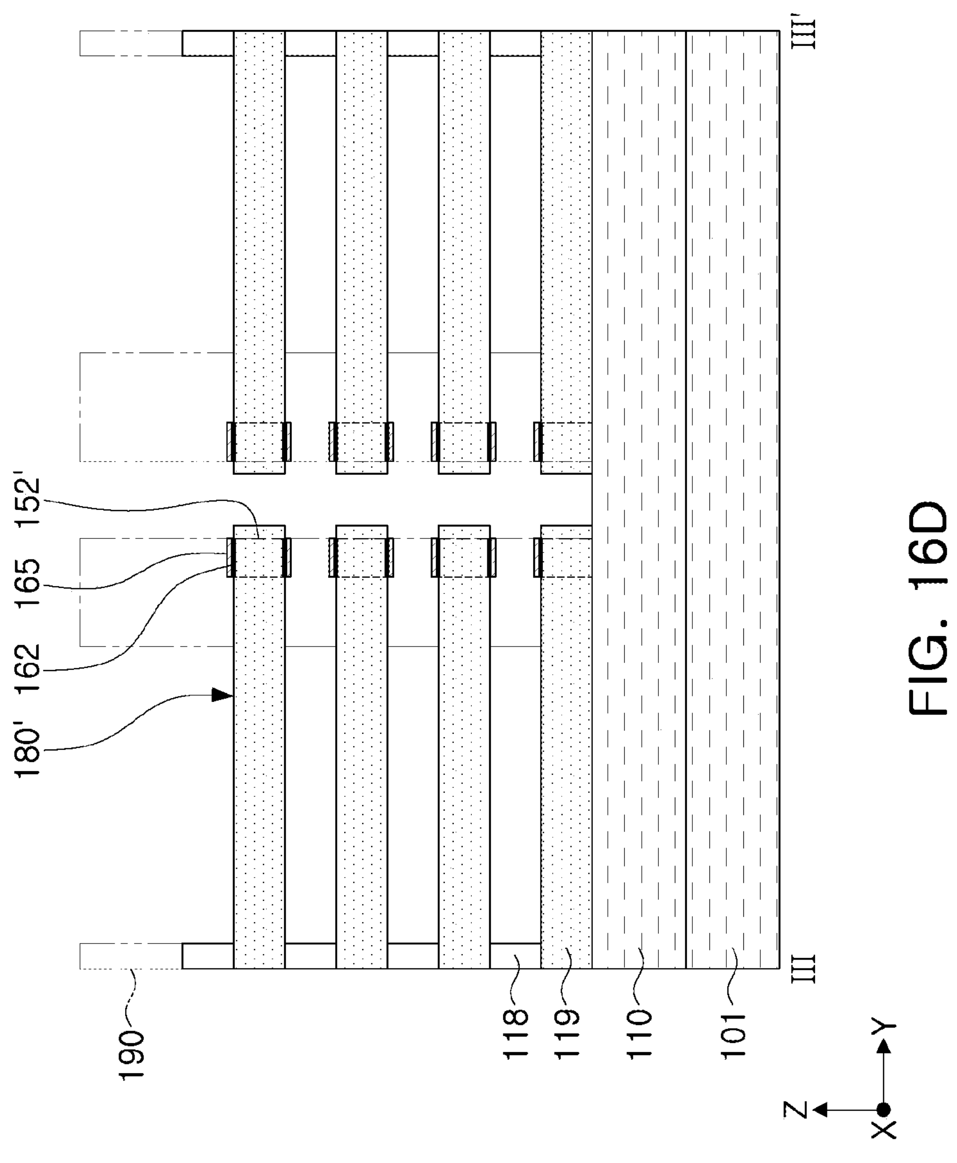
Figure 17A:
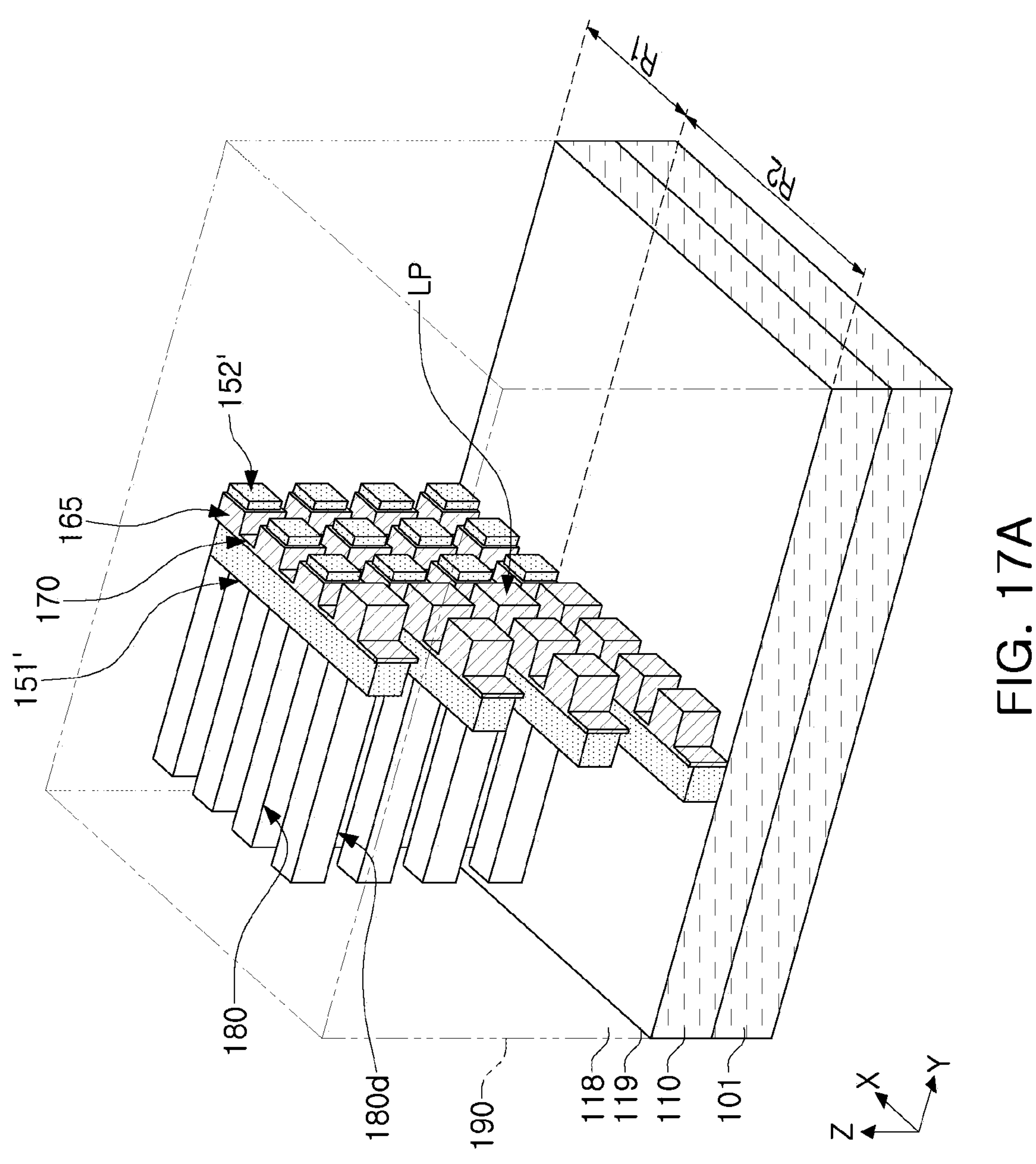
Figure 17B:
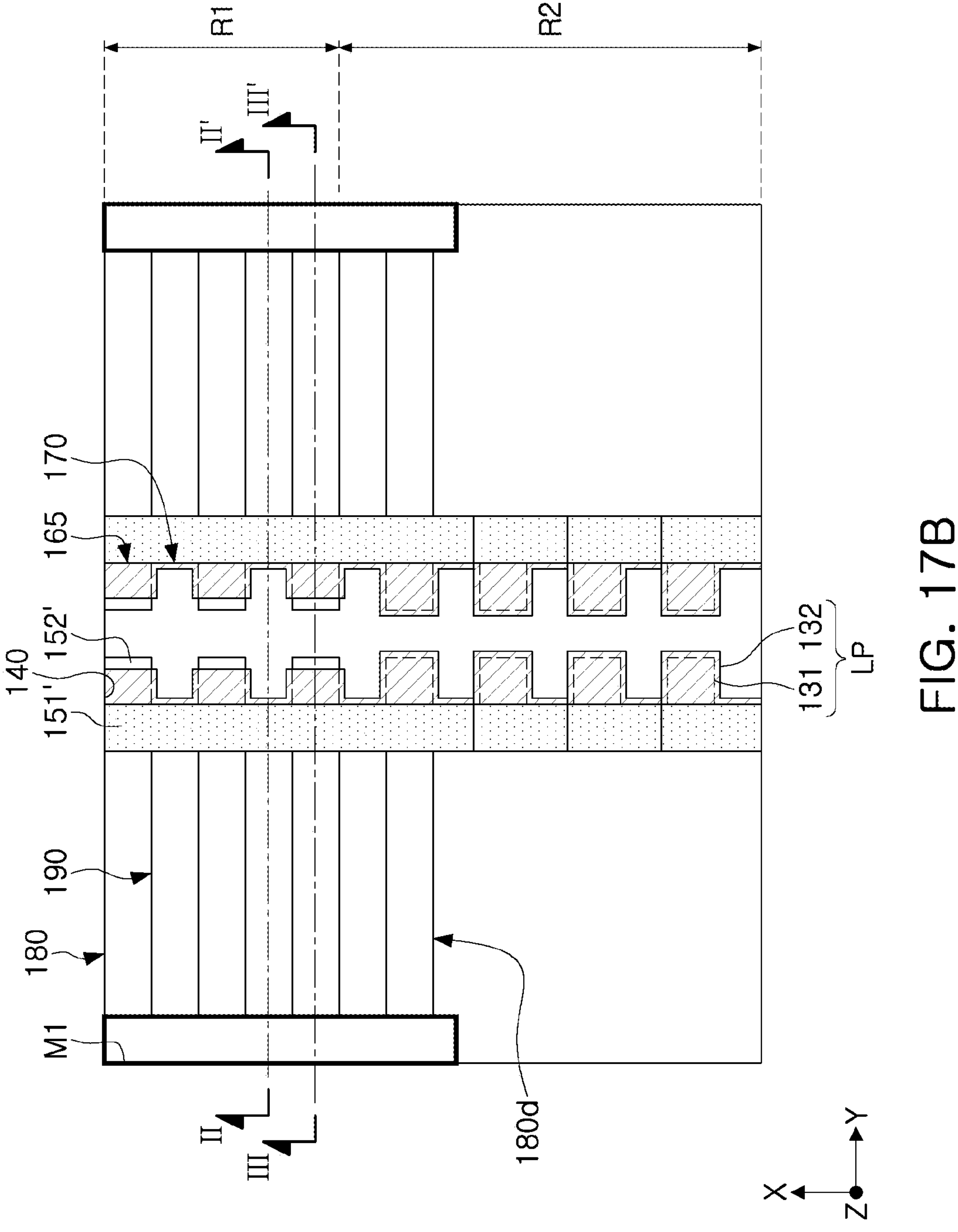
Figure 17C:
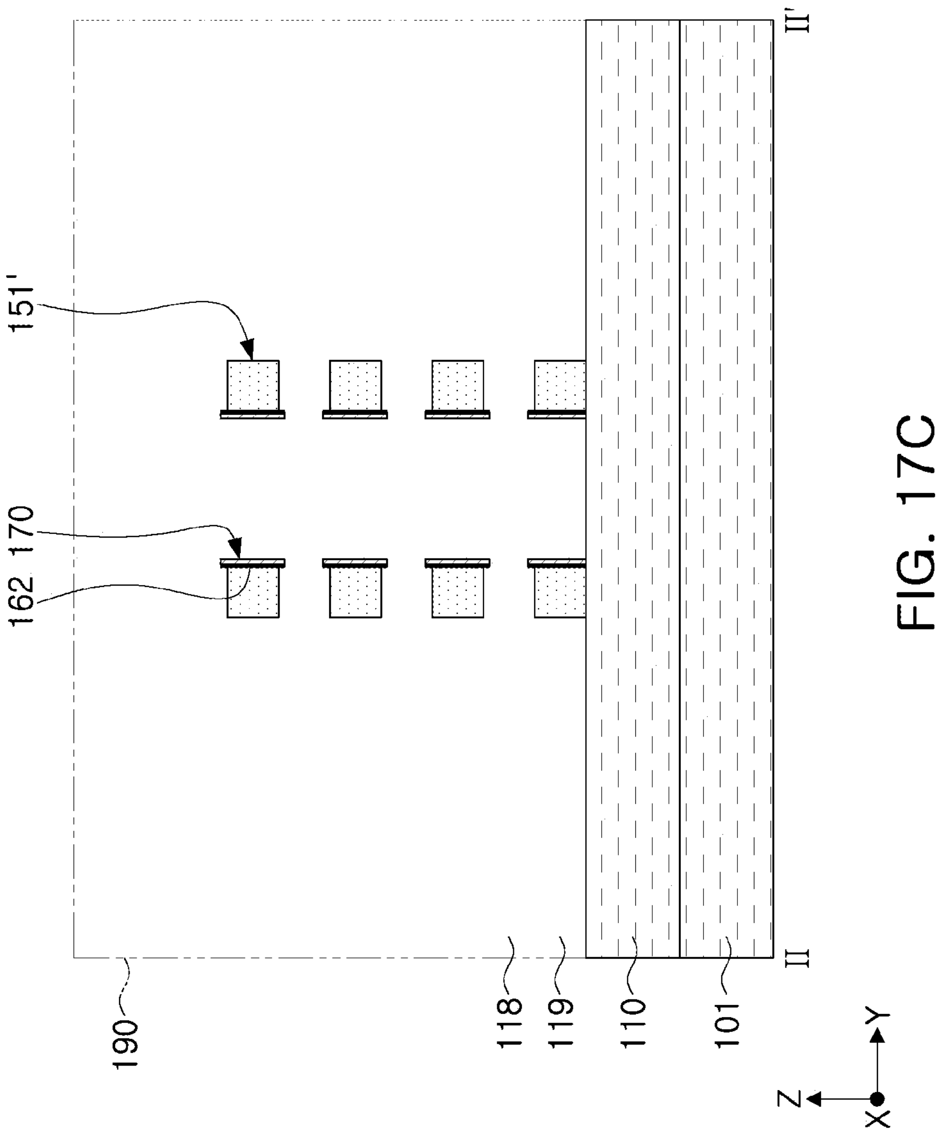
Figure 17D:
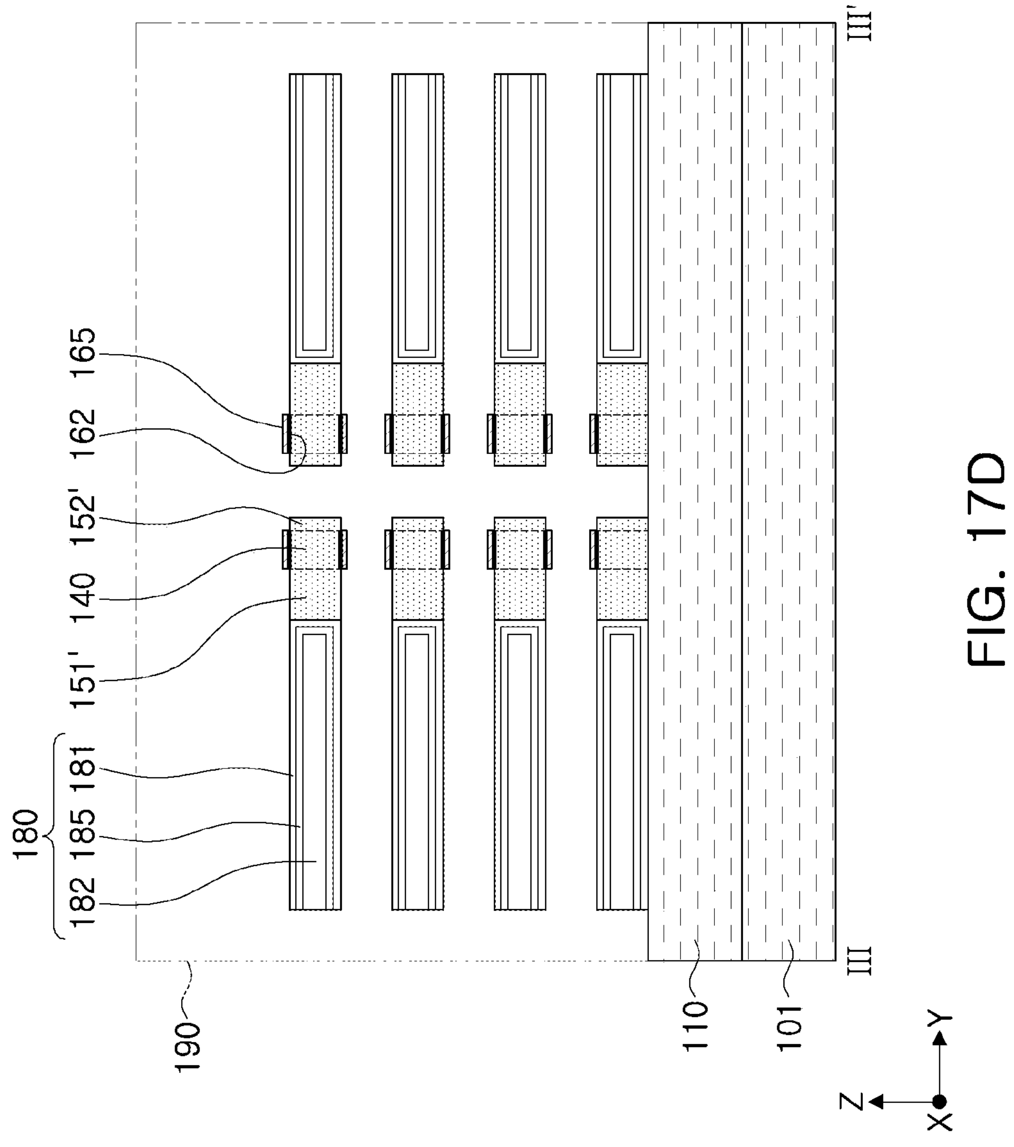
Figure 18A:
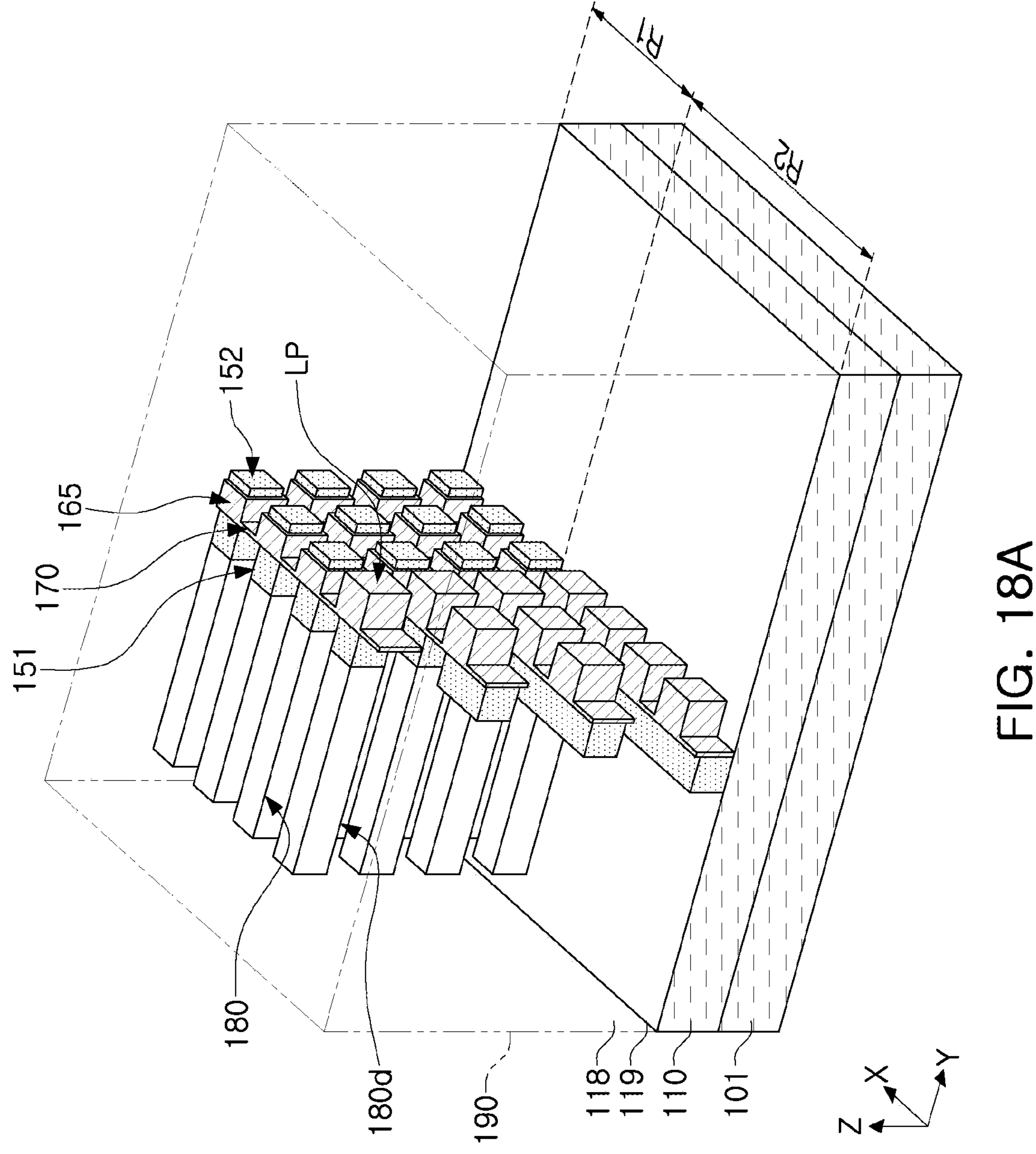
Figure 18B:
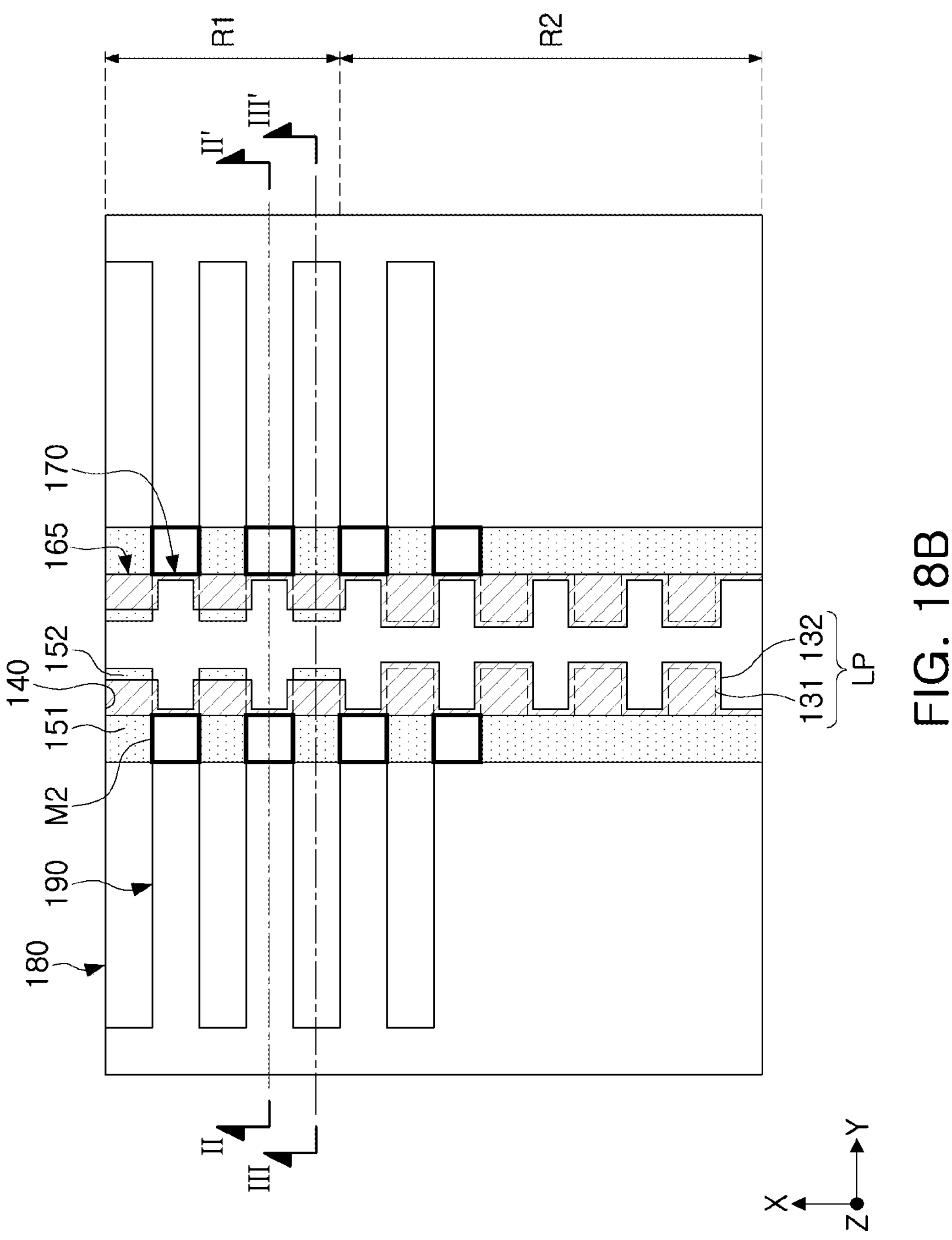
Figure 18C:
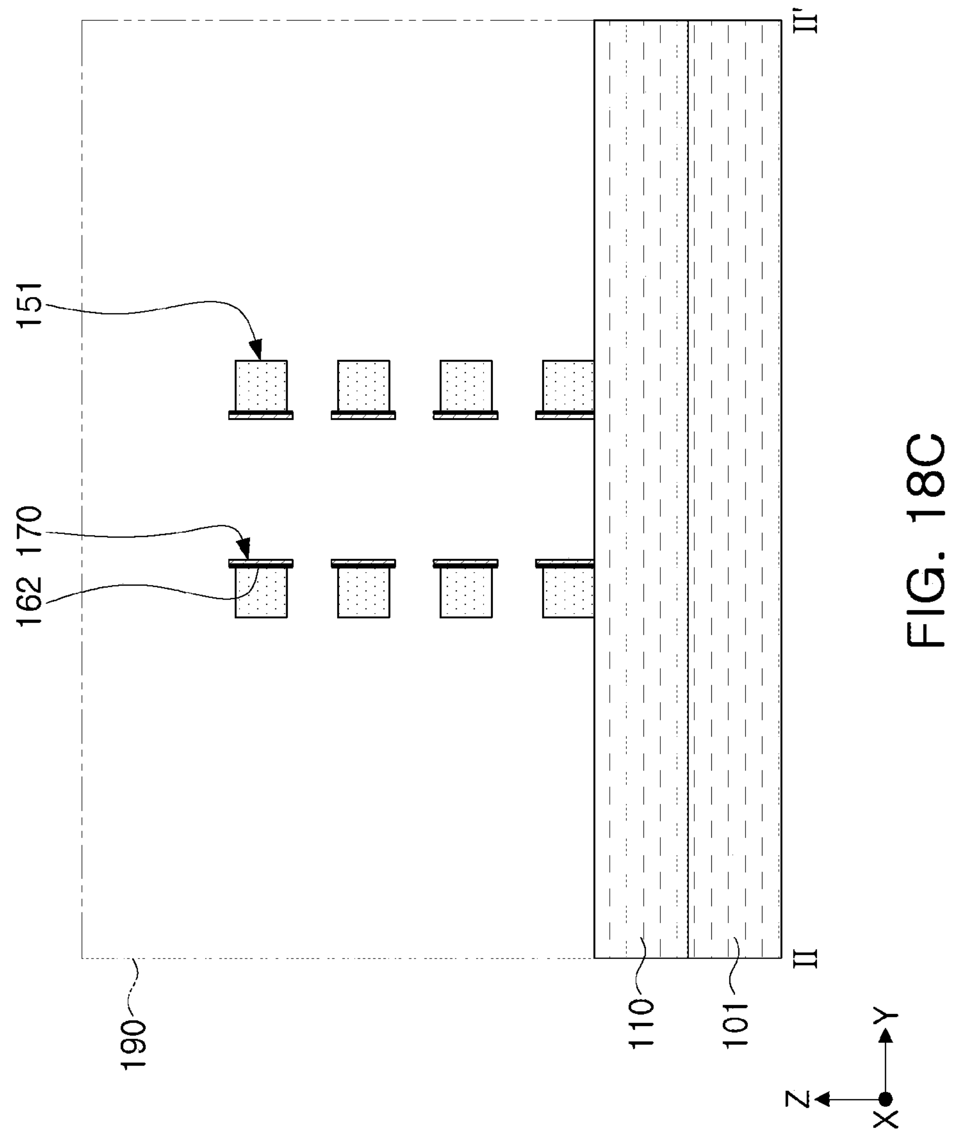
Figure 18D:
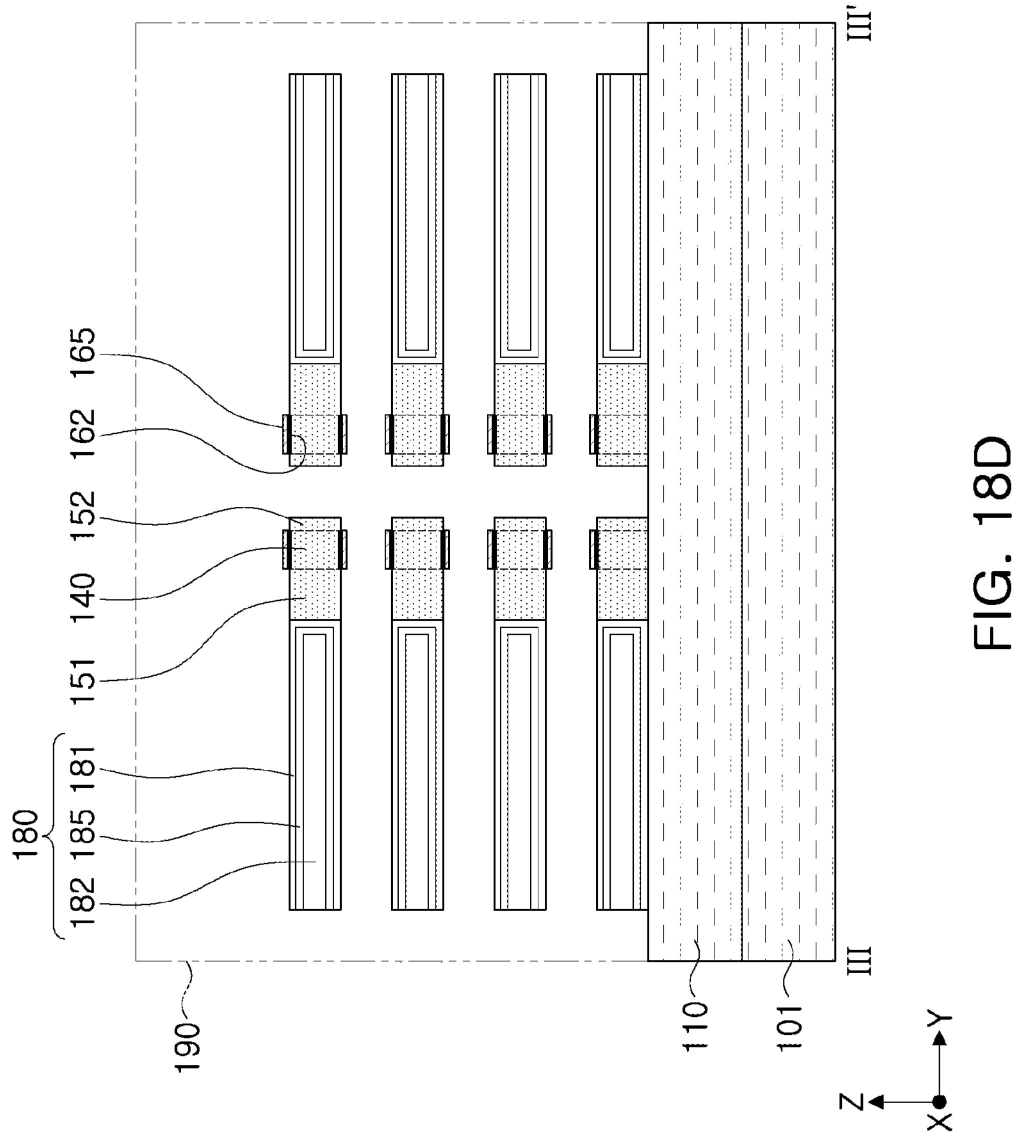

Referring to FIG. 13, a cell region insulating layer 190 may be further formed.

A cell region insulating layer 190 may be further formed to cover the first opening OP1 by depositing an insulating material and performing a planarization process. However, in some example embodiments, the existing cell region insulating layer 190 and the cell region insulating layer 190 filling the first opening OP1 in this process may include different insulating materials.

Referring to FIGS. 14A, 14B, 14C, and 14D, the second opening OP2 may be formed using a mask pattern, and a first preliminary source/drain region 151' and sacrificial structures 180' may be formed.

A second opening OP2 penetrating through the stack structure and exposing the lower structure 110 may be formed through an exposure and etching process using a mask pattern. The second opening may have a shape different from that of the first opening OP1.

In some example embodiments, the second opening OP2 may include a first opening region OP2-1 having a line shape, exposing the protrusions 119*p* disposed on the first region R1 without exposing the protrusions 119*p* disposed on the second region R2 among the metal material layers ML. For example, the width of the first opening region OP2-1 in the Y-direction may be smaller than the first width W1 and may be larger than the second width W2. The etching process may be of selectively removing the sacrificial layers 118, the semiconductor layers 119, and the cell region insulating layer 190 with respect to the metal material layer ML. Accordingly, at least a portion of the metal material layer ML surrounding the protrusions 119*p* on the first region R1 may be exposed. The length in the Y-direction of the second source/drain region 152 (see FIG. 2A) formed through a subsequent process may be determined by the width of the first opening region OP2-1 in the Y-direction.

In some example embodiments, when the first opening region OP2-1 is formed to expose the protrusions 119*p* on the second region R2, the metal material layer ML covering the exposed protrusions 119*p* on the second region R2 may be removed together through a subsequent process, and accordingly, the structure of the landing pattern LPa in FIG. 3 may be provided.

In some example embodiments, the second opening OP2 may include second opening regions OP2-2 extending in the Y-direction and spaced apart from each other in the X-direction on the first region R1. Portions of the semiconductor layers 119 spaced apart from each other in the X-direction by the second opening regions OP2-2 may be referred to as sacrificial structures 180'. The sacrificial structures 180' may be replaced with the data storage structure 180 through a subsequent process. The second opening regions OP2-2 may be spaced apart from the first opening region OP2-1, the metal material layer ML, and the dielectric material layer DL. At least a portion (e.g., a portion other than the protrusions 119*p*) of the portions between the second opening regions OP2-2 and the first opening regions OP2-1 of the semiconductor layers 119 may be referred to as a first preliminary source/drain region 151'. The first preliminary source/drain region 151' may extend in the X-direction between the sacrificial structures 180' and the protrusions 119*p*.

In some example embodiments, the second opening regions OP2-2 may have a symmetrical shape from an axis of the first opening region OP2-1 in the X-direction.

In some example embodiments, the second opening regions OP2-2 may expose a portion of the dielectric material layer DL.

Referring to FIGS. 15A, 15B, 15C, and 15D, by removing a portion of the sacrificial layers 118 exposed through the second opening OP2, the four surfaces of the sacrificial structures 180' may be exposed.

A wet etching process of selectively removing a portion of the sacrificial layers 118 exposed by the second opening regions OP2-2 of the second opening OP2 with respect to the semiconductor layers 119 may be performed. The etching process may be performed to completely remove the sacrificial layers 118 between adjacent second opening regions OP2-2.

As the sacrificial layers 118 are removed by the etching process, the dielectric material layer DL disposed on the sidewall of the sacrificial layers 118 may be exposed.

Referring to FIGS. 16A, 16B, 16C, and 16D, a semiconductor pattern 140, second preliminary source/drain regions 152', and a plurality of gate patterns 165, a plurality of conductive line patterns 170, and a landing pattern LP may be formed by performing an etching process.

On the first region R1, in the etching process through the first opening region OP2-1, by removing the dielectric material layer DL and the metal material layer ML surrounding one end of the protrusions 119*p* and exposing a portion of the protrusions 119*p*, the semiconductor pattern 140 and the second preliminary source/drain regions 152' may be formed. The second preliminary source/drain regions 152' may refer to a portion of the protrusions 119*p* exposed by the etching process. A length in the Y-direction of the second source/drain region 152 (see FIG. 2A) formed through a subsequent process may be determined depending on process conditions of the etching process. The semiconductor pattern 140 may refer to a portion of the protrusions 119*p* not exposed by the metal material layer ML.

In the etching process through the second opening regions OP2-2, by removing the dielectric material layer DL and the metal material layer ML exposed by the second opening regions OP2-2 and separating the metal material layer ML for each semiconductor layer 119, the gate patterns 165 and the conductive line patterns 170 may be formed. That is, the gate patterns 165 may refer to a portion of the metal material layer ML surrounding the protrusions 119*p*, and the conductive line patterns 170 may refer to a portion of the metal material layer ML disposed on the sidewall of the first preliminary source/drain region 151' between the protrusions 119*p*. The gate patterns 165 and the conductive line patterns 170 may be integrally connected to each other, such that the plurality of conductive line patterns 170 and the plurality of gate patterns 165 are separate portions of a single, unitary piece of material.

In this process, the protrusions 119_p_ disposed on the second region R2 and the metal material layer ML surrounding the protrusions 119_p_ may not be exposed by the second opening OP2 and may remain without being removed, thereby forming landing patterns LP. Each of the landing patterns LP may include a semiconductor material layer 131 including protrusions 119_p_ on the second region R2 and a conductive material layer 132 covering at least one surface of the semiconductor material layer 131 on the second region R2.

In an example, the etching process may include a first etching process of selectively removing the dielectric material layer DL exposed through the second opening regions OP2-2, a second etching process of selectively removing the metal material layer ML exposed through the first and second opening regions OP2-1 and OP2-2, and a third etching process of selectively removing the dielectric material layer DL exposed through the first opening region OP2-1.

In another example, the etching process may include a first etching process of selectively removing the metal material layer ML exposed through the first opening region OP2-1, a second etching process of selectively removing the dielectric material layer DL exposed through the first and second opening regions OP2-1 and OP2-2, and a third etching process of selectively removing the metal material layer ML exposed through the second opening regions OP2-2.

In another example, the etching process may be performed as a single etching process of simultaneously removing the dielectric material layer DL and the metal material layer ML.

Referring to FIGS. 17A, 17B, 17C, and 17D, a third opening may be formed using the first mask pattern M1, the sacrificial structures 180' may be removed, the data storage structure 180 may be formed, and a cell region insulating layer 190 may be further formed.

The third opening penetrating through the stack structure and exposing the lower structure 110 may be formed through an exposure and etching process using the first mask pattern M1. The third opening may have a trench shape extending in the X-direction from a position adjacent to an end of the second opening OP2. The sacrificial structures 180' may be exposed through the third opening.

Tunnel portions may be formed by selectively removing the sacrificial structures 180' exposed by the third opening, and the first electrode 181, the dielectric layer 185, and the second electrode 182 may be formed in order, thereby forming the data storage structure 180.

Thereafter, materials in the third opening may be removed through an etching process, and a cell region insulating layer 190 may be further formed. However, in this process, the etching process may not be performed.

Referring to FIGS. 18A, 18B, 18C, and 18D, first and second source/drain regions 151 and 152 may be formed.

A fourth opening penetrating a portion of the first preliminary source/drain regions 151' may be formed using the second mask pattern M2. The first preliminary source/drain region 151' extending in the X-direction may include a pattern structure including patterns spaced apart from each other in the X-direction by the fourth opening. First source/drain regions 151 may be formed by doping impurities to the pattern structure through the fourth opening.

The second source/drain regions 152 may be formed by forming an opening exposing the second preliminary source/drain regions 152' and doping with impurities.

In some example embodiments, the order of forming the first and second source/drain regions 151 and 152 may be varied.

Accordingly, a plurality of structures each including the semiconductor patterns 140, the first and second source/drain regions 151 and 152, the gate patterns 165, and the data storage structure 180 may be formed. The plurality of structures LS may be spaced apart from each other in the X and Z-directions. Accordingly, a semiconductor device having an improved integration density may be provided.

Figure 19:
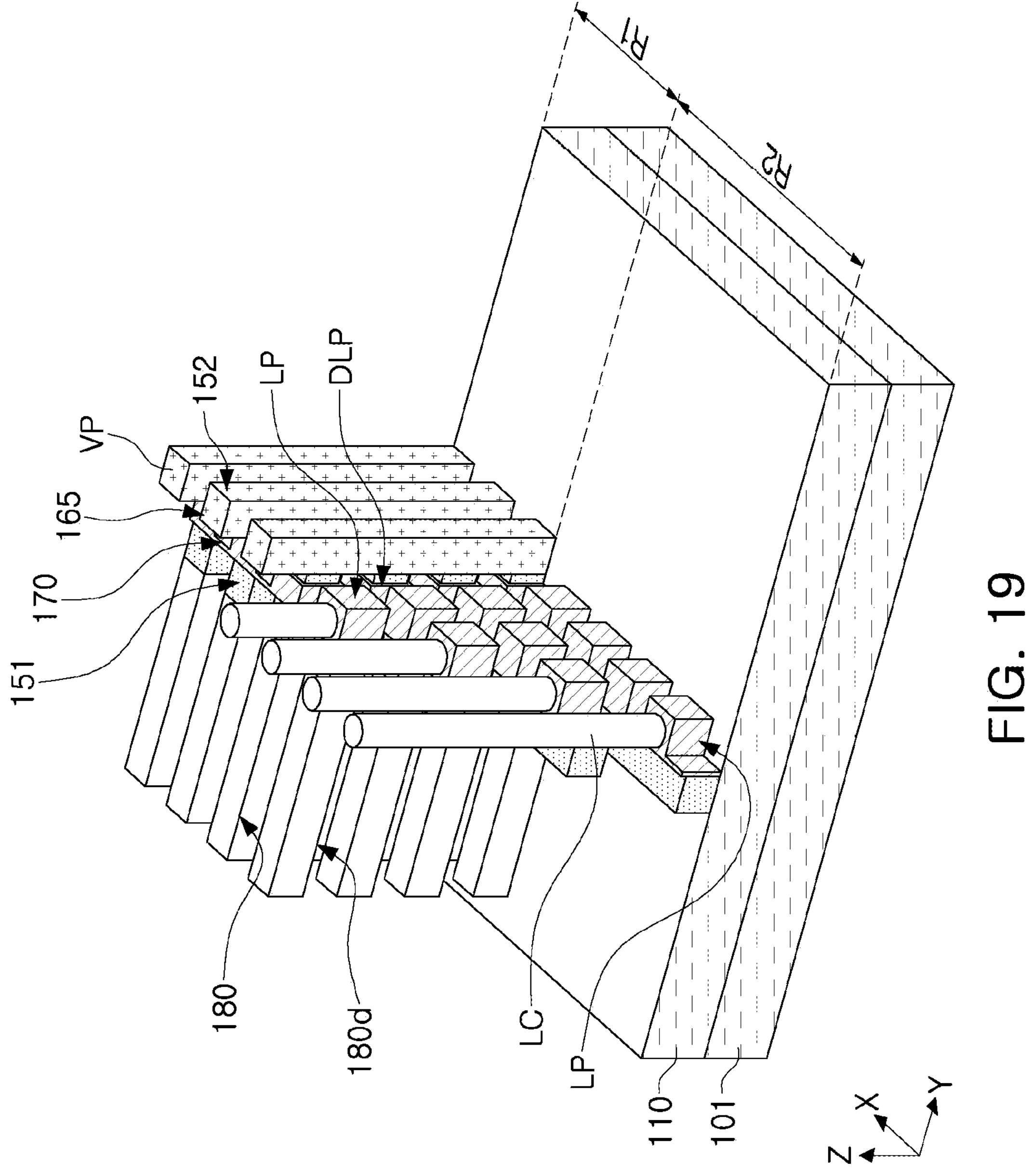

Referring to FIG. 19, a plurality of vertical conductive patterns VP and landing contacts LC may be formed.

A plurality of vertical conductive patterns VP may be formed by forming openings penetrating a region between the plurality of structures LS and spaced apart from each other in the X-direction, depositing a conductive material in the openings, and performing a planarization process.

Landing contacts LC penetrating through the cell region insulating layer 190 and in contact with the landing patterns LP disposed on the second region R2 may be formed.

Thereafter, the semiconductor device 100 in FIGS. 1A to 2B may be formed by forming an upper wiring.

In some example embodiments, a manufacturing method may include manufacturing an electronic device to incorporate, and thus include, at least one semiconductor device according to any of the example embodiments, including for example the semiconductor device 100 in FIGS. 1A to 2B. Such an electronic device may include, for example, a smartphone, a computer, a laptop, a camera, any combination thereof, or the like. Such an electronic device may include, for example, one or more instances of processing circuitry, a processor (e.g., a central processing unit (CPU)), a memory (e.g., a DRAM device), any combination thereof, or the like. Such manufacturing of the electronic device may include manufacturing one or more components of the electronic device (e.g., a DRAM device) to include at least one semiconductor device according to any of the example embodiments and manufacturing the electronic device using the one or more components.

As a result, an electronic device configured to have improved electrical properties and integration density (e.g., improved compactness, improved miniaturization, reduced form factor, etc.) may be manufactured based on being manufactured to include at least one semiconductor device according to any of the example embodiments.

As described herein, any electronic devices and/or portions thereof according to any of the example embodiments may include, may be included in, and/or may be implemented by one or more instances of processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a DRAM device, storing a program of instructions, and a processor (e.g., CPU) configured to execute the program of instructions to implement the functionality and/or methods performed by some or all of any devices, systems, modules, units, controllers, circuits, architectures, and/or portions thereof according to any of the example embodiments, and/or any portions thereof.

According to some of the example embodiments, by providing a landing pattern formed together with the semiconductor patterns and the gate patterns, a semiconductor device having improved productivity and reliability may be provided. Additionally, by including such a semiconductor device in a manufactured electronic device, an electronic device having improved electrical properties and integration density may be provided.

While some example embodiments have been illustrated and described above, it will be configured as apparent to those skilled in the art that modifications and variations could be made without departing from the scope of the present inventive concepts as defined by the appended claims.

What is claimed is:

1. A semiconductor device, comprising:

a substrate having a first region and a second region;

a plurality of semiconductor patterns spaced apart from each other in a first horizontal direction on the first region of the substrate, wherein each of the plurality of semiconductor patterns has first side surfaces opposing each other in the first horizontal direction and second side surfaces opposing each other in a second horizontal direction, the first horizontal direction extending parallel to an upper surface of the substrate, the second horizontal direction extending parallel to the upper surface of the substrate and perpendicular to the first horizontal direction;

a plurality of gate patterns surrounding a semiconductor pattern upper surface, a semiconductor pattern lower surface, and the first side surfaces of each of the plurality of semiconductor patterns; and a landing pattern spaced apart from the plurality of semiconductor patterns in the first horizontal direction on the second region of the substrate and electrically connected to the plurality of gate patterns, wherein the landing pattern includes a semiconductor material layer and a conductive material layer covering at least one surface of the semiconductor material layer.

2. The semiconductor device of claim 1, further comprising:

a data storage structure on one side of each of the plurality of semiconductor patterns.

3. The semiconductor device of claim 1, wherein a length of the semiconductor material layer in the second horizontal direction is longer than a length of each of the plurality of semiconductor patterns in the second horizontal direction.

4. The semiconductor device of claim 1, wherein the semiconductor material layer is parallel to the plurality of semiconductor patterns in the first horizontal direction, and wherein the conductive material layer covers a semiconductor material layer upper surface, a semiconductor material layer lower surface, and first semiconductor material layer side surfaces opposing each other in the first horizontal direction of the semiconductor material layer.

5. The semiconductor device of claim 4, wherein the conductive material layer further includes a portion covering at least one of second semiconductor material layer side surfaces opposing each other in the second horizontal direction of the semiconductor material layer.

6. The semiconductor device of claim 1, wherein the semiconductor material layer includes a same material as a semiconductor pattern material of the plurality of semiconductor patterns, and wherein the conductive material layer includes a same material as a gate pattern material of the plurality of gate patterns.

7. The semiconductor device of claim 1, further comprising:

a plurality of conductive line patterns extending in the first horizontal direction between the plurality of gate patterns and further extending in the first horizontal direction between the plurality of gate patterns and the landing pattern, wherein the plurality of conductive line patterns electrically connect the plurality of gate patterns to the landing pattern.

8. The semiconductor device of claim 7, wherein the plurality of conductive line patterns includes a landing line pattern in contact with the landing pattern, wherein a landing line pattern upper surface of the landing line pattern is coplanar with conductive material layer upper surface of the conductive material layer, and wherein a landing line pattern lower surface of the landing line pattern is coplanar with a conductive material layer lower surface of the conductive material layer.

9. The semiconductor device of claim 8, wherein the landing line pattern is integrally connected to the conductive material layer.

10. The semiconductor device of claim 7, wherein a thickness of each of the plurality of conductive line patterns is a substantially same thickness as a thickness of the conductive material layer, and wherein the thickness of each of the plurality of conductive line patterns is defined in the second horizontal direction.

11. The semiconductor device of claim 10, wherein the landing pattern further includes a dielectric layer between the semiconductor material layer and the conductive material layer.

12. The semiconductor device of claim 11, further comprising:

a dielectric pattern between the plurality of gate patterns and the plurality of semiconductor patterns, wherein the dielectric layer includes a same material as a material of the dielectric pattern.

13. The semiconductor device of claim 1, wherein a length of the semiconductor material layer in the first horizontal direction is different from a length of each of the plurality of semiconductor patterns in the first horizontal direction.

14. The semiconductor device of claim 1, wherein the landing pattern has a square shape, a rectangular shape, or a trapezoidal shape on a plane.

15. A semiconductor device, comprising:

a substrate having a first region and a second region;

a stack structure including a plurality of horizontal structures stacked and spaced apart from each other in a vertical direction perpendicular to an upper surface of the substrate on the first region and extending in a staircase form in a first horizontal direction parallel to the upper surface of the substrate on the second region, and a plurality of interlayer insulating layers alternately stacked with the plurality of horizontal structures;

a cell region insulating layer covering the stack structure on the substrate;

and a landing contact penetrating through the cell region insulating layer and extending in the vertical direction on the second region, wherein each of the plurality of horizontal structures includes:

a plurality of structures spaced apart from each other in the first horizontal direction on the first region, a landing pattern disposed in parallel with the plurality of structures in the first horizontal direction on the second region, and conductive line patterns connecting the plurality of structures to the landing pattern, wherein each of the plurality of structures includes:

a semiconductor pattern having first side surfaces opposing each other in the first horizontal direction and second side surfaces opposing each other in a second horizontal direction perpendicular to the first horizontal direction and parallel to the upper surface of the substrate, and a gate pattern surrounding a semiconductor pattern upper surface, a semiconductor pattern lower surface, and the first side surfaces of the semiconductor pattern, and wherein the landing pattern includes a semiconductor material layer and a conductive material layer including a same material as a material of the gate pattern and covering at least one surface of the semiconductor material layer.

16. The semiconductor device of claim 15, wherein each of the plurality of structures further includes a data storage structure on one side of the semiconductor pattern, wherein the landing contact is in contact with the conductive material layer, and wherein the conductive material layer is integrally connected to the conductive line patterns.

17. The semiconductor device of claim 15, further comprising:

a dummy landing pattern spaced apart from the landing pattern in the vertical direction below the landing pattern, wherein the dummy landing pattern includes:

a first layer having a same material as a semiconductor material layer material of the semiconductor material layer, and a second layer having a same material as a conductive material layer material of the conductive material layer.

18. The semiconductor device of claim 15, wherein the plurality of horizontal structures includes a first horizontal structure and a second horizontal structure on the first horizontal structure, wherein the landing pattern includes a first landing pattern of the first horizontal structure and a second landing pattern of the second horizontal structure, and wherein the first landing pattern and the second landing pattern have different shapes.

19. A semiconductor device, comprising:

a substrate having a first region and a second region;

a plurality of semiconductor patterns spaced apart from each other in a first horizontal direction on the first region of the substrate, wherein each of the plurality of semiconductor patterns has first side surfaces opposing each other in the first horizontal direction and second side surfaces opposing each other in a second horizontal direction, the first horizontal direction parallel to an upper surface of the substrate, the second horizontal direction parallel to the upper surface of the substrate and perpendicular to the first horizontal direction;

a plurality of gate patterns surrounding a semiconductor pattern upper surface, a semiconductor pattern lower surface, and the first side surfaces of each of the plurality of semiconductor patterns;

a landing pattern spaced apart from the plurality of semiconductor patterns in the first horizontal direction on the second region of the substrate and electrically connected to the plurality of gate patterns; and a landing contact in contact with the landing pattern and extending in a vertical direction perpendicular to the upper surface of the substrate, wherein the landing pattern includes a semiconductor material layer and a conductive material layer in contact with the semiconductor material layer, and wherein the landing contact is in contact with the semiconductor material layer and the conductive material layer.

20. The semiconductor device of claim 19, wherein the conductive material layer covers a semiconductor material layer upper surface, a semiconductor material layer lower surface, and first semiconductor material layer side surfaces opposing each other in the first horizontal direction of the semiconductor material layer, and wherein the conductive material layer further includes a portion covering at least one of second semiconductor material layer side surfaces opposing each other in the second horizontal direction of the semiconductor material layer.

* * * * *